US012598930B2

(12) United States Patent
Gupta et al.

(10) Patent No.: US 12,598,930 B2
(45) Date of Patent: Apr. 7, 2026

(54) CONFORMAL THERMAL CVD WITH CONTROLLED FILM PROPERTIES AND HIGH DEPOSITION RATE

(71) Applicant: Lam Research Corporation, Fremont, CA (US)

(72) Inventors: Awnish Gupta, Hillsboro, OR (US); Bart J. Van Schravendijk, Palo Alto, CA (US); Frank Loren Pasquale, Tigard, OR (US); Adrien LaVoie, Newberg, OR (US); Jason Alexander Varnell, Tigard, OR (US); Praneeth Ramasagaram, Boise, ID (US); Joseph R. Abel, West Linn, OR (US); Jennifer Leigh Petraglia, Lake Oswego, OR (US); Dustin Zachary Austin, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 513 days.

(21) Appl. No.: 18/003,098

(22) PCT Filed: Jul. 21, 2021

(86) PCT No.: PCT/US2021/042652
§ 371 (c)(1),
(2) Date: Dec. 22, 2022

(87) PCT Pub. No.: WO2022/020528
PCT Pub. Date: Jan. 27, 2022

(65) Prior Publication Data

US 2023/0245896 A1 Aug. 3, 2023

Related U.S. Application Data

(60) Provisional application No. 62/705,951, filed on Jul. 23, 2020.

(51) Int. Cl.
*H01L 21/311* (2006.01)
*C23C 16/04* (2006.01)
(Continued)

(52) U.S. Cl.
CPC ...... *H01L 21/31116* (2013.01); *C23C 16/045* (2013.01); *C23C 16/06* (2013.01); (Continued)

(58) Field of Classification Search
CPC ................................ C23C 16/50; C23C 16/56
See application file for complete search history.

(56) References Cited

U.S. PATENT DOCUMENTS 4,158,717 A 6/1979 Nelson
4,419,809 A 12/1983 Riseman et al.
(Continued)

FOREIGN PATENT DOCUMENTS

CN 1705768 A 12/2005
CN 1732288 A 2/2006
(Continued)

OTHER PUBLICATIONS

Aboaf, J.A. (1969) "Some Properties of Vapor Deposited Silicon Nitride Films Obtained by the Reaction of SiBr4 and NH 3," Journal of the Electrochemical Society, 116(12):1736-1740.
(Continued)

*Primary Examiner* — Joseph A Miller, Jr.
(74) *Attorney, Agent, or Firm* — Weaver Austin Villeneuve & Sampson LLP

(57) ABSTRACT

Methods and apparatuses for depositing dielectric films into features on semiconductor substrates are described herein. Methods involve depositing dielectric films by using con-
(Continued)

trolled thermal chemical vapor deposition, with periodic passivation operations and densification to modulate film properties.

16 Claims, 16 Drawing Sheets

(51) Int. Cl.
*C23C 16/06* (2006.01)
*C23C 16/34* (2006.01)
*C23C 16/40* (2006.01)
*C23C 16/56* (2006.01)
*H01J 37/32* (2006.01)
*H01L 21/02* (2006.01)
*H01L 21/768* (2006.01)
*H01L 23/528* (2006.01)
*H01L 23/532* (2006.01)

(52) U.S. Cl.
CPC .......... *C23C 16/345* (2013.01); *C23C 16/401* (2013.01); *C23C 16/56* (2013.01); *H01J 37/32449* (2013.01); *H01J 37/32724* (2013.01); *H01J 37/32816* (2013.01); *H01L 21/02164* (2013.01); *H01L 21/0217* (2013.01); *H01L 21/0228* (2013.01); *H01L 21/76831* (2013.01); *H01L 21/76837* (2013.01); *H01L 23/5283* (2013.01); *H01L 23/53266* (2013.01)

(56) References Cited

U.S. PATENT DOCUMENTS

| | | | |
|---|---|---|---|
| 4,500,563 | A | 2/1985 | Ellenberger et al. |
| 4,575,921 | A | 3/1986 | Bhagat |
| 4,869,781 | A | 9/1989 | Euen et al. |
| 5,091,332 | A | 2/1992 | Bohr et al. |
| 5,202,272 | A | 4/1993 | Hsieh et al. |
| 5,230,929 | A | 7/1993 | Caporiccio et al. |
| 5,314,724 | A | 5/1994 | Tsukune et al. |
| 5,459,099 | A | 10/1995 | Hsu |
| 5,496,608 | A | 3/1996 | Matsuda et al. |
| 5,528,719 | A | 6/1996 | Yamada |
| 5,670,432 | A | 9/1997 | Tsai |
| 5,731,235 | A | 3/1998 | Srinivasan et al. |
| 5,854,105 | A | 12/1998 | Tseng |
| 5,856,003 | A | 1/1999 | Chiu |
| 5,891,805 | A | 4/1999 | Cheng et al. |
| 5,976,990 | A | 11/1999 | Mercaldi et al. |
| 6,039,834 | A | 3/2000 | Tanaka et al. |
| 6,080,676 | A | 6/2000 | Nguyen et al. |
| 6,153,519 | A | 11/2000 | Jain et al. |
| 6,177,344 | B1 | 1/2001 | Xia et al. |
| 6,197,701 | B1 | 3/2001 | Shue et al. |
| 6,225,175 | B1 | 5/2001 | Houston |
| 6,228,779 | B1 | 5/2001 | Bloom et al. |
| 6,326,322 | B1 | 12/2001 | Kim et al. |
| 6,380,056 | B1 | 4/2002 | Shue et al. |
| 6,395,652 | B2 | 5/2002 | Kim et al. |
| 6,403,416 | B1 | 6/2002 | Huang et al. |
| 6,416,822 | B1 | 7/2002 | Chiang et al. |
| 6,428,859 | B1 | 8/2002 | Chiang et al. |
| 6,448,192 | B1 | 9/2002 | Kaushik |
| 6,489,254 | B1 | 12/2002 | Kelkar et al. |
| 6,518,167 | B1 | 2/2003 | You et al. |
| 6,534,395 | B2 | 3/2003 | Werkhoven et al. |
| 6,548,368 | B1 | 4/2003 | Narwankar et al. |
| 6,599,574 | B1 | 7/2003 | Yieh et al. |
| 6,632,478 | B2 | 10/2003 | Gaillard et al. |
| 6,632,741 | B1 | 10/2003 | Clevenger et al. |
| 6,638,879 | B2 | 10/2003 | Hsieh et al. |
| 6,645,574 | B1 | 11/2003 | Lee et al. |
| 6,709,928 | B1 | 3/2004 | Jenne et al. |
| 6,730,614 | B1 | 5/2004 | Lim et al. |
| 6,794,284 | B2 | 9/2004 | Vaartstra |
| 6,926,798 | B2 | 8/2005 | Biberger et al. |
| 6,933,245 | B2 | 8/2005 | Lee et al. |
| 6,967,159 | B2 | 11/2005 | Vaartstra |
| 7,019,159 | B2 | 3/2006 | Dussarrat et al. |
| 7,041,335 | B2 | 5/2006 | Chung |
| 7,169,704 | B2 | 1/2007 | Koo et al. |
| 7,172,792 | B2 | 2/2007 | Wang et al. |
| 7,211,525 | B1 | 5/2007 | Shanker et al. |
| 7,294,582 | B2 | 11/2007 | Haverkort et al. |
| 7,297,641 | B2 | 11/2007 | Todd et al. |
| 7,300,885 | B2 | 11/2007 | Hasebe et al. |
| 7,301,210 | B2 | 11/2007 | Abadeer et al. |
| 7,351,668 | B2 | 4/2008 | Chou et al. |
| 7,459,100 | B2 | 12/2008 | Kiermasz et al. |
| 7,462,571 | B2 | 12/2008 | Hasebe et al. |
| 7,465,669 | B2 | 12/2008 | Iyer et al. |
| 7,482,247 | B1 | 1/2009 | Papasouliotis et al. |
| 7,507,676 | B2 | 3/2009 | Chou et al. |
| 7,510,984 | B2 | 3/2009 | Saito et al. |
| 7,514,366 | B2 | 4/2009 | Trivedi et al. |
| 7,611,980 | B2 | 11/2009 | Wells et al. |
| 7,622,369 | B1 | 11/2009 | Lee et al. |
| 7,625,820 | B1 | 12/2009 | Papasouliotis et al. |
| 7,629,267 | B2 | 12/2009 | Wan et al. |
| 7,651,730 | B2 | 1/2010 | Hasebe |
| 7,651,953 | B2 | 1/2010 | Todd et al. |
| 7,651,959 | B2 | 1/2010 | Fukazawa et al. |
| 7,674,727 | B2 | 3/2010 | Yuan et al. |
| 7,682,657 | B2 | 3/2010 | Sherman |
| 7,700,492 | B2 | 4/2010 | Kikuchi |
| 7,708,859 | B2 | 5/2010 | Huang et al. |
| 7,713,592 | B2 | 5/2010 | Nguyen et al. |
| 7,732,343 | B2 | 6/2010 | Niroomand et al. |
| 7,758,920 | B2 | 7/2010 | Hasebe et al. |
| 7,790,633 | B1 | 9/2010 | Tarafdar et al. |
| 7,807,578 | B2 | 10/2010 | Bencher et al. |
| 7,825,039 | B2 | 11/2010 | Takahashi et al. |
| 7,910,288 | B2 | 3/2011 | Abatchev et al. |
| 7,910,497 | B2 | 3/2011 | Olsen et al. |
| 7,919,416 | B2 | 4/2011 | Lee et al. |
| 7,939,455 | B2 | 5/2011 | Clark |
| 7,964,241 | B2 | 6/2011 | Hasebe et al. |
| 7,964,513 | B2 | 6/2011 | Todd et al. |
| 7,989,365 | B2 | 8/2011 | Park et al. |
| 8,034,673 | B2 | 10/2011 | Kadonaga et al. |
| 8,080,290 | B2 | 12/2011 | Hasebe et al. |
| 8,084,088 | B2 | 12/2011 | Huy et al. |
| 8,088,248 | B2 | 1/2012 | Larson |
| 8,105,901 | B2 | 1/2012 | Cheng et al. |
| 8,119,544 | B2 | 2/2012 | Hasebe et al. |
| 8,129,555 | B2 | 3/2012 | Cheng et al. |
| 8,178,448 | B2 | 5/2012 | Nodera et al. |
| 8,227,032 | B2 | 7/2012 | Dussarrat et al. |
| 8,257,789 | B2 | 9/2012 | Matsunaga et al. |
| 8,298,628 | B2 | 10/2012 | Yang et al. |
| 8,298,954 | B1 | 10/2012 | Arnold et al. |
| 8,357,618 | B2 | 1/2013 | Bencher et al. |
| 8,366,953 | B2 | 2/2013 | Kohno et al. |
| 8,383,525 | B2 | 2/2013 | Raisanen et al. |
| 8,394,466 | B2 | 3/2013 | Hong et al. |
| 8,580,699 | B2 | 11/2013 | Mallick |
| 8,592,328 | B2 | 11/2013 | Hausmann et al. |
| 8,623,770 | B1 | 1/2014 | Gao et al. |
| 8,669,185 | B2 | 3/2014 | Onizawa et al. |
| 8,703,578 | B2 | 4/2014 | Hoentschel et al. |
| 8,728,955 | B2 | 5/2014 | Lavoie et al. |
| 8,728,956 | B2 | 5/2014 | Lavoie et al. |
| 8,753,984 | B2 | 6/2014 | Murakami et al. |
| 8,791,034 | B2 | 7/2014 | Shealy et al. |
| 8,802,882 | B2 | 8/2014 | Wang et al. |
| 8,846,484 | B2 | 9/2014 | Lee et al. |
| 8,936,977 | B2 | 1/2015 | Hoentschel et al. |
| 8,975,704 | B2 | 3/2015 | Hoentschel et al. |
| 9,023,693 | B1 | 5/2015 | Lin et al. |
| 9,023,737 | B2 | 5/2015 | Beynet et al. |
| 9,070,555 | B2 | 6/2015 | Hausmann et al. |
| 9,095,869 | B2 | 8/2015 | Kilpi et al. |
| 9,214,333 | B1 | 12/2015 | Sims et al. |

(56) References Cited

U.S. PATENT DOCUMENTS 9,355,839 B2 5/2016 Swaminathan et al.
9,359,513 B1 6/2016 Takashima et al.
9,379,210 B2 6/2016 Mountsier et al.
9,390,909 B2 7/2016 Pasquale et al.
9,406,693 B1 8/2016 Pang et al.
9,443,731 B1 9/2016 O'Meara et al.
9,472,506 B2 10/2016 Conklin et al.
9,502,234 B2 11/2016 Xiao et al.
9,502,238 B2 11/2016 Danek et al.
9,508,604 B1 11/2016 Sung et al.
9,530,663 B1 12/2016 Shih et al.
9,564,312 B2 2/2017 Henri et al.
9,576,817 B1 2/2017 Cheng et al.
9,589,790 B2 3/2017 Henri et al.
9,601,693 B1 3/2017 Henri et al.
9,611,544 B2 4/2017 Lavoie et al.
9,670,579 B2 6/2017 Hausmann et al.
9,721,784 B2 8/2017 Behera et al.
9,865,455 B1 1/2018 Sims et al.
9,865,815 B2 1/2018 Hausmann
9,875,891 B2 1/2018 Henri et al.
9,892,933 B2 2/2018 Peng et al.
9,905,415 B2 2/2018 Chandra et al.
10,074,543 B2 9/2018 Mahorowala et al.
10,134,579 B2 11/2018 Baldasseroni et al.
10,141,505 B2 11/2018 Hausmann
10,269,559 B2 4/2019 Abel et al.
10,410,872 B2 9/2019 Cheng et al.
10,454,029 B2 10/2019 Mckerrow et al.
10,559,465 B2 2/2020 Cheng et al.
10,629,435 B2 4/2020 Swaminathan et al.
10,658,172 B2 5/2020 Abel et al.
10,804,099 B2 10/2020 Henri et al.
10,832,908 B2 11/2020 Lavoie
12,341,002 B2 6/2025 Bayati et al.
12,412,742 B2 9/2025 Gupta et al.
2001/0028922 A1 10/2001 Sandhu
2002/0001889 A1 1/2002 Kim et al.
2002/0001929 A1 1/2002 Biberger et al.
2002/0052119 A1 5/2002 Van Cleemput
2002/0066411 A1 6/2002 Chiang et al.
2002/0068466 A1 6/2002 Lee et al.
2002/0130385 A1 9/2002 Jung et al.
2003/0034244 A1 2/2003 Yasar et al.
2003/0092280 A1 5/2003 Lee et al.
2003/0116421 A1 6/2003 Xu et al.
2003/0143841 A1 7/2003 Yang et al.
2004/0043570 A1 3/2004 Fujisaki et al.
2004/0077184 A1 4/2004 Anderson et al.
2004/0096582 A1 5/2004 Wang et al.
2004/0121085 A1* 6/2004 Wang .................. H01L 21/3185 427/255.394
2005/0025885 A1 2/2005 McSwiney et al.
2005/0042865 A1 2/2005 Cabral, Jr. et al.
2005/0059259 A1 3/2005 O'Meara et al.
2005/0100670 A1 5/2005 Dussarrat et al.
2005/0109276 A1 5/2005 Iyer et al.
2005/0118837 A1 6/2005 Todd et al.
2005/0123690 A1 6/2005 Derderian et al.
2005/0124109 A1 6/2005 Quevedo-Lopez et al.
2005/0142878 A1 6/2005 Jung
2005/0158983 A1 7/2005 Hoshi et al.
2005/0159017 A1 7/2005 Kim et al.
2005/0170104 A1 8/2005 Jung et al.
2005/0196977 A1 9/2005 Saito et al.
2005/0199013 A1 9/2005 Vandroux et al.
2005/0227017 A1 10/2005 Senzaki et al.
2005/0277257 A1 12/2005 Byun et al.
2005/0287309 A1 12/2005 Veerasamy
2005/0287775 A1 12/2005 Hasebe et al.
2006/0003557 A1 1/2006 Cabral, Jr. et al.
2006/0008656 A1 1/2006 Veerasamy
2006/0032442 A1 2/2006 Hasebe
2006/0032443 A1 2/2006 Hasebe et al.
2006/0046508 A1 3/2006 Nemani et al.
2006/0084283 A1 4/2006 Paranjpe et al.
2006/0088985 A1 4/2006 Haverkort et al.
2006/0119248 A1 6/2006 Howard et al.
2006/0199357 A1 9/2006 Wan et al.
2006/0263699 A1 11/2006 Abatchev et al.
2006/0269692 A1* 11/2006 Balseanu ................ C23C 16/56 427/532
2006/0273456 A1 12/2006 Sant et al.
2006/0286776 A1 12/2006 Ranish et al.
2006/0289385 A1 12/2006 Kikuchi
2007/0032047 A1 2/2007 Hasebe et al.
2007/0066038 A1 3/2007 Sadjadi et al.
2007/0099431 A1 5/2007 Li
2007/0137572 A1 6/2007 Matsuura et al.
2007/0148350 A1 6/2007 Rahtu et al.
2007/0148968 A1 6/2007 Kwon et al.
2007/0167028 A1 7/2007 Chou et al.
2007/0190782 A1 8/2007 Park
2007/0212850 A1 9/2007 Ingle et al.
2007/0218661 A1 9/2007 Shroff et al.
2007/0238299 A1 10/2007 Niroomand et al.
2007/0238301 A1 10/2007 Cabral et al.
2007/0238316 A1 10/2007 Ohashi
2007/0251444 A1 11/2007 Gros-Jean et al.
2007/0298585 A1 12/2007 Lubomirsky et al.
2008/0038936 A1 2/2008 Todd et al.
2008/0063791 A1 3/2008 Hasebe et al.
2008/0081104 A1 4/2008 Hasebe et al.
2008/0081470 A1 4/2008 Clark
2008/0119057 A1 5/2008 Chua et al.
2008/0124946 A1 5/2008 Xiao et al.
2008/0138996 A1 6/2008 Nishizuka
2008/0139003 A1 6/2008 Pirzada et al.
2008/0142483 A1 6/2008 Hua et al.
2008/0213479 A1 9/2008 Chou et al.
2008/0237726 A1 10/2008 Dyer
2008/0242116 A1 10/2008 Clark
2008/0260969 A1 10/2008 Dussarrat et al.
2008/0274302 A1 11/2008 Hasebe et al.
2008/0311760 A1 12/2008 Nodera et al.
2008/0318443 A1 12/2008 Kim et al.
2009/0018668 A1 1/2009 Galbraith
2009/0035665 A1 2/2009 Tran
2009/0075490 A1 3/2009 Dussarrat
2009/0130797 A1 5/2009 Lee et al.
2009/0146322 A1 6/2009 Weling et al.
2009/0148625 A1 6/2009 Yeom et al.
2009/0155606 A1 6/2009 Yoon et al.
2009/0163041 A1 6/2009 Mungekar et al.
2009/0191722 A1 7/2009 Hasebe et al.
2009/0232985 A1 9/2009 Dussarrat et al.
2009/0286381 A1 11/2009 Van Schravendijk et al.
2010/0003797 A1 1/2010 Smith
2010/0038727 A1 2/2010 Chakravarthi et al.
2010/0099271 A1 4/2010 Hausmann et al.
2010/0102407 A1 4/2010 Kajiyama et al.
2010/0124618 A1 5/2010 Kobayashi et al.
2010/0124621 A1 5/2010 Kobayashi et al.
2010/0136260 A1 6/2010 Matsunaga et al.
2010/0136313 A1 6/2010 Shimizu et al.
2010/0151681 A1 6/2010 Knapp et al.
2010/0221925 A1 9/2010 Lee et al.
2010/0267238 A1 10/2010 Johnson et al.
2010/0283097 A1* 11/2010 Endoh .................. C23C 16/345 257/411
2010/0304047 A1 12/2010 Yang et al.
2010/0304574 A1 12/2010 Nodera et al.
2010/0310791 A1 12/2010 Shimazu et al.
2011/0003477 A1 1/2011 Park et al.
2011/0014795 A1 1/2011 Lee et al.
2011/0021010 A1 1/2011 Cheng et al.
2011/0086516 A1 4/2011 Lee et al.
2011/0127582 A1 6/2011 Cheng et al.
2011/0129978 A1 6/2011 Cheng et al.
2011/0151142 A1 6/2011 Seamons et al.
2011/0159673 A1 6/2011 Hanawa et al.
2011/0176967 A1 7/2011 Okuda et al.
2011/0183528 A1 7/2011 Wang et al.
2011/0223769 A1 9/2011 Ko et al.

(56) References Cited

U.S. PATENT DOCUMENTS

| | | | |
|---|---|---|---|
| 2011/0244142 | A1 | 10/2011 | Cheng et al. |
| 2011/0256734 | A1 | 10/2011 | Hausmann et al. |
| 2011/0262642 | A1 | 10/2011 | Xiao et al. |
| 2012/0009802 | A1 | 1/2012 | Lavoie et al. |
| 2012/0009803 | A1 | 1/2012 | Jung et al. |
| 2012/0011889 | A1 | 1/2012 | Bogdahn et al. |
| 2012/0028469 | A1 | 2/2012 | Onizawa et al. |
| 2012/0058282 | A1 | 3/2012 | Hong et al. |
| 2012/0068347 | A1 | 3/2012 | Isobayashi et al. |
| 2012/0070957 | A1 | 3/2012 | Mallick et al. |
| 2012/0088369 | A1 | 4/2012 | Weidman et al. |
| 2012/0104347 | A1 | 5/2012 | Quick |
| 2012/0108079 | A1 | 5/2012 | Mahajani |
| 2012/0115074 | A1 | 5/2012 | Zhang et al. |
| 2012/0142194 | A1 | 6/2012 | Hwang |
| 2012/0156882 | A1 | 6/2012 | Lee et al. |
| 2012/0156888 | A1 | 6/2012 | Sato et al. |
| 2012/0164846 | A1 | 6/2012 | Ha et al. |
| 2012/0171846 | A1 | 7/2012 | Hwang |
| 2012/0177841 | A1 | 7/2012 | Thompson |
| 2012/0213940 | A1 | 8/2012 | Mallick |
| 2012/0244711 | A1 | 9/2012 | Yin et al. |
| 2012/0264305 | A1 | 10/2012 | Nakano |
| 2012/0282418 | A1 | 11/2012 | Chou et al. |
| 2012/0315394 | A1 | 12/2012 | Ito |
| 2013/0040447 | A1 | 2/2013 | Swaminathan et al. |
| 2013/0065404 | A1 | 3/2013 | Weidman et al. |
| 2013/0071580 | A1 | 3/2013 | Weidman et al. |
| 2013/0084688 | A1 | 4/2013 | O'Meara et al. |
| 2013/0113073 | A1 | 5/2013 | Liu et al. |
| 2013/0115783 | A1 | 5/2013 | Kim et al. |
| 2013/0129940 | A1 | 5/2013 | Xiao et al. |
| 2013/0161629 | A1 | 6/2013 | Han et al. |
| 2013/0189845 | A1 | 7/2013 | Kim et al. |
| 2013/0189854 | A1 | 7/2013 | Hausmann et al. |
| 2013/0196082 | A1 | 8/2013 | Spence et al. |
| 2013/0200384 | A1 | 8/2013 | Mieno |
| 2013/0210236 | A1 | 8/2013 | Ogihara et al. |
| 2013/0252437 | A1 | 9/2013 | Sano et al. |
| 2013/0273704 | A1 | 10/2013 | Jee et al. |
| 2013/0280919 | A1 | 10/2013 | Yuasa et al. |
| 2013/0302980 | A1 | 11/2013 | Chandrashekar et al. |
| 2013/0327636 | A1 | 12/2013 | Majetich et al. |
| 2013/0344248 | A1 | 12/2013 | Clark |
| 2014/0023794 | A1 | 1/2014 | Mahajani et al. |
| 2014/0099797 | A1 | 4/2014 | Terasaki |
| 2014/0113455 | A1 | 4/2014 | Reimer et al. |
| 2014/0113457 | A1 | 4/2014 | Sims et al. |
| 2014/0120737 | A1 | 5/2014 | Swaminathan et al. |
| 2014/0134812 | A1 | 5/2014 | Kim et al. |
| 2014/0141625 | A1 | 5/2014 | Fukazawa et al. |
| 2014/0141626 | A1 | 5/2014 | Hausmann et al. |
| 2014/0158580 | A1 | 6/2014 | Xiao et al. |
| 2014/0170847 | A1 | 6/2014 | Iuchi et al. |
| 2014/0170853 | A1 | 6/2014 | Shamma et al. |
| 2014/0193983 | A1 | 7/2014 | Lavoie |
| 2014/0216337 | A1 | 8/2014 | Swaminathan et al. |
| 2014/0262038 | A1 | 9/2014 | Wang et al. |
| 2014/0273477 | A1 | 9/2014 | Niskanen et al. |
| 2014/0273528 | A1 | 9/2014 | Niskanen et al. |
| 2014/0273529 | A1 | 9/2014 | Nguyen et al. |
| 2014/0273530 | A1 | 9/2014 | Nguyen et al. |
| 2014/0273531 | A1 | 9/2014 | Niskanen et al. |
| 2014/0302686 | A1 | 10/2014 | Pan et al. |
| 2015/0004805 | A1 | 1/2015 | Omstead et al. |
| 2015/0017812 | A1 | 1/2015 | Chandrasekharan et al. |
| 2015/0021712 | A1 | 1/2015 | Zschaetzsch et al. |
| 2015/0031218 | A1 | 1/2015 | Karakawa |
| 2015/0056540 | A1 | 2/2015 | Fukuda |
| 2015/0126042 | A1 | 5/2015 | Pasquale et al. |
| 2015/0132965 | A1 | 5/2015 | Devilliers et al. |
| 2015/0137061 | A1 | 5/2015 | Donghi et al. |
| 2015/0155198 | A1 | 6/2015 | Tsai et al. |
| 2015/0162416 | A1 | 6/2015 | Chang et al. |
| 2015/0167163 | A1 | 6/2015 | Kubota et al. |
| 2015/0200110 | A1 | 7/2015 | Li et al. |
| 2015/0217330 | A1 | 8/2015 | Haukka et al. |
| 2015/0243708 | A1 | 8/2015 | Ravasio |
| 2015/0249153 | A1 | 9/2015 | Morin et al. |
| 2015/0251917 | A1 | 9/2015 | Hong et al. |
| 2015/0255308 | A1 | 9/2015 | Lin et al. |
| 2015/0259791 | A1 | 9/2015 | Hausmann et al. |
| 2015/0315704 | A1 | 11/2015 | Nakano et al. |
| 2016/0020092 | A1 | 1/2016 | Kang et al. |
| 2016/0042950 | A1 | 2/2016 | Dai et al. |
| 2016/0046501 | A1 | 2/2016 | Kverel et al. |
| 2016/0049307 | A1 | 2/2016 | Chen |
| 2016/0064224 | A1 | 3/2016 | Hung et al. |
| 2016/0079054 | A1 | 3/2016 | Chen et al. |
| 2016/0093484 | A1 | 3/2016 | Marsh |
| 2016/0099143 | A1 | 4/2016 | Yan et al. |
| 2016/0109804 | A1 | 4/2016 | Huli |
| 2016/0111297 | A1 | 4/2016 | Chen et al. |
| 2016/0148799 | A1 | 5/2016 | Wang et al. |
| 2016/0148800 | A1 | 5/2016 | Henri et al. |
| 2016/0148806 | A1 | 5/2016 | Henri et al. |
| 2016/0155739 | A1 | 6/2016 | Ting et al. |
| 2016/0163557 | A1 | 6/2016 | Hudson et al. |
| 2016/0172194 | A1 | 6/2016 | Kunnen et al. |
| 2016/0190008 | A1 | 6/2016 | Chandrashekar et al. |
| 2016/0218002 | A1 | 7/2016 | Steinbrenner et al. |
| 2016/0225640 | A1 | 8/2016 | Raley et al. |
| 2016/0247678 | A1 | 8/2016 | Feng et al. |
| 2016/0247680 | A1 | 8/2016 | O'Meara et al. |
| 2016/0254171 | A1 | 9/2016 | Shamma et al. |
| 2016/0284539 | A1 | 9/2016 | Horita et al. |
| 2016/0284567 | A1 | 9/2016 | Reilly et al. |
| 2016/0293398 | A1 | 10/2016 | Danek et al. |
| 2016/0293418 | A1 | 10/2016 | Pasquale et al. |
| 2016/0300718 | A1 | 10/2016 | Raley et al. |
| 2016/0329238 | A1 | 11/2016 | Tang et al. |
| 2016/0336178 | A1 | 11/2016 | Swaminathan et al. |
| 2016/0336187 | A1 | 11/2016 | Liou et al. |
| 2016/0343580 | A1 | 11/2016 | Hudson |
| 2016/0365425 | A1 | 12/2016 | Chen et al. |
| 2016/0372334 | A1 | 12/2016 | Mignot et al. |
| 2017/0069510 | A1 | 3/2017 | Kal et al. |
| 2017/0092496 | A1 | 3/2017 | Devilliers |
| 2017/0092857 | A1 | 3/2017 | Hausmann |
| 2017/0110550 | A1 | 4/2017 | Tsai et al. |
| 2017/0114459 | A1 | 4/2017 | Saly et al. |
| 2017/0117134 | A1 | 4/2017 | Henri et al. |
| 2017/0125436 | A1 | 5/2017 | Sharangpani et al. |
| 2017/0148637 | A1 | 5/2017 | Devilliers |
| 2017/0170015 | A1 | 6/2017 | Kim et al. |
| 2017/0170026 | A1 | 6/2017 | Hudson et al. |
| 2017/0207082 | A1 | 7/2017 | Wang et al. |
| 2017/0323785 | A1 | 11/2017 | Singhal et al. |
| 2017/0323803 | A1 | 11/2017 | Van Schravendijk et al. |
| 2017/0358450 | A1 | 12/2017 | Ko et al. |
| 2018/0005814 | A1 | 1/2018 | Kumar et al. |
| 2018/0033622 | A1 | 2/2018 | Swaminathan et al. |
| 2018/0061628 | A1 | 3/2018 | Ou et al. |
| 2018/0061650 | A1 | 3/2018 | Mahorowala et al. |
| 2018/0076023 | A1 | 3/2018 | Yan et al. |
| 2018/0102245 | A1 | 4/2018 | Sims et al. |
| 2018/0114903 | A1 | 4/2018 | Hausmann |
| 2018/0138028 | A1 | 5/2018 | Henri et al. |
| 2018/0138036 | A1 | 5/2018 | Baldasseroni et al. |
| 2018/0138040 | A1 | 5/2018 | Lavoie |
| 2018/0138405 | A1 | 5/2018 | Mckerrow et al. |
| 2018/0144977 | A1 | 5/2018 | Yu et al. |
| 2018/0223429 | A1 | 8/2018 | Fukazawa et al. |
| 2018/0265973 | A1 | 9/2018 | Firouzdor et al. |
| 2018/0294166 | A1 | 10/2018 | Mallick et al. |
| 2018/0308688 | A1 | 10/2018 | Kato |
| 2018/0308693 | A1 | 10/2018 | Kamp et al. |
| 2018/0308695 | A1 | 10/2018 | Lavoie et al. |
| 2018/0347035 | A1 | 12/2018 | Weimer et al. |
| 2019/0013203 | A1 | 1/2019 | Sreenivasan et al. |
| 2019/0027362 | A1 | 1/2019 | Cheng et al. |
| 2019/0041756 | A1 | 2/2019 | Hasebe et al. |
| 2019/0055645 | A1 | 2/2019 | Li et al. |
| 2019/0080903 | A1 | 3/2019 | Abel et al. |

(56) References Cited

U.S. PATENT DOCUMENTS

| | | | |
|---|---|---|---|
| 2019/0131140 | A1 | 5/2019 | Sun et al. |
| 2019/0172707 | A1 | 6/2019 | Umehara et al. |
| 2019/0172723 | A1 | 6/2019 | Cheng et al. |
| 2019/0206677 | A1 | 7/2019 | Abel et al. |
| 2019/0279866 | A1 | 9/2019 | Pore |
| 2019/0284694 | A1 | 9/2019 | Knisley et al. |
| 2019/0296012 | A1 | 9/2019 | Iwata et al. |
| 2019/0333753 | A1 | 10/2019 | Ueda et al. |
| 2019/0345608 | A1 | 11/2019 | Agarwal et al. |
| 2020/0006374 | A1 | 1/2020 | Rabkin et al. |
| 2020/0032389 | A1 | 1/2020 | Lei et al. |
| 2020/0051992 | A1 | 2/2020 | Liu et al. |
| 2020/0105509 | A1 | 4/2020 | Drewery et al. |
| 2020/0190664 | A1 | 6/2020 | Hu et al. |
| 2020/0227314 | A1 | 7/2020 | Kim et al. |
| 2020/0381623 | A1 | 12/2020 | Qi et al. |
| 2021/0082685 | A1 | 3/2021 | Kataoka et al. |
| 2021/0104399 | A1 | 4/2021 | Kuroda et al. |
| 2021/0125832 | A1 | 4/2021 | Bhatnagar |
| 2021/0159073 | A1 | 5/2021 | Mutyala et al. |
| 2021/0301400 | A1 | 9/2021 | Lee et al. |
| 2021/0313167 | A1 | 10/2021 | Pore et al. |
| 2021/0384029 | A1 | 12/2021 | Fields et al. |
| 2022/0037144 | A1 | 2/2022 | Rao et al. |
| 2022/0068636 | A1 | 3/2022 | Bayati |
| 2022/0275510 | A1 | 9/2022 | Gupta et al. |
| 2023/0178424 | A1 | 6/2023 | Bayati |
| 2023/0220544 | A1 | 7/2023 | Gupta et al. |
| 2023/0317449 | A1 | 10/2023 | Gupta et al. |
| 2024/0087883 | A1 | 3/2024 | Matsuki et al. |
| 2024/0327973 | A1 | 10/2024 | Kumar et al. |
| 2024/0355624 | A1 | 10/2024 | Yang et al. |
| 2024/0410053 | A1 | 12/2024 | Gupta et al. |
| 2025/0014890 | A1 | 1/2025 | Gupta et al. |
| 2025/0014893 | A1 | 1/2025 | Agnew et al. |
| 2025/0019827 | A1 | 1/2025 | Yeon et al. |
| 2025/0054751 | A1 | 2/2025 | Gupta et al. |
| 2025/0069882 | A1 | 2/2025 | Gupta et al. |
| 2025/0197996 | A1 | 6/2025 | Gupta et al. |

FOREIGN PATENT DOCUMENTS

| | | | |
|---|---|---|---|
| CN | 1841676 | A | 10/2006 |
| CN | 101006195 | A | 7/2007 |
| CN | 101255548 | A | 9/2008 |
| CN | 101328578 | A | 12/2008 |
| CN | 101378007 | A | 3/2009 |
| CN | 101506955 | A | 8/2009 |
| CN | 101981225 | A | 2/2011 |
| CN | 102224573 | A | 10/2011 |
| CN | 102471885 | A | 5/2012 |
| CN | 102479672 | A | 5/2012 |
| CN | 102906305 | A | 1/2013 |
| CN | 103168344 | A | 6/2013 |
| CN | 103225071 | A | 7/2013 |
| CN | 103403847 | A | 11/2013 |
| CN | 103515197 | A | 1/2014 |
| CN | 103632955 | A | 3/2014 |
| CN | 103635605 | A | 3/2014 |
| CN | 103918068 | A | 7/2014 |
| CN | 104046955 | A | 9/2014 |
| CN | 104272441 | A | 1/2015 |
| CN | 104517892 | A | 4/2015 |
| CN | 104576506 | A | 4/2015 |
| CN | 104752199 | A | 7/2015 |
| CN | 105448701 | A | 3/2016 |
| CN | 205164805 | U | 4/2016 |
| CN | 105609471 | A | 5/2016 |
| CN | 105789027 | A | 7/2016 |
| CN | 105845549 | A | 8/2016 |
| CN | 105917445 | A | 8/2016 |
| CN | 105977141 | A | 9/2016 |
| CN | 106057637 | A | 10/2016 |
| CN | 106449360 | A | 2/2017 |
| CN | 107680970 | A | 2/2018 |
| CN | 108122734 | A | 6/2018 |
| CN | 108411281 | A | 8/2018 |
| CN | 109791875 | A | 5/2019 |
| EP | 0277766 | A2 | 8/1988 |
| EP | 2278046 | A1 | 1/2011 |
| EP | 3254303 | B1 | 12/2018 |
| GB | 1181559 | A | 2/1970 |
| JP | H0864550 | A | 3/1996 |
| JP | 2005011904 | A | 1/2005 |
| JP | 2005136300 | A | 5/2005 |
| JP | 2005163084 | A | 6/2005 |
| JP | 2005210076 | A | 8/2005 |
| JP | 2006060091 | A | 3/2006 |
| JP | 2006080359 | A | 3/2006 |
| JP | 2007154297 | A | 6/2007 |
| JP | 2007281181 | A | 10/2007 |
| JP | 2008517479 | A | 5/2008 |
| JP | 2008160123 | A | 7/2008 |
| JP | 2008306093 | A | 12/2008 |
| JP | 2009010318 | A | 1/2009 |
| JP | 2009170823 | A | 7/2009 |
| JP | 2010010497 | A | 1/2010 |
| JP | 2010087187 | A | 4/2010 |
| JP | 2010527138 | A | 8/2010 |
| JP | 2010232214 | A | 10/2010 |
| JP | 2010239103 | A | 10/2010 |
| JP | 2010283388 | A | 12/2010 |
| JP | 2011035366 | A | 2/2011 |
| JP | 2011192776 | A | 9/2011 |
| JP | 2012084707 | A | 4/2012 |
| JP | 2012142574 | A | 7/2012 |
| JP | 2012169408 | A | 9/2012 |
| JP | 2012221978 | A | 11/2012 |
| JP | 5225081 | B2 | 7/2013 |
| JP | 2013153164 | A | 8/2013 |
| JP | 2013182951 | A | 9/2013 |
| JP | 2013225655 | A | 10/2013 |
| JP | 2014038968 | A | 2/2014 |
| JP | 2014179607 | A | 9/2014 |
| JP | 2014532304 | A | 12/2014 |
| JP | 2015029097 | A | 2/2015 |
| JP | 2015512568 | A | 4/2015 |
| JP | 2015159335 | A | 9/2015 |
| JP | 2016184685 | A | 10/2016 |
| JP | 2017130665 | A | 7/2017 |
| KR | 20010075177 | A | 8/2001 |
| KR | 20010112877 | A | 12/2001 |
| KR | 20020018119 | A | 3/2002 |
| KR | 20040030829 | A | 4/2004 |
| KR | 20050074964 | A | 7/2005 |
| KR | 20060023137 | A | 3/2006 |
| KR | 20070088512 | A | 8/2007 |
| KR | 100861851 | B1 | 10/2008 |
| KR | 20090033449 | A | 4/2009 |
| KR | 20090080019 | A | 7/2009 |
| KR | 20090119661 | A | 11/2009 |
| KR | 20090131821 | A | 12/2009 |
| KR | 20100027062 | A | 3/2010 |
| KR | 20100128863 | A | 12/2010 |
| KR | 20100133377 | A | 12/2010 |
| KR | 20120098448 | A | 9/2012 |
| KR | 20130049690 | A | 5/2013 |
| KR | 20130062256 | A | 6/2013 |
| KR | 20130135087 | A | 12/2013 |
| KR | 20130135347 | A | 12/2013 |
| KR | 20140069326 | A | 6/2014 |
| KR | 20140079431 | A | 6/2014 |
| KR | 20140126241 | A | 10/2014 |
| KR | 20140141686 | A | 12/2014 |
| KR | 20150025224 | A | 3/2015 |
| KR | 20150053253 | A | 5/2015 |
| KR | 20150102738 | A | 9/2015 |
| KR | 20150103642 | A | 9/2015 |
| KR | 20160033057 | A | 3/2016 |
| KR | 20160035991 | A | 4/2016 |
| KR | 20160045527 | A | 4/2016 |
| KR | 20160068002 | A | 6/2016 |
| KR | 20170008690 | A | 1/2017 |
| KR | 20170087425 | A | 7/2017 |

(56) References Cited

FOREIGN PATENT DOCUMENTS

| | | | |
|---|---|---|---|
| KR | 101884555 | B1 | 8/2018 |
| KR | 20180092881 | A | 8/2018 |
| KR | 20190070365 | A | 6/2019 |
| KR | 20200086582 | A | 7/2020 |
| KR | 20210014483 | A | 2/2021 |
| KR | 102407031 | B1 | 6/2022 |
| TW | 483103 | B | 4/2002 |
| TW | 200733215 | A | 9/2007 |
| TW | 201033739 | A | 9/2010 |
| TW | 201430951 | A | 8/2014 |
| TW | 201439105 | A | 10/2014 |
| TW | 201606855 | A | 2/2016 |
| TW | 201623682 | A | 7/2016 |
| TW | 201736633 | A | 10/2017 |
| TW | 201835374 | A | 10/2018 |
| TW | 202014546 | A | 4/2020 |
| WO | WO-2006018441 | A1 | 2/2006 |
| WO | WO-2006026350 | A2 | 3/2006 |
| WO | WO-2011130397 | A2 | 10/2011 |
| WO | WO-2012061593 | A2 | 5/2012 |
| WO | WO-2012066977 | A1 | 5/2012 |
| WO | WO-2012165166 | A1 | 12/2012 |
| WO | WO-2013043330 | A1 | 3/2013 |
| WO | WO-2013066667 | A1 | 5/2013 |
| WO | WO-2013137115 | A1 | 9/2013 |
| WO | WO-2013148880 | A1 | 10/2013 |
| WO | WO-2014030393 | A1 | 2/2014 |
| WO | WO-2020131635 | A1 | 6/2020 |
| WO | WO-2021025874 | A1 | 2/2021 |

OTHER PUBLICATIONS

Becker, F.S. and Rohl, S. (Nov. 1987) "Low Pressure Deposition of Doped SiO2 by Pyrolysis of Tetraethylorthosilicate (TEOS)," J. Electrochem. Soc.: Solid-State Science and Technology, 134(11):2923-2931.

Cecchi et al., (2007) "Ultra-thin conformal pore-sealing of low-k materials by plasma-assisted ALD," University of New Mexico, Albuquerque, NM, Sandia National Labs, Albuquerque, NM, 1 page.

Chinese First Office Action dated Apr. 12, 2021 issued in Application No. CN 201711112653.9.

Chinese First Office Action dated Jul. 31, 2020 issued in Application No. CN 201710636255.0.

Chinese First Office Action dated Jun. 23, 2020 issued in Application No. CN 201811075877.1.

Chinese First Office Action dated Mar. 30, 2018 issued in Application No. CN 201610206201.6.

Chinese First Office Action dated May 19, 2016 issued in Application No. CN 201310021460.8.

Chinese First Office Action dated Nov. 13, 2020 issued in Application No. CN 201710772400.8.

Chinese First Office Action dated Nov. 8, 2017 issued in Application No. CN 201510615853.0.

Chinese Fourt Office Action dated May 16, 2018 issued in Application No. CN 201310021460.8.

Chinese Notification of Reexamination dated Apr. 17, 2020 issued in Application No. CN 201310021460.8.

Chinese Second Office Action dated Apr. 13, 2017 issued in Application No. CN 201310021460.8.

Chinese Second Office Action dated Jan. 24, 2019 issued in Application No. CN 201610206201.6.

Chinese Second Office Action dated Mar. 15, 2021 issued in Application No. CN 201811075877.1.

Chinese Third Office Action dated Oct. 17, 2017 issued in Application No. CN 201310021460.8.

CN Office Action dated Dec. 6, 2023, in CN Application No. 202080055912.2, with English translation.

CN Office Action dated Jun. 17, 2024 in CN Application No. 202110564747.X, with English Translation.

CN Office Action dated Jun. 26, 2024 in CN Application No. 202080012243 with English translation.

CN Office Action dated Jun. 29, 2023 in Application No. CN201780070122.X with English Translation.

CN Office Action dated Mar. 7, 2022, in Application No. CN201711112653.9 with English translation.

CN Office Action dated Mar. 15, 2023 in Application No. CN201780070122.X with English Translation.

CN Office Action dated Mar. 30, 2023, in Application No. CN201880073124.9 with English translation.

CN Office Action dated Nov. 19, 2021, in application No. CN201711112653 with English translation.

CN Office Action dated Oct. 8, 2022 in Application No. CN201780070122.X with English Translation.

CN Office Action dated Sep. 16, 2022, in Application No. CN201780070305.1 with English translation.

CN Office Action dated Sep. 2, 2021, in application No. CN201811075877.1 with English translation.

CN Office Action dated Sep. 21, 2023, in Application No. CN201880073124.9 with English translation.

European Examination Report dated Dec. 11, 2017 issued in Application No. EP 13 15 2046.

European Extended Search Report dated Apr. 14, 2014 issued in Application No. EP13152046.2.

Huang et al. (2017) "Design of efficient mono-aminosilane precursors for atomic layer deposition of SiO2 thin films," Royal Society of Chemistry Adv. 2017, 7:22672-22678.

Huang J., et al., "Dependence of Film Properties of Subatmospheric Pressure Chemical Vapor Deposited Oxide on Ozone-to-Tetraethylorthosilicate Ratio" J. Electrochem. Soc., vol. 140, No. 6, Jun. 1993, pp. 1682.

International Preliminary Report on Patentability and Written Opinion dated Feb. 2, 2023 in PCT Application No. PCT/US2021/042652.

International Preliminary Report on Patentability and Written Opinion dated Jan. 18, 2024 in PCT Application No. PCT/US2022/036026.

International Preliminary Report on Patentability and Written Opinion dated Jul. 4, 2024 in PCT Application No. PCT/US2022/081972.

International Preliminary Report on Patentability and Written Opinion dated Jul. 18, 2024 in PCT Application No. PCT/US2022/082624.

International Preliminary Report on Patentability and Written Opinion dated Jun. 13, 2024 in PCT Application No. PCT/US2022/080683.

International Preliminary Report on Patentability and Written Opinion dated Jun. 27, 2024 in PCT Application No. PCT/US2022/081591.

International Preliminary Report on Patentability and Written Opinion dated Mar. 7, 2024 in PCT Application No. PCT/US2022/075296.

International Preliminary Report on Patentability and written opinion dated Nov. 17, 2022 in Application PCT/US2021/028028.

International Preliminary Report on Patentability dated Dec. 15, 2022 from PCT/US2021/035269.

International Preliminary Report on Patentability dated Feb. 9, 2023 in PCT Application No. PCT/US2021/070988.

International Preliminary Report on Patentability dated Feb. 17, 2022 in PCT Application No. PCT/US2020/043459.

International Preliminary Report on Patentability dated Mar. 26, 2020 issued in Application No. PCT/US2018/050049.

International Preliminary Report on Patentability dated May 23, 2019 issued in Application No. PCT/US17/60692.

International Preliminary Report on Patentability dated May 23, 2019 issued in Application No. PCT/US2017/060240.

International Search Report and Written Opinion dated Apr. 14, 2023 in PCT Application No. PCT/US2022/080683.

International Search Report and Written Opinion dated Apr. 25, 2023 in PCT Application No. PCT/US2022/081591.

International Search Report and Written Opinion dated Apr. 28, 2023, in Application No. PCT/US2022/081972.

(56) References Cited

OTHER PUBLICATIONS

International Search Report and Written Opinion dated Aug. 6, 2021 issued in Application No. PCT/US2021/028028.
International Search Report and Written Opinion dated Dec. 2, 2022 in PCT Application No. PCT/US2022/075296.
International Search Report and Written Opinion dated Dec. 26, 2023 in PCT Application No. PCT/US2023/031873.
International Search Report and Written Opinion dated Feb. 13, 2018 issued in Application No. PCT/US2017/060692.
International Search Report and Written Opinion dated Feb. 21, 2018 issued in Application No. PCT/US2017/060240.
International Search Report and Written Opinion dated Feb. 25, 2019 issued in Application No. PCT/US2018/050049.
International Search Report and Written Opinion dated May 8, 2023 in PCT Application No. PCT/US2022/082624.
International Search Report and Written Opinion dated May 28, 2020 issued in Application No. PCT/US2020/013693.
International Search Report and Written Opinion dated Nov. 11, 2020 issued in Application No. PCT/US2020/043459.
International Search Report and Written Opinion dated Nov. 11, 2021, in PCT Application No. PCT/US2021/042652.
International Search Report and Written Opinion dated Nov. 17, 2021, in PCT Application No. PCT/US2021/070988.
International Search Report and Written Opinion dated Oct. 28, 2022 in PCT Application No. PCT/US2022/036026.
International Search Report and Written Opinion dated Sep. 23, 2021 in PCT Application No. PCT/US2021/035269.
Japanese Decision of Rejection dated Jan. 9, 2018 issued in Application No. JP 2013-007612.
Japanese First Office Action dated Dec. 1, 2020 issued in Application No. JP 2016-185454.
Japanese First Office Action dated May 28, 2019 issued in Application No. JP 2017-143195.
Japanese First Office Action dated May 29, 2019 issued in Application No. JP 2018-090402.
Japanese First Office Action dated Oct. 8, 2019 issued in Application No. JP 2015-184688.
Japanese Notice of Allowance Apr. 28, 2020 issued in Application No. JP 2015-184688.
Japanese Office Action dated Jan. 10, 2017 issued in Application No. JP 2013-007612.
Japanese Reason for Refusal dated Apr. 2, 2019 issued in Application No. JP 2013-007612.
Japanese Second Office Action dated Dec. 24, 2019 issued in Application No. JP 2017-143195.
Japanese Second Office Action [Decision of Rejection] dated Jan. 14, 2020 issued in Application No. JP 2018-090402.
Japanese Third Office Action dated Aug. 25, 2020 issued in Application No. JP 2017-143195.
JP Office Action dated Oct. 18, 2022, in Application No. JP2020-514992 with English translation.
King, Sean W., (Jul./Aug. 2011) "Plasma enhanced atomic layer deposition of SiNx:H and SiO2," J. Vac. Sci. Technol. A29(4):041501-1 through 041501-9 (9 pages).
Korean Decision from the Patent Tribunal of the KIPO (description) dated May 26, 2015 issued in Application No. KR 10-2012-0043797.
Korean Final Office Action dated Aug. 18, 2014 issued in Application No. KR 10-2012-0043797.
Korean First Office Action dated Nov. 27, 2019 issued in Application No. KR 10-2017-0093932.
Korean Notice of Provisional Rejection dated Dec. 6, 2013 issued in Application No. KR 10-2012-0043797.
Korean Second Office Action dated Oct. 27, 2020 issued in Application No. KR 10-2017-0093932.
KR Office Action dated Jul. 5, 2022 in Application No. KR10-2015-0163065 with English translation.
KR office action dated Apr. 24, 2022 in Application No. KR10-2015-0133942 with English Translation.
KR Office action dated Aug. 8, 2022 in KR Application No. KR10-2015-0162556 with English translation.
KR Office Action dated Aug. 17, 2023, in application No. KR10-2016-0039946 with English translation.
KR Office Action dated Aug. 30, 2023, in Application No. KR10-2020-7010492 with English Translation.
KR Office Action dated Feb. 5, 2024 in KR Application No. 10-2023-0184996, with English Translation.
KR Office action dated Feb. 24, 2023 in KR Application No. KR10-2015-0162556 with English translation.
KR Office Action dated Jan. 5, 2023 in Application No. KR10-2016-0039946 with English translation.
KR Office Action dated Jan. 12, 2022 in Application No. KR1020150163065 with English translation.
KR Office Action dated Jan. 26, 2022, in Application No. 10-2019-7016749 with English translation.
KR Office Action dated Jul. 12, 2022 in Application No. KR20197016749 With English translation.
KR Office Action dated Jul. 14, 2023, in application No. KR10-2022-7018901 with English translation.
KR Office Action dated Jul. 20, 2022, in Application No. KR10-2017-0147904 with English translation.
KR Office Action dated Jun. 7, 2022 in Application No. KR20210086044 with English translation.
KR Office Action dated Jun. 10, 2022, in Application No. KR1020170109223 with English translation.
KR Office Action dated Mar. 31, 2023, in Application No. KR10-2016-0122046 with English translation.
KR Office Action dated Mar. 4, 2022, in Application No. KR10-2019-7017087 with English Translation.
KR Office Action dated Nov. 4, 2022 in Application No. KR10-2022-7018901 with English translation.
KR Office Action dated Nov. 30, 2021 in Application No. KR10-2019-7017087 with English Translation.
KR Office Action dated Oct. 6, 2022, in Application No. KR10-2015-0133942 with English Translation.
KR Office Action dated Sep. 6, 2022, in Application No. KR10-2017-0109223 with English translation.
KR Office Action dated Sep. 27, 2021, in application No. KR20210086044 with English translation.
KR Office Action dated Sep. 29, 2021, in application No. KR1020170109223 with English translation.
Kunnen, E. et al., "A way to integrate multiple block layers for middle of line contact patterning", in Advanced Etch Technology for Nanopatterning IV, Edited by Qinghuam Lin and Sebastian Engelmann, Mar. 17, 2015, Proc. of SPIE, vol. 9428, 94280W1-8, 8 pages. [Downloaded on Jun. 27, 2017 from http://proceedings.spiedigitallibrary.org ].
Lin et al., (1998) "Silicon Nitride Films Deposited by Atmospheric Pressure Chemical Vapor Deposition," Materials Research Society Symposium Proceedings vol. 495, Chemical Aspects of Electronic Ceramics Processing, Symposium held Nov. 30-Dec. 4, 1997, Boston, Massachusetts, U.S.A., 8 pages.
PCT International Preliminary Report on Patentability and Written Opinion, dated Oct. 26, 2012, issued in PCT/US2011/032303.
PCT International Search Report and Written Opinion, dated Feb. 20, 2012, issued in PCT/US2011/032303.
PCT Invitation to Pay Additional Fees; Communication Re Partial International Search, dated Dec. 16, 2011, issued in Application No. PCT/US2011/032303.
Plasma Enhanced Atomic Layer Deposition (PEALD), Website: http://www.asm.com/index.php?option=com_content&task=view&id=19&Itemid=161 (2010), 1 page.
"PlasmaProTM NGP® 80 Range," Oxford Instruments (2010), 8 pages.
SG Search Report and Written Opinion dated Dec. 28, 2022 in Application No. SG11202108291S.
SG Written Opinion dated Jan. 17, 2024 in SG Application No. 11202201069Y.
SG Written Opinion dated Mar. 19, 2024 in SG Application No. 11202108291S.
SG Written Opinion dated Sep. 29, 2023 in Application No. SG11202108291S.

(56) References Cited

OTHER PUBLICATIONS

Singapore Notice of Eligibility for Grant and Supplemental Examination Report dated Jan. 20, 2020 issued in Application No. SG 10201507848X.
Taiwan Examination Report dated Mar. 29, 2017 issued in Application No. TW 102102054.
Taiwan First Office Action dated Feb. 27, 2019, issued in Application No. TW 106124691.
Taiwan First Office Action dated Oct. 16, 2019 issued in Application No. TW 105109955.
Taiwanese First Decision of Refusal dated Dec. 22, 2020 issued in Application No. TW 1051305401.
Taiwanese First Office Action dated Apr. 25, 2019 issued in Application No. TW 104131344.
Taiwanese First Office Action dated Jun. 13, 2019 issued in Application No. TW 104138370.
Taiwanese First Office Action dated Mar. 25, 2020 issued in Application No. TW 105130541.
Taiwanese Notice of Allowance dated Feb. 17, 2019 issued in Application No. TW 104138370.
TW Office Action dated Jun. 17, 2022 in Application No. TW107131673 With English Translation.
TW Office Action dated Jul. 2, 2024 in TW Application No. 109102169, with English Translation.
TW Office Action dated Mar. 22, 2024 in TW Application No. 109102169, with English Translation.
TW Office Action dated Oct. 16, 2023, in application No. TW109102169 with English translation.
US Advisory Action dated May 20, 2019 issued in U.S. Appl. No. 15/349,746.
U.S. Appl. No. 16/852,261, inventors Abel et al., filed Apr. 17, 2020.
U.S. Corrected Notice of Allowance dated Jul. 17, 2024 in U.S. Appl. No. 17/632,074.
US Final Office Action dated Apr. 20, 2018 issued in U.S. Appl. No. 15/349,753.
US Final Office Action dated Apr. 25, 2013 issued in U.S. Appl. No. 13/084,305.
US Final Office Action dated Apr. 9, 2018 issued in U.S. Appl. No. 15/279,312.
US Final Office Action dated Dec. 21, 2018 issued in U.S. Appl. No. 15/349,746.
US Final Office Action dated Feb. 5, 2020 issued in U.S. Appl. No. 15/349,746.
U.S. Final Office Action dated Jan. 2, 2018 issued in U.S. Appl. No. 15/351,221.
US Final Office Action dated Jan. 18, 2018 issued in U.S. Appl. No. 15/349,746.
US Final Office Action dated Jan. 21, 2020 issued in U.S. Appl. No. 15/847,744.
U.S. Final Office Action dated Mar. 29, 2024 in U.S. Appl. No. 17/632,074.
US Final Office Action dated Nov. 14, 2014 issued in U.S. Appl. No. 14/065,334.
US Final Office Action dated Oct. 19, 2017 issued in U.S. Appl. No. 15/279,314.
U.S. Non-Final Office Action dated Jul. 5, 2017 issued in U.S. Appl. No. 15/351,221.
U.S. Non-Final Office Action dated Jul. 7, 2023, in U.S. Appl. No. 17/632,074.
U.S. Non-Final Office Action dated May 8, 2024 in U.S. Appl. No. 17/310,132.
US Notice of Allowance dated Apr. 25, 2018 issued in U.S. Appl. No. 15/253,546.
US Notice of Allowance dated Aug. 18, 2015 issued in U.S. Appl. No. 14/494,914.
US Notice of Allowance dated Dec. 11, 2019 issued in U.S. Appl. No. 15/279,312.
US Notice of Allowance dated Dec. 5, 2018 issued in U.S. Appl. No. 15/703,917.
US Notice of Allowance dated Feb. 1, 2016 issued in U.S. Appl. No. 14/552,245.
US Notice of Allowance dated Feb. 17, 2015 issued in U.S. Appl. No. 14/065,334.
US Notice of Allowance dated Feb. 8, 2017 issued in U.S. Appl. No. 14/713,639.
US Notice of Allowance dated Jan. 15, 2020 issued in U.S. Appl. No. 16/294,783.
U.S. Notice of Allowance dated Jul. 5, 2024 in U.S. Appl. No. 17/632,074.
US Notice of Allowance dated Jul. 1, 2020 issued in U.S. Appl. No. 15/349,746.
US Notice of Allowance dated Jul. 15, 2016 issued in U.S. Appl. No. 14/678,736.
U.S. Notice of Allowance dated Jul. 16, 2018 issued in U.S. Appl. No. 15/351,221.
US Notice of Allowance dated Jul. 26, 2013, issued U.S. Appl. No. 13/414,619.
US Notice of Allowance dated Jul. 26, 2018 issued in U.S. Appl. No. 15/829,702.
US Notice of Allowance dated Jun. 17, 2019 issued in U.S. Appl. No. 15/349,753.
US Notice of Allowance dated May 28, 2020 issued in U.S. Appl. No. 15/847,744.
US Notice of Allowance dated Oct. 26, 2016 issued in U.S. Appl. No. 14/552,245.
US Notice of Allowance dated Sep. 1, 2017 issued in U.S. Appl. No. 15/272,222.
US Notice of Allowance dated Sep. 19, 2016 issued in U.S. Appl. No. 14/935,317.
US Notice of Allowance dated Sep. 26, 2016 issued in U.S. Appl. No. 14/552,011.
US Notice of Allowance dated Sep. 28, 2017 issued in U.S. Appl. No. 15/399,637.
US Office Action dated Apr. 11, 2014 issued in U.S. Appl. No. 14/065,334.
US Office Action dated Apr. 18, 2016 issued in U.S. Appl. No. 14/935,317.
US Office Action dated Apr. 18, 2019 issued in U.S. Appl. No. 15/279,312.
US Office Action dated Apr. 7, 2017 issued in U.S. Appl. No. 15/279,314.
US Office Action dated Jul. 14, 2017 issued in U.S. Appl. No. 15/349,746.
US Office Action dated Jul. 18, 2018 issued in U.S. Appl. No. 15/703,917.
US Office Action dated Jul. 30, 2019 issued in U.S. Appl. No. 15/847,744.
US Office Action dated Jun. 14, 2019 issued in U.S. Appl. No. 15/349,746.
US Office Action dated Jun. 29, 2017 issued in U.S. Appl. No. 15/279,312.
US Office Action dated Jun. 29, 2018 issued in U.S. Appl. No. 15/349,746.
US Office Action dated Jun. 7, 2013 issued U.S. Appl. No. 13/414,619.
US Office Action dated May 19, 2017 issued in U.S. Appl. No. 15/272,222.
US Office Action dated May 24, 2016 issued in U.S. Appl. No. 14/552,245.
US Office Action dated May 25, 2016 issued in U.S. Appl. No. 14/552,011.
US Office Action dated Oct. 1, 2015 issued in U.S. Appl. No. 14/552,245.
US Office Action dated Oct. 23, 2017 issued in U.S. Appl. No. 15/349,753.
US Office Action dated Oct. 6, 2017 issued in U.S. Appl. No. 15/253,546.
US Office Action dated Sep. 14, 2012 issued in U.S. Appl. No. 13/084,305.
US Office Action dated Sep. 28, 2018 issued in U.S. Appl. No. 15/349,753.
U.S. Appl. No. 18/577,681, inventors Kumar; Ravi, et al., filed Jan. 8, 2024.

(56) References Cited

OTHER PUBLICATIONS

U.S. Appl. No. 18/684,591, inventors Yang N, etal., filed Feb. 16, 2024.
U.S. Appl. No. 18/709,780, inventors Gupta A., et al., filed May 13, 2024.
U.S. Appl. No. 18/720,146, inventors Austin D.Z, et al., filed Jun. 14, 2024.
U.S. Appl. No. 18/727,030, inventors Gupta A, et al., filed Jul. 5, 2024.
U.S. Restriction requirement dated Apr. 20, 2023 in U.S. Appl. No. 17/632,074.
U.S. Restriction requirement dated Feb. 1, 2024, in U.S. Appl. No. 17/310,132.
Wikipedia, The Free Encyclopedia, Definition of "Silicon Nitride," Archived from Apr. 9, 2015, 1 page [Downloaded on Oct. 12, 2017 from https://web.archive.org/web/20150409055521/https://en.wikipedia.org/wiki/Silicon_nitride].
Batra V N., et al., "Effect of Low Thermal Budget Annealing on Surface Passivation of Silicon by ALD Based Aluminum Oxide Films," Physical Chemistry Chemical Physics, 2014, vol. 16, pp. 21804-21811.
Chen F., et al., "Influence of Underlying Interlevel Dielectric Films on Extrusion Formation in Aluminum Interconnects," Journal of Vacuum Science and Technology B, Nov. 2000, vol. 18 (6), pp. 2826-2834.
Cheng Y., et al., "Plasma Damage on Low-k Dielectric Materials," Chapter 15, Plasma Science and Technology, Intechopen, 2018, pp. 291-317.
CN Office Action dated Jan. 7, 2025 in CN Application No. 202080055912.2 with English translation.
CN Office Action dated Mar. 7, 2025 in CN Application No. 202080012243.0, with English Translation.
CN Office Action dated Sep. 11, 2024 in CN Application No. 202080055912.2 with English translation.
EP Extended European Search Report dated Jun. 6, 2025 in EP Application No. 22838286.7.
International Preliminary Report on Patentability and Written Opinion dated Jun. 27, 2024 in PCT Application No. PCT/US2022/053014.
International Preliminary Report on Patentability and Written Opinion dated Mar. 20, 2025 in PCT Application No. PCT/US2023/031873.
International Preliminary Report on Patentability and Written Opinion dated May 10, 2024 in PCT Application No. PCT/US2022/048098.
International Preliminary Report on Patentability and Written Opinion dated Oct. 3, 2024 in PCT Application No. PCT/US2023/064491.
International Preliminary Reporton Patentability and Written Opinion dated Dec. 5, 2024 in PCT Application No. PCT/US2023/023418.
International Search Report and Written Opinion dated Apr. 21, 2023, in PCT Application No. PCT/US2022/053014.
International Search Report and Written Opinion dated Jul. 12, 2023 in PCT Application No. PCT/US2023/064491.
International Search Report and Written Opinion dated Mar. 2, 2023 in PCT Application No. PCT/US2022/048098.
International Search Report and Written Opinion dated Sep. 15, 2023 in PCT Application No. PCT/US2023/023418.
JP Office Action dated Feb. 4, 2025 in JP Application No. 2022-574509, with English Translation.
JP Office Action dated Sep. 30, 2025 in JP Application No. 2022-574509, with English Translation.
KR Decision to Grant and Search Report dated Mar. 27, 2025 in KR Application No. 10-2020-7010492, with English translation.
KR Notice of Allowances dated Oct. 17, 2024 in KR Application No. 10-2023-0184996 with English Translation.
KR Office Action dated Jul. 11, 2025 in KR Application No. 10-2022-7044400, with English Translation.
KR Office Action dated Jul. 15, 2025 in KR Application No. 10-2022-7045959 with English translation.
KR Office Action dated Jul. 19, 2025 in KR Application No. 10-2022-7045897, with English Translation.
KR Office Action dated Jun. 4, 2025 in KR Application No. 10-2021-7027750, with English Translation.
KR Office Action dated Jun. 17, 2025 in KR Application No. 10-2022-7042770, with English Translation.
KR Office Action dated Jun. 26, 2025 in KR Application No. 10-2022-7007516, with English Translation.
KR Office Action dated Oct. 18, 2024 in KR Application No. 10-2021-7027750 with English Translation.
KR Office Action dated Sep. 27, 2024 in KR Application No. 10-2020-7010492 with English Translation.
Li S., et al., "Effect of Post-deposition Annealing on Atomic Layer Deposited $SiO_2$ Film for Silicon Surface Passivation," Materials Science in Semiconductor Processing, 2020, vol. 106, pp. 1-6.
SG Search Report and Written Opinion dated Oct. 1, 2025 in SG Application No. 11202400120X.
SG Written Opinion dated Dec. 19, 2024 in SG Application No. 11202201069Y.
TW Office Action and Search Report dated Apr. 2, 2025 in TW Application No. 110126961, with English Translation.
TW Office Action and Search Report dated Apr. 30, 2025 in TW Application No. 110127484, with English Translation.
TW Office Action and Search Report dated Dec. 31, 2024 in TW Application No. 110119959, with English Translation.
TW Office Action dated Dec. 17, 2024 in TW Application No. 110116166, with English Translation.
TW Office Action dated Jul. 4, 2025 in TW Application No. 110116166, with English Translation.
U.S. Corrected Notice of Allowance dated May 30, 2025 in U.S. Appl. No. 17/310,132.
U.S. Final Office Action dated Oct. 25, 2024 in U.S. Appl. No. 17/310,132.
US Non-Final Office Action dated Aug. 6, 2025 in U.S. Appl. No. 17/997,733.
US Non-Final Office Action dated Jun. 17, 2025 in U.S. Appl. No. 18/000,562.
U.S. Non-Final Office Action dated Mar. 27, 2025 in U.S. Appl. No. 18/577,681.
U.S. Non-Final Office Action dated Nov. 3, 2025 in U.S. Appl. No. 18/721,457.
U.S. Notice of Allowance dated Aug. 5, 2025 in U.S. Appl. No. 18/577,681.
U.S. Notice of Allowance dated Jan. 30, 2025 in U.S. Appl. No. 17/310,132.
U.S. Notice of Allowance dated May 7, 2025 in U.S. Appl. No. 18/003,133.
U.S. Appl. No. 18/868,708, inventors Gupta A et al., filed Nov. 22, 2024.
U.S. Appl. No. 19/109,493, inventors Yang N etal., filed Mar. 6, 2025.
U.S. Restriction Requirement dated Apr. 3, 2025 in U.S. Appl. No. 18/000,562.
U.S. Restriction Requirement dated Jul. 11, 2025 in U.S. Appl. No. 18/721,457.
U.S. Restriction Requirement dated May 7, 2025 in U.S. Appl. No. 17/997,733.

* cited by examiner

100

| |
|---|
| 102 |
| 101 |
| 102 |
| 101 |
| 102 |
| 101 |
| 102 |
| 101 |
| 102 |
| 101 |
| 100 |

CONFORMAL THERMAL CVD WITH CONTROLLED FILM PROPERTIES AND HIGH DEPOSITION RATE

INCORPORATION BY REFERENCE

A PCT 101 Request is filed concurrently with this specification as part of the present application. Each application that the present application claims benefit of or priority to as identified in the concurrently filed PCT Request is incorporated by reference herein in their entireties and for all purposes.

BACKGROUND

Semiconductor device fabrication involves deposition of materials into large areas, such as in gapfill applications for fabrication of memory devices, including 3D-NAND devices. As devices shrink, structures for fabricating efficient and multiple memory cells are used to maximize density of memory cells in a memory device. 3D-NAND technology addresses challenges associated with two-dimensional NAND technology by stacking memory cells vertically in layers.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect involves a method for processing substrates in a chamber, the method including: providing a semiconductor substrate having a feature to a chamber; and depositing dielectric material in the feature on the semiconductor substrate by: introducing a deposition precursor and a reactant to the chamber housing the semiconductor substrate to expose the semiconductor substrate to a plasma free environment including the deposition precursor and the reactant and form the dielectric material, and introducing a passivation gas to the chamber and igniting a passivation plasma in a passivation gas ambient.

In various embodiments, the method also includes exposing the dielectric material to a densification plasma in the chamber generated in an inert gas ambient. In some embodiments, depositing the dielectric material also includes repeating temporally alternating between introducing the deposition precursor and the reactant in a plasma-free environment, introducing the passivation gas, and exposing the dielectric material to the densification plasma in the chamber generated in the inert gas ambient.

In various embodiments, depositing the dielectric material also includes repeating temporally alternating between introducing the deposition precursor and the reactant in a plasma-free environment and introducing the passivation gas.

In some embodiments, the feature has a feature opening of between about 70 nm and about 5 microns. In some embodiments, the feature is at least about 6 microns deep.

In some embodiments, the method also includes changing chamber pressure to modulate thickness profile of the dielectric material.

In some embodiments, the densification plasma is generated using high frequency and low frequency plasma selected to form a concave dielectric material. In some embodiments, the densification plasma is generated in situ.

In some embodiments, the passivation plasma preferentially etches dielectric material at or near a feature opening. In some embodiments, the passivation gas is a halogen-containing gas. In some embodiments, the passivation gas is nitrogen trifluoride. In some embodiments, the passivation plasma is generated in situ.

In some embodiments, introducing the deposition precursor and the reactant and introducing the passivation gas are performed without breaking vacuum.

In some embodiments, introducing the deposition precursor and the reactant and exposing the dielectric material to the densification plasma are performed without breaking vacuum.

In some embodiments, the dielectric material is deposited at a temperature between about 400° C. and about 800° C.

In some embodiments, the dielectric material includes silicon oxide. In some embodiments, the deposition precursor is an aminosilane. In some embodiments, the reactant includes an oxygen-containing gas.

In some embodiments, the feature is a re-entrant feature. In some embodiments, the feature is formed in a multi-layer stack. In some embodiments, the feature has an aspect ratio of about 0.8:1 to about 10:1.

Another aspect involves a method for processing substrates in a chamber, the method including: providing a semiconductor substrate having a feature to a chamber; and depositing dielectric material in the feature on the semiconductor substrate by: introducing a deposition precursor and a reactant to the chamber housing the semiconductor substrate to expose the semiconductor substrate to a plasma free environment including the deposition precursor and the reactant and form the dielectric material, and exposing the dielectric material to a densification plasma in the chamber generated in an inert gas ambient.

In various embodiments, the method also includes introducing a passivation gas to the chamber and igniting a passivation plasma.

In various embodiments, depositing the dielectric material also includes repeating temporally alternating between introducing the deposition precursor and the reactant in a plasma-free environment and exposing the dielectric material to the densification plasma generated in the inert gas ambient.

In some embodiments, the feature has a feature opening of between about 70 nm and about 5 microns. In some embodiments, the feature is at least about 6 microns deep.

In some embodiments, the method also includes changing chamber pressure to modulate thickness profile of the dielectric material.

In some embodiments, the densification plasma is generated using high frequency and low frequency plasma selected to form a concave dielectric material. In some embodiments, the densification plasma is generated in situ.

In some embodiments, the passivation plasma preferentially etches dielectric material at or near a feature opening. In some embodiments, the passivation gas is a halogen-containing gas. In some embodiments, the passivation gas is nitrogen trifluoride. In some embodiments, the passivation plasma is generated in situ.

In some embodiments, introducing the deposition precursor and the reactant and introducing the passivation gas are performed without breaking vacuum.

In some embodiments, introducing the deposition precursor and the reactant and exposing the dielectric material to the densification plasma are performed without breaking vacuum.

In some embodiments, the dielectric material is deposited at a temperature between about 400° C. and about 800° C.

In some embodiments, the dielectric material includes silicon oxide. In some embodiments, the deposition precursor is an aminosilane. In some embodiments, the reactant includes an oxygen-containing gas.

In some embodiments, the feature is a re-entrant feature. In some embodiments, the feature is formed in a multi-layer stack. In some embodiments, the feature has an aspect ratio of about 0.8:1 to about 10:1.

Another aspect involves an apparatus for processing a semiconductor substrate including a semiconductor material, the apparatus including: one or more process chambers, whereby at least one process chamber includes a showerhead, a heated pedestal for heating the semiconductor substrate to a temperature of at least about 650° C.; a plasma generator capable of generating a plasma within the at least one process chamber; one or more gas sources; one or more gas inlets to deliver gas from the one or more gas sources to the one or more process chambers via the showerhead; a controller having at least one processor and a memory, whereby the at least one processor and the memory are communicatively connected with one another, the at least one processor is at least operatively connected with flow-control hardware, and the memory stores computer-executable instructions for controlling the at least one processor to at least control the flow-control hardware by: causing setting of temperature of the heated pedestal to less than about 650° C.; and causing introduction of the following operations in temporally separated pulses: causing introduction of a deposition precursor and a reactant to the one or more process chambers via the showerhead; and after causing stopping of the introduction of the deposition precursor and the reactant, causing generation of a plasma when an inert gas are introduced to the one or more process chambers.

In various embodiments, the controller instructions for causing temporally separated pulses include instructions for causing generation of a second plasma when a passivation gas is introduced to the one or more process chambers.

In various embodiments, the temporally separated pulses are performed without breaking vacuum.

In various embodiments, the temporally separated pulses are performed in the same process chamber.

In various embodiments, at least one of causing introduction of the deposition precursor and the reactant and causing generation of the plasma is performed by fast switching.

These and other features will be described below with reference to the associated drawings.

BRIEF DESCRIPTION OF THE DRAWINGS

FIGS. 10A, 10B, 10C, 10D, 10E, 10F, 10G-1, 10H-1, and 10I-1 are cross-sectional views of substrates having various feature opening types and sidewall features.

FIGS. 10G-2, 10G-3*a*, 10G-3*b* 10G-4, 10G-5, 10H-2, 10H-3*a*, 10H-3*b*, 10H-4, 10H-5, 10I-2, 10I-3*a*, 10I-3*b*, 10I-4, and 10I-5 are cross-sectional views of substrates filled using certain disclosed embodiments.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes involve deposition of dielectric material. Dielectric material may include silicon oxide material in various embodiments. Dielectric material may be deposited onto a variety of topography on a partially fabrication semiconductor device, such as features, gaps, and other areas. The term "feature" used herein refers to negative features, which have a feature opening. Example features include large areas, gaps, trenches, and other holes in a partially fabricated semiconductor device. Dielectric material may be deposited to form pillars, to fill high aspect ratio features, to cover large areas of a substrate, or fill other regions of a partially fabricated semiconductor device.

High aspect ratio features may include features having an aspect ratio of at least about 3:1 or at least about 1:5 or at least about 1:7 or at least about 1:10 or at least about 1:20 or at least about 1:50 or greater or at least about 1:200 or greater. Material deposited into large areas may be referred to as "large area gapfill" (LAG) applications. Large areas may be defined as areas wide feature openings and a low aspect ratio, such as having an aspect ratio of about 0.8:1 and about 10:1. Some large features may have a feature opening of between about 70 nm and about 5 microns, or between about 70 nm and about 500 nm, or about 2 microns, or at least about 2 microns. In some embodiments, large areas may have a depth of at least about 6 microns or more or at least about 10 microns or more.

Some LAG applications involve deposition over a staircase structure, such as a structure used to form a 3D-NAND structure that may be present on a partially fabricated semiconductor device. Some embodiments described herein may be applicable to 3D-NAND structures having at least about 96 pairs or at least about 128 pairs or greater. One example technique for forming 3D-NAND structures is described below with respect to FIGS. 1-9.

Figure 1:
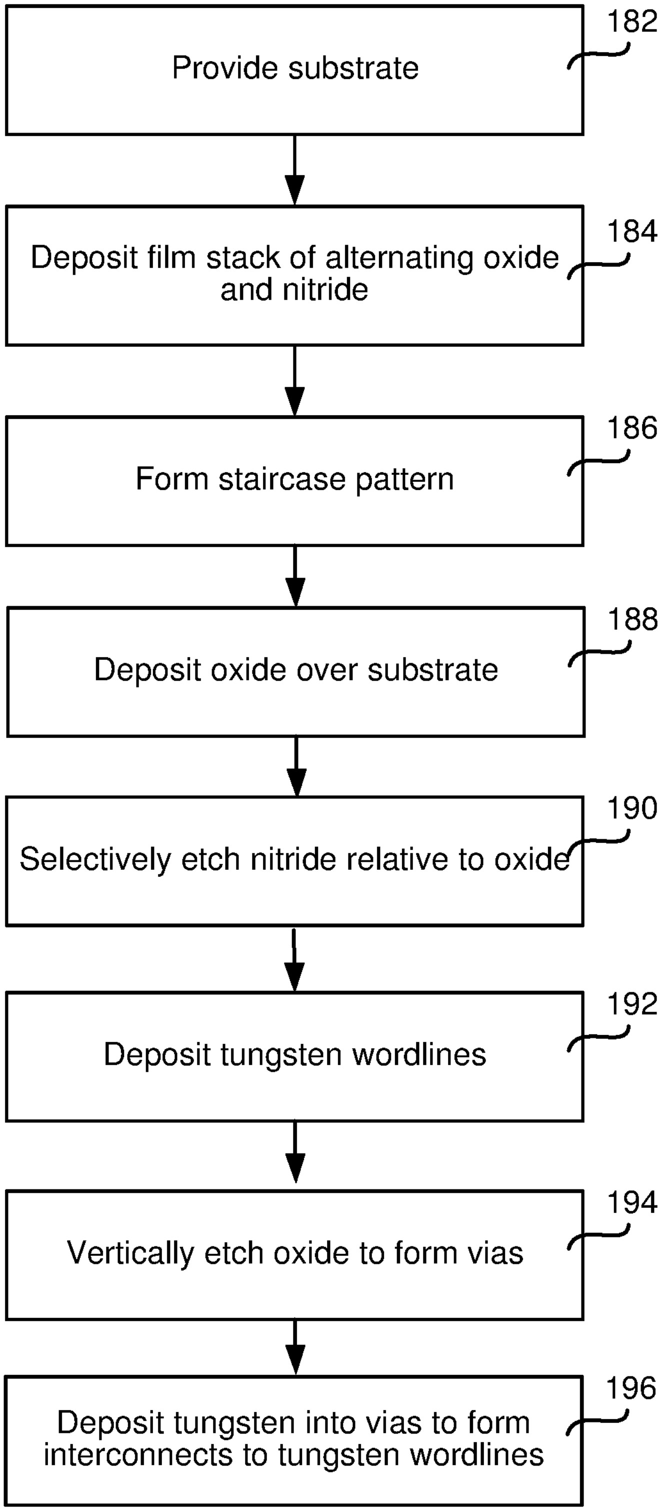
FIG. 1 is a process flow diagram depicting operations for a method.
Figure 2:
FIGS. 2, 3, and 4A are schematic illustrations of a substrate in a patterning scheme.

FIG. 1 shows a process flow diagram of operations performed in accordance with a method for forming a 3D-NAND structure. In operation 182, a substrate is provided. In various embodiments, the substrate is a semiconductor substrate. An example substrate 100 is provided as a schematic illustration in FIG. 2. Returning to FIG. 1, in operation 184, a film stack of alternating oxide and nitride films is deposited on the substrate. This may be referred to as an "ONON" stack (as 0 refers to oxide and N refers to nitride). While oxide and nitride are depicted, it will be understood that other combinations of films may be used for certain embodiments. In some embodiments, the oxide layer deposited is a silicon oxide layer. In some embodiments, the nitride layer deposited is a silicon nitride layer. Each oxide and nitride layer may be deposited to about the same thickness, such as about 10 nm to about 100 nm, or about 350 Å in some embodiments. The oxide layers may be deposited at a deposition temperature of about room temperature to about 800° C. Oxide and nitride layers for forming the alternating oxide and nitride film stack may be deposited using any suitable technique, such as atomic layer deposition (ALD), plasma enhanced atomic layer deposition (PEALD), chemical vapor deposition (CVD), plasma enhanced chemical vapor deposition (PECVD), or sputtering. In various embodiments, the oxide and nitride layers are deposited by PECVD. The film stack may include at least about 48 pairs or at least about 512 pairs or at least about 600 pairs or more of alternating oxide and nitride layers, whereby each oxide or nitride layer constitutes one pair.

Figure 3:
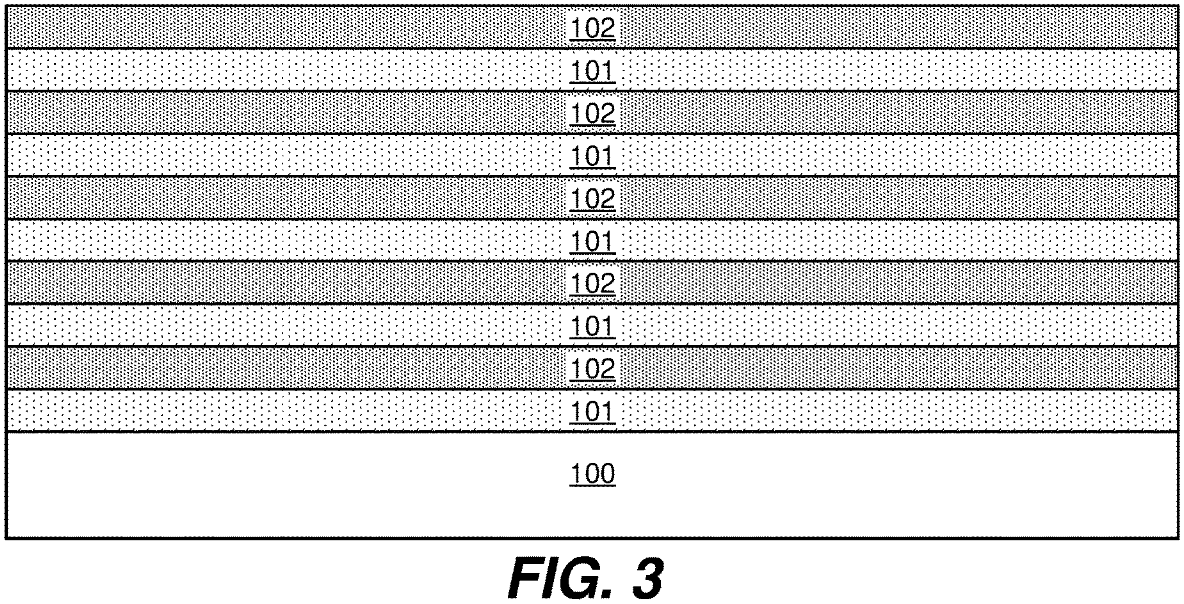

FIG. 3 shows an example schematic illustration of a substrate 100 with alternating oxide 101 and nitride 102 films deposited on the substrate 100. Note that while the structure shown in FIG. 3 shows an oxide 101 deposited first, followed by nitride 102, oxide 101, nitride 102, etc., nitride 102 may be deposited first, followed by oxide 101, nitride 102, oxide 101, etc. Following deposition of the ONON stack, channels (not shown in FIG. 3) may be etched in the ONON stack. Returning to FIG. 1, in operation 186, a staircase pattern is formed on the substrate. A "staircase pattern" as referred to herein includes two or more steps, each step including an oxide and a nitride layer. It will be understood that the top layer of each set of oxide and nitride layers may be either an oxide or a nitride for formation of steps in a staircase pattern. The staircase pattern may be formed using a variety of patterning techniques. For example, one technique may include depositing a sacrificial layer over the substrate and masking regions of the substrate to etch each set of oxide and nitride layers to form the staircase.

Figure 4A:
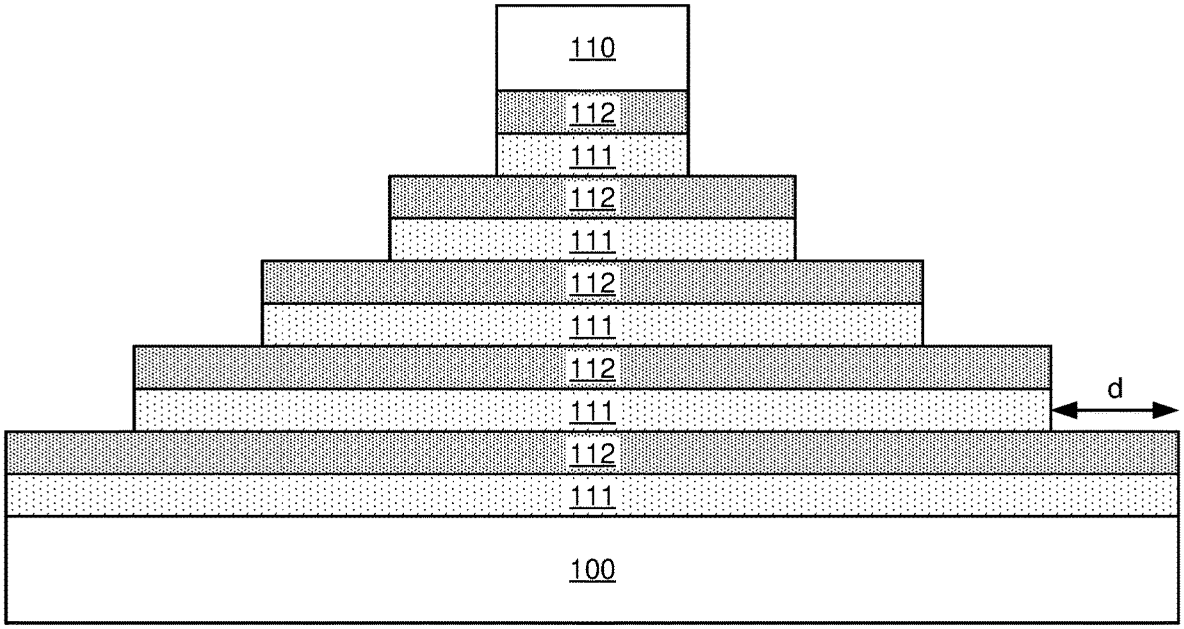

FIG. 4A provides an example of a substrate 100 including a staircase pattern of oxide 111 and nitride 112 layers with a hardmask 110 over the topmost nitride 112 layer. Although FIG. 4A shows four steps of a staircase pattern, it will be understood that a staircase pattern may include multiple decks, each of which have multiple steps. The number of steps in each deck, and in the overall staircase pattern, varies from application to application. In some embodiments, a staircase pattern has about 24 to about 256 steps. In some embodiments, the staircase pattern has over 256 steps. The number of steps in a staircase affects the depth of the ONON stack; the greater the number of steps, the deeper the ONON stack. Each step includes a nitride 112 and oxide 111 layer, and distance d as shown in FIG. 4A may be about 150 nm to about 1000 nm in some embodiments, such as about 500 nm. This region of each step extending out from the edge of the step above it may be referred to as a "pad" having a surface distance d.

Figure 4B:
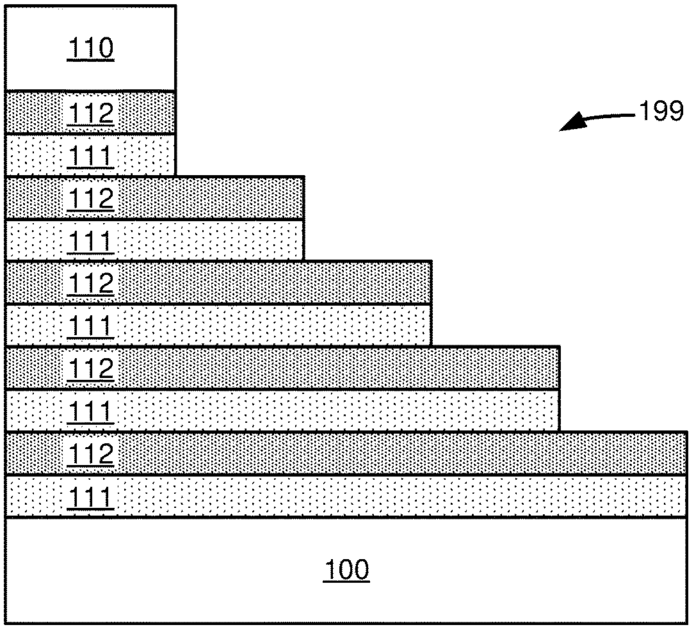
FIG. 4B is a half view of the substrate in FIG. 4A.

For purposes of discussion, the following discussion and subsequent schematic illustrations of the substrate will include a half view 199 as shown in FIG. 4B.

In operation 188 of FIG. 1, oxide is deposited over the substrate. This oxide may be deposited over a large area, effectively depositing into a large "feature." In various embodiments, the oxide may be the same composition as the oxide deposited in layers of the ONON stack. In various embodiments, the oxide deposited over the substrate is deposited at a different deposition temperature than the deposition temperature used for depositing the oxide layers in the ONON stack. The deposition temperature of depositing oxide over large features may be about 400° C. to about 800°, or about 500° C. to about 650° C., or at least about 550° C., or about 600° C. to about 650° C. Vertical slits may be subsequently etched into the ONON stack and in some embodiments, the staircase fill, after depositing oxide.

Figure 5A:
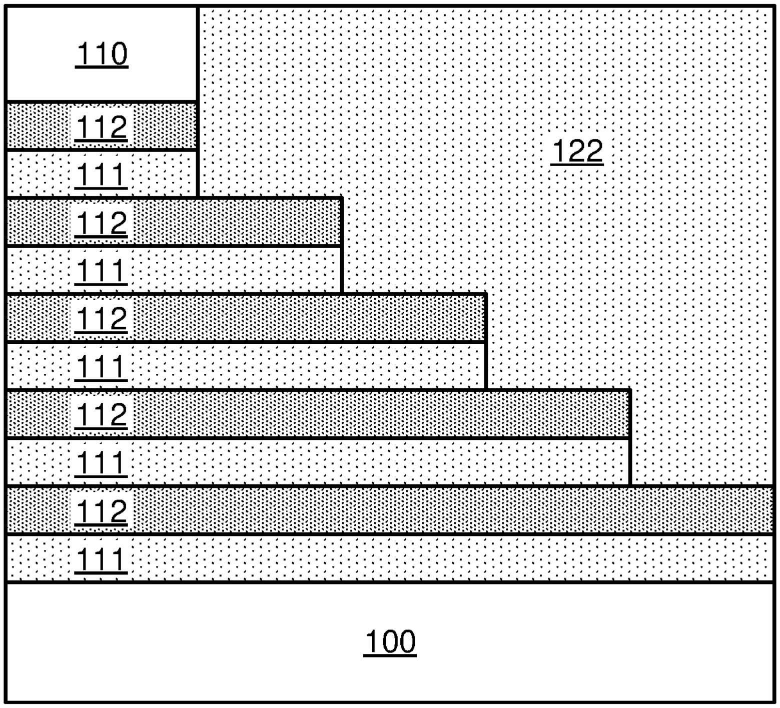
FIGS. 5A, 6A, 7A, 8, and 9 are schematic illustrations of a substrate in a patterning scheme.
Figure 5B:
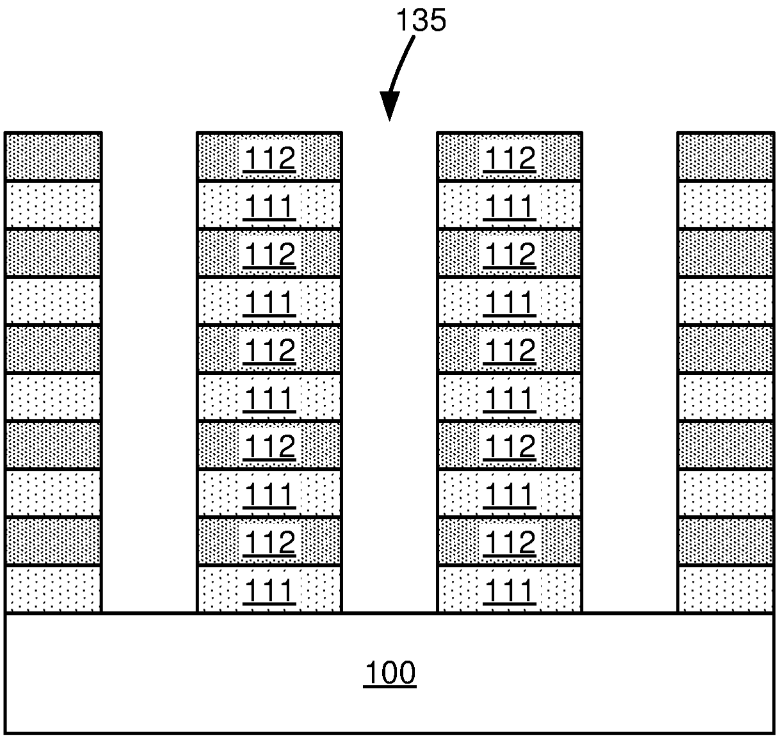
FIGS. 5B, 6B, and 7B are side views of schematic illustrations of substrates depicted in FIGS. 5A, 6A, and 7A, respectively.

FIG. 5A shows an example substrate 100 including the ONON staircase, hardmask 110, and oxide 122 deposited over the substrate. FIG. 5B shows a side view of the substrate 100 after vertical slits 130 are etched.

Figure 6A:
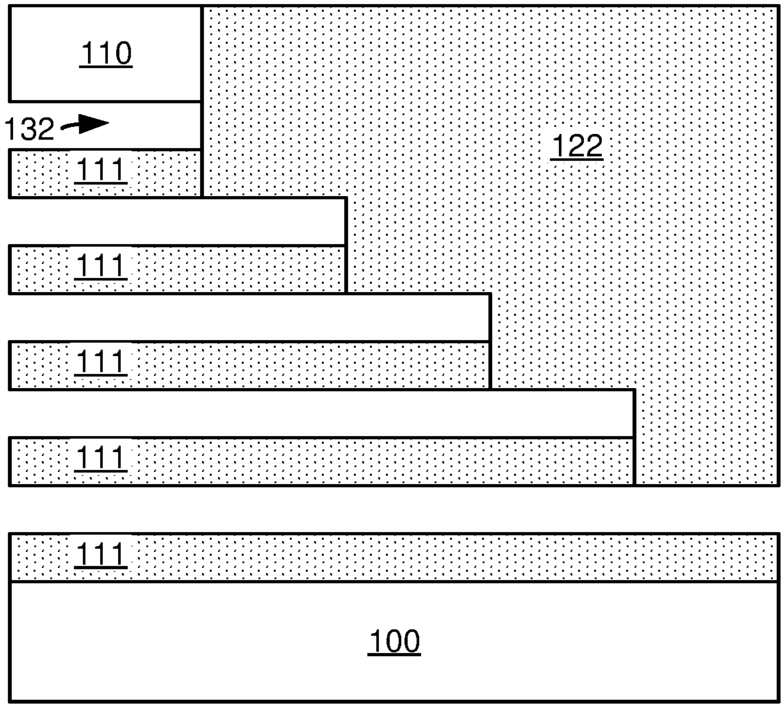
Figure 6B:
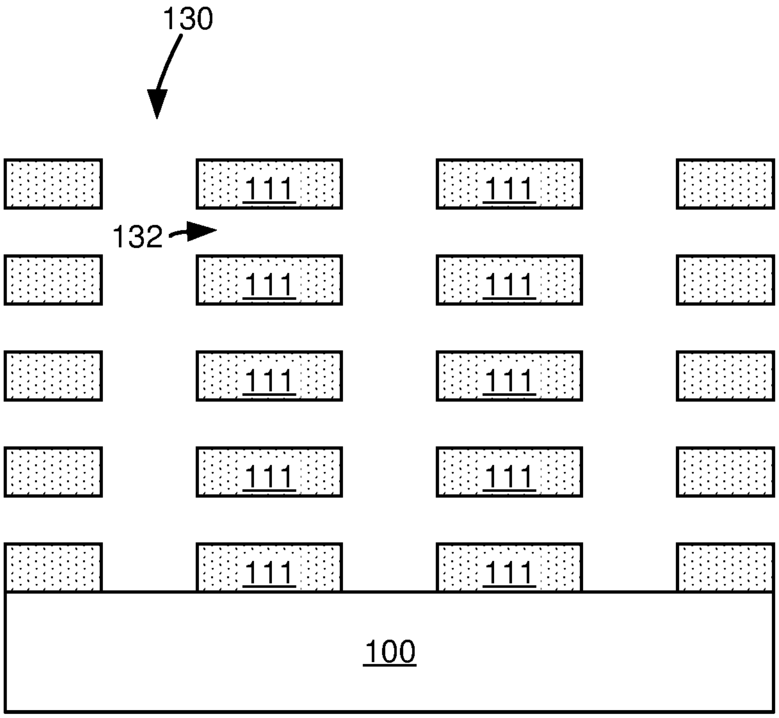

In operation 190, nitride is selectively etched relative to oxide on the substrate. FIG. 6A shows an example schematic illustration of a substrate 100 with horizontal gaps 132 formed from etching nitride. FIG. 6B shows a side view of a cross-section of the substrate whereby gaps 132 are formed from selectively etching nitride.

Figure 7A:
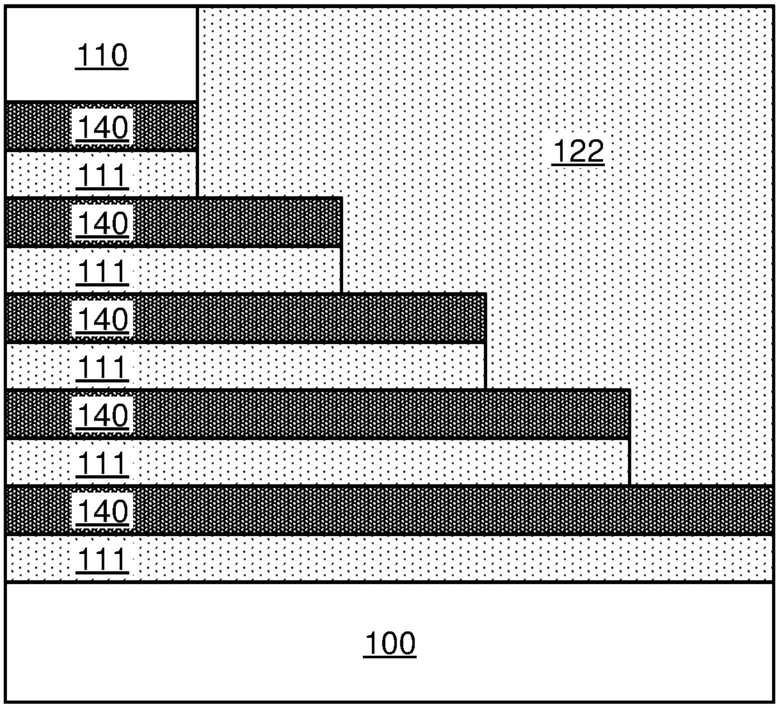
Figure 7B:
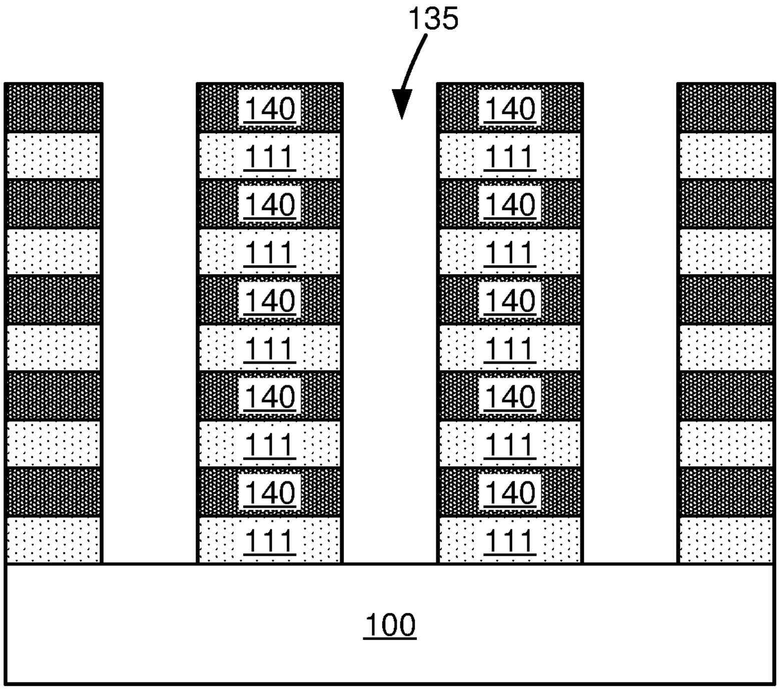

In operation 192, tungsten is deposited into the gaps of the substrate to form tungsten wordlines. Although tungsten is depicted in this example it will be understood that other metals could be used. Tungsten may be deposited by any suitable technique, such as ALD, CVD, PEALD, and/or PECVD. In some embodiments, a barrier layer and/or a tungsten nucleation layer is deposited prior to depositing bulk tungsten. FIG. 7A shows an example of a substrate 100 including deposited tungsten wordlines 140. FIG. 7B shows schematic illustration of a cross-sectional side view of the substrate in 7A having tungsten 140 deposited in gaps previously filled with nitride.

Figure 8:
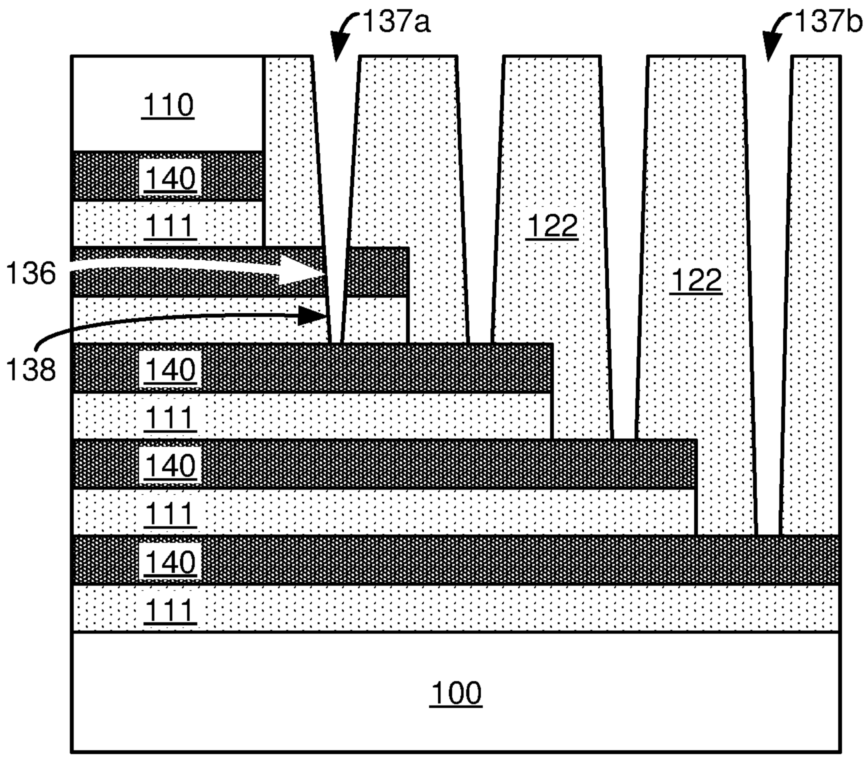

Returning to FIG. 1, in operation 194, the oxide is vertically etched to form vias. The oxide may be etched by dry etching using exposure to one or more of the following gases: $O_2$, Ar, hexafluoro-1,3-butadiene ($C_4F_6$), octafluorocyclobutane ($C_4F_8$), $SF_6$, trifluoromethane ($CHF_3$), and $CF_4$. FIG. 8 shows an example substrate 100 including the ONON stack in a staircase pattern whereby vias 137 are etched in the oxide 122.

Figure 9:
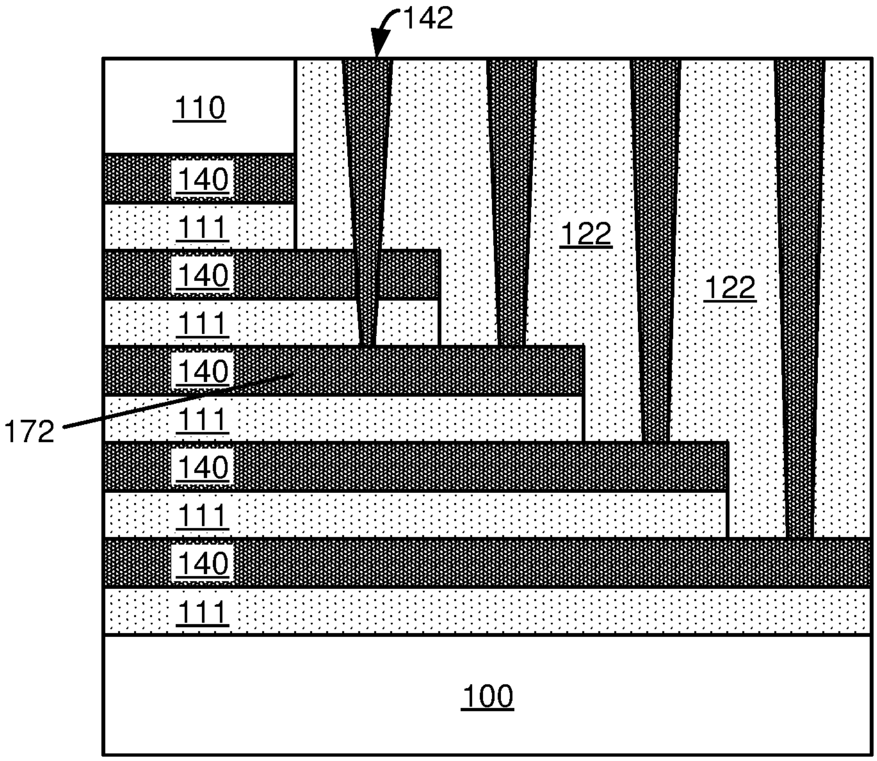

In FIG. 1, in operation 196, tungsten is deposited in the vias to form interconnects to the tungsten wordlines. An example is provided in FIG. 9 showing tungsten 142 deposited into the vias. Vias vary in depth and may have a depth of at least about 1 micron, or about 1 micron to about 50 microns. The depth varies and scales with the number of steps. Shallow vias may be defined as having a depth less than 3.0 microns, such as between about 1.5 microns and 3.0 microns. Deep vias may have a depth greater than 3.0 microns. The critical dimension of vias formed in the oxide may be between about 50 nm and about 500 nm. Vias may be etched using a dry etch process which may involve masking operations to pattern the oxide. As noted above, during operation 188, when the oxide is deposited over the substrate, this process can be considered a LAG application.

Current gapfill deposition in large areas may involve a sub-atmospheric chemical vapor deposition process, PECVD tetraethyl orthosilicate (TEOS) deposition process, or an atomic layer deposition (ALD) process. However, SACVD results in a tensile film that is prone to cracking and may be unable to fill reentrant features. It may be challenging to use SACVD to fill features having an aspect ratio of more than about 6:1. Low density films tends to shrink due to thermal treatment and may have more tensile stress. It is generally believed that tensile stress is used for crack propagation and shrinkage provides a driving force for cracking. PECVD TEOS can fill features having an aspect ratio of up to about 0.8:1. While PECVD TEOS does not result in cracking when deposited with enough compressive stress, there are limitations to its application. Some processes involve fabrication of 3D-NAND structures that have features with aspect ratios of about 5:1 or larger, but SACVD and PECVD TEOS may not necessarily be suitable for deposition in such large features. Additionally, while ALD may be used to deposit highly conformal films with good step coverage, ALD can take a long time to deposit into very large features, making the deposition process more expensive. There are challenges to depositing material into large area gaps as well as gaps generally in semiconductor device fabrication. While high density plasma chemical vapor deposition (HDP CVD) may be used, utilizing this process for low aspect ratio gaps can be expensive due to the bottom-up fill nature of the deposition process, thereby depositing an overburden that is as high as the depth of the gap, which can be very large. This overburden would be polished away, which increases cost. In particular when the size of the features is large, this cost increase can be a considerable challenge to overcome. While flowable techniques could be used, they may not necessarily be used for wider features due to their tendency to have high shrinkage and integration challenges involving adding multiple steps to the process scheme. While atomic layer etching could be used for high aspect ratio fill, the process can become expensive for filling features having a larger critical dimension.

Provided herein are methods of depositing dielectric materials by thermal CVD in combination with densification and passivation operations. Certain disclosed embodiments involve performing thermal CVD with a densification operation, or thermal CVD with a passivation operation, or thermal CVD with both a post-deposition densification operation and a passivation operation. Passivation and/or densification operations may be performed periodically. Certain disclosed embodiments involve cycling between thermal CVD, densification, and passivation using a plasma. Certain disclosed embodiments can be used to fill an entire structure, partially fill a structure, deposit material after liner deposition, or at any other portion of a semiconductor substrate processing scheme. Periodic passivation in combination with thermal CVD may also be referred to as "dep-etch-dep," where passivation constitutes "etch" and thermal CVD constitutes "dep," although passivation may not necessarily involve etching. In some embodiments, passivation reduces nucleation rate or reduces deposition rate of material on a surface without etching the surface.

In some embodiments, dielectric material deposited using certain disclosed embodiments have improved wet etch rate. Some films deposited using certain disclosed embodiments may be conformal and/or may have high step coverage. Conformality of films may be measured by the step coverage. "Step coverage" as used herein is calculated by dividing the average thickness of the deposited film on the sidewall by the average thickness of the deposited film at the top of the feature and multiplying it by 100 to obtain a percentage. Disclosed embodiments may deposit films having a step coverage of at least about 50%, or at least about 95%, or about 100%, or 100%. In some embodiments, features are completely filled using certain disclosed embodiments alone or in combination with thermal CVD without passivation and/or densification.

Certain disclosed embodiments can be used to deposit dielectric materials into large area, in reentrant features, in high aspect ratio features, and more. In various embodiments, the dielectric material is silicon oxide. While silicon oxide is described herein as an example, it will be understood that many other materials may be deposited using certain disclosed embodiments with advantages for controlling deposition and depositing materials into features of various shapes, reentrant features, widths, and depths. Other materials include but are not limited to metal oxides, semiconductor oxides, nitrides, carbides, and doped variants thereof including doped oxides.

Certain disclosed embodiments are applicable for depositing materials in a wide variety of features. FIGS. 10A-10E, 10G-1, 10H-1, and 10I-1 show examples of feature shapes and reentrant features. FIGS. 10F, 10G-2 through 10G-4, 10H-2 through 10H-4, and 10I-2 through 10I-4 show examples of dielectric material partially deposited into various feature shapes. FIGS. 10G-5, 10H-5, and 10I-5 show examples of dielectric material deposited into various feature shapes.

Figure 10A:
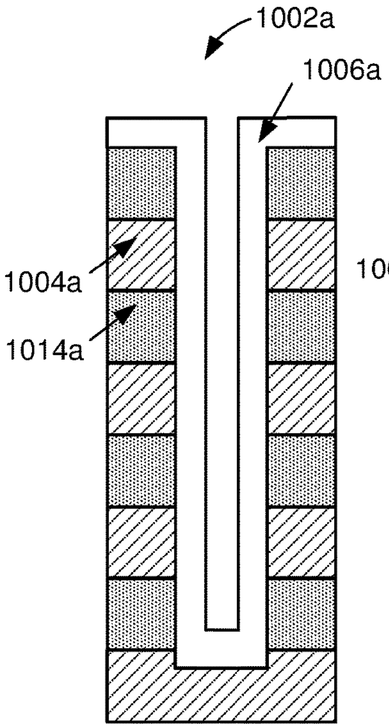

FIG. 10A shows an example feature 1002*a* having a multi-layer stack including a first composition 1004*a* and a second composition 1014*a* arranged in alternating horizontal layers, where feature 1002*a* is defined by etching a hole into the multi-layer stack and lining the hole with liner 1006*a*. Feature 1002*a* has vertical sidewalls that are substantially perpendicular to the top field region of the substrate such that the feature opening at or near the feature opening is about the same as the width of the feature 1002*a* at the bottom of the feature 1002*a* with little to no stubs on the sidewalls of the feature 1002*a*. Note that while a liner 1006*a* is depicted in various examples described herein, in some embodiments a liner is not present. While the first composition 1004*a* and the second composition 1014*a* are shown, it will be understood that more or fewer compositions and the variation in layers of compositions may vary. Additional layers and materials may also be present on the substrate. Where a liner 1006*a* is present, the liner 1006*a* may be a nitride material, such as but not limited to silicon nitride, or in some embodiments, the liner 1006*a* may be a poly-silicon material.

Figure 10B:
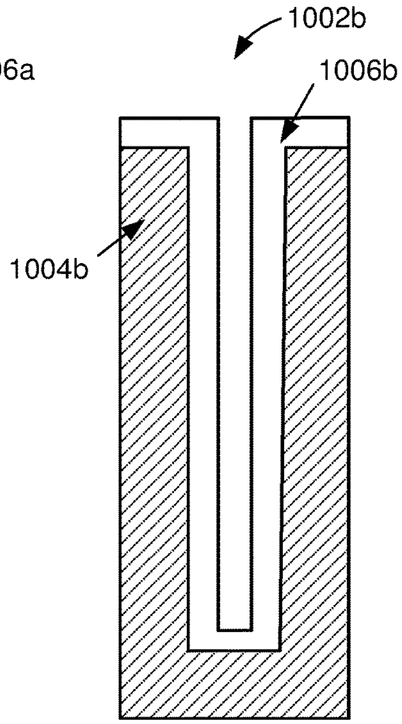

FIG. 10B shows an example feature 1002*b* defined by etching a hole in a material 1004*b* and lining with liner 1006*b*. Feature 1002*b* has straight vertical sidewalls with little to no stubs on the sidewalls. Note that while a liner 1006*b* is depicted in various examples described herein, in some embodiments a liner is not present. Additional layers and materials may also be present on the substrate. Where a liner 1006*b* is present, the liner 1006*b* may be a nitride material, such as but not limited to silicon nitride, or in some embodiments, the liner 1006*b* may be a poly-silicon material.

Figure 10C:
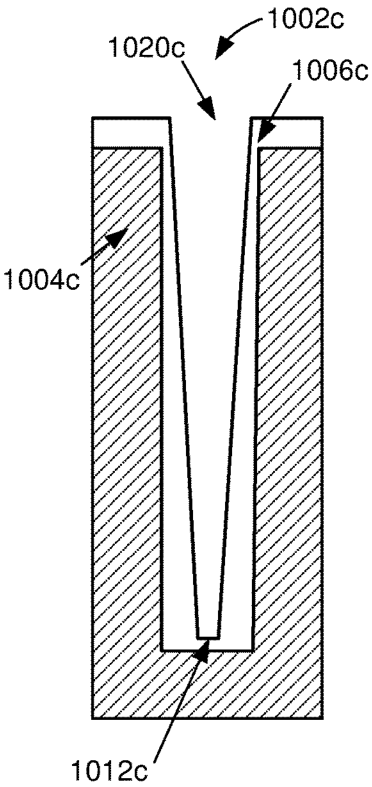

FIG. 10C shows an example feature 1002*c* defined by etching a hole in material 1004*c* and lining with a liner 1006*c* such that the feature 1002*c* has positively sloped sidewalls where the width of the feature opening 1020*c* at the top of the feature 1002*c* is greater than the width between sidewalls at the bottom 1012*c*. Note that while a liner 1006*c* is depicted in various examples described herein, in some embodiments a liner is not present. Additional layers and materials may also be present on the substrate. Where a liner 1006*c* is present, the liner 1006*c* may be a nitride material, such as but not limited to silicon nitride, or in some embodiments, the liner 1006*c* may be a poly-silicon material.

Figure 10D:
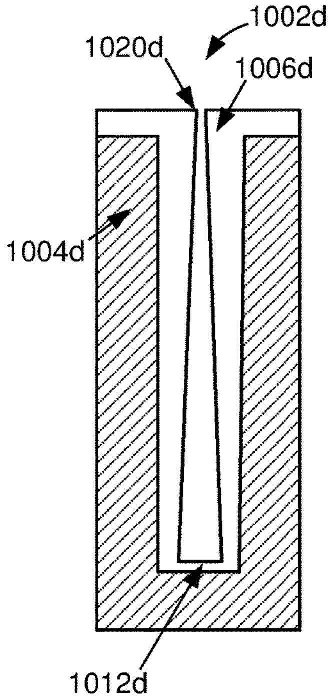

FIG. 10D shows an example feature 1002*d* defined by etching a hole in a material 1004*d* and lining with a liner 1006*d* such that the feature 1002*d* has negatively sloped sidewalls, where the feature opening 1020*d* at the top of the feature 1002*d* is narrower than the width between sidewalls at the bottom 1012*d*. In some cases, horizontal thicknesses of the liner 1006*d* may be at least as thick as the maximum sidewall thickness. Note that while a liner 1006*d* is depicted in various examples described herein, in some embodiments a liner is not present. Additional layers and materials may also be present on the substrate. Where a liner 1006*d* is present, the liner 1006*d* may be a nitride material, such as but not limited to silicon nitride, or in some embodiments, the liner 1006*d* may be a poly-silicon material.

Figure 10E:
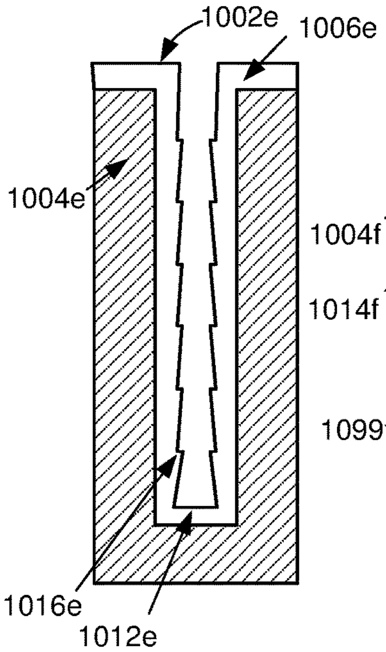

FIG. 10E shows an example feature 1002*e* defined by etching a hole in a material 1004*e* and lining with a liner 1006*e* such that the feature has a sidewall stubs 1016*e*. In some cases, a feature can have sidewall stubs due to the type of etching performed to form the feature, or the one or more materials in which the feature is formed. Gapfill of features such as these examples shown in FIGS. 10A-10E is dependent on the feature type and profile.

Figure 10F:
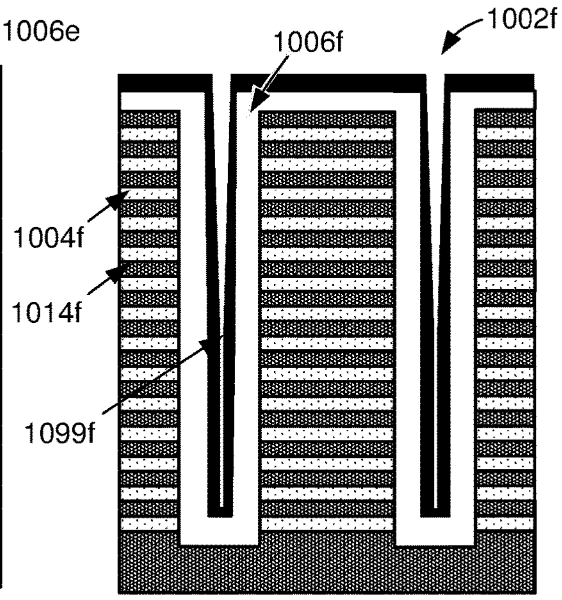

FIG. 10F shows an example substrate having two features 1002*f* defined by etching holes in a multi-layer stack of having alternating layers of a first composition 1004*f* and a second composition 1014*f* and lining with conformal liner 1006*f*. In some embodiments, the multi-layer stack may have more layers than shown in FIG. 10F. In some embodiments, the multi-layer stack may have a top deck and a bottom deck. In some embodiments the multi-layer stack may have dual decks. In some embodiments the multi-layer stack may have multiple decks. A deck may refer to a set of more than one layer of a multi-layer stack material. This example shows partially deposited dielectric material 1099*f* Sometimes, deposition of dielectric material 1099*f* results in uneven deposition on sidewalls of the feature, which can cause formation of gaps or seams in the feature. Certain disclosed embodiments are capable of addressing such concerns and can adequately fill such features.

Figures 1, 2, 3A, 4, 5, 10G, 10H, 10I:
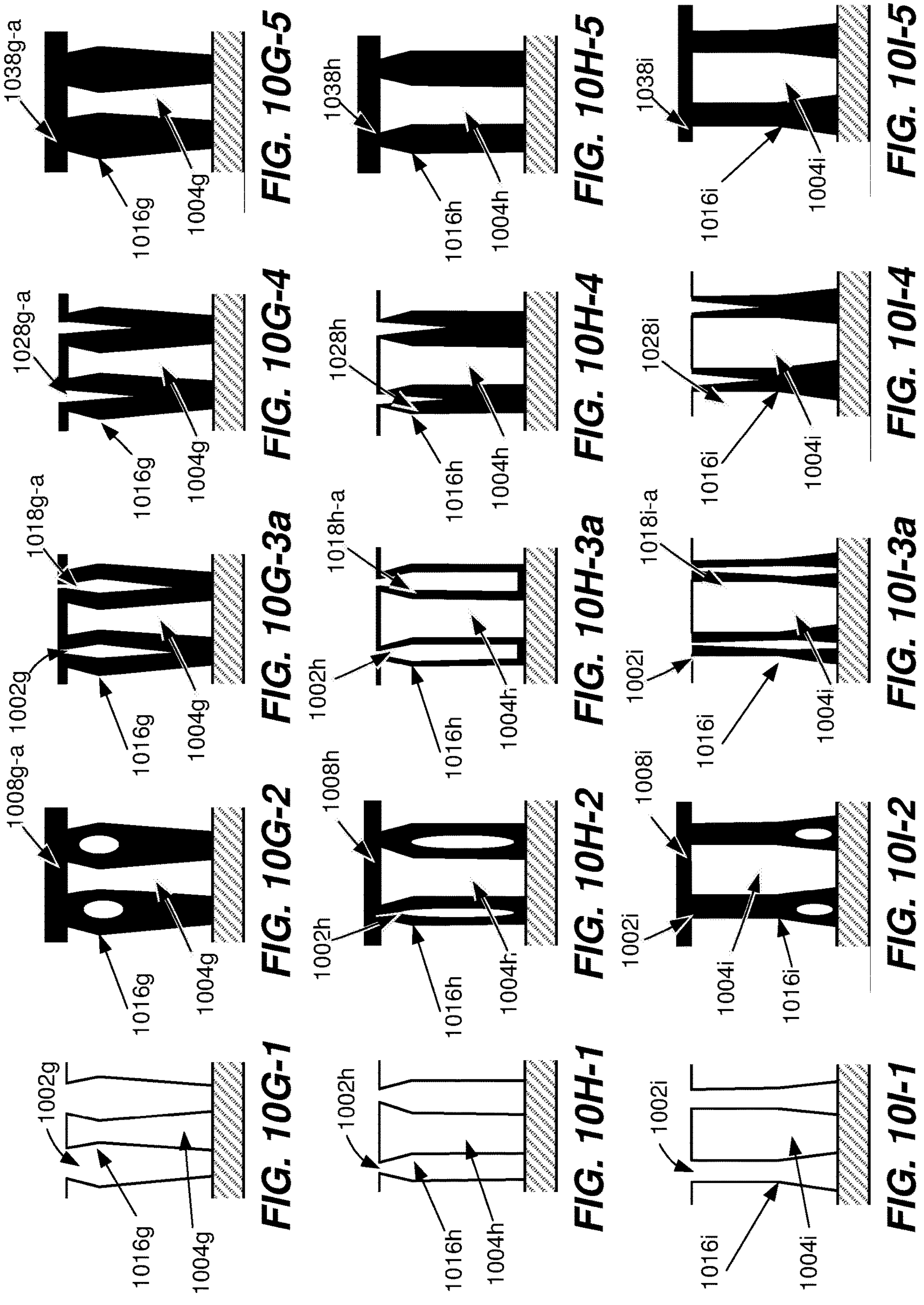
Figures 3B, 10G:
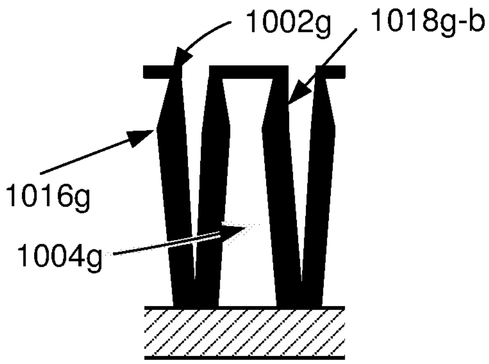
Figures 3B, 10H:
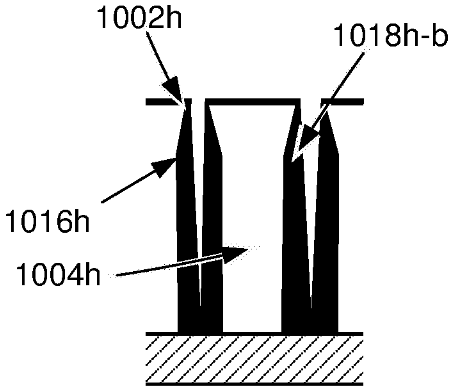
Figures 3B, 10I:
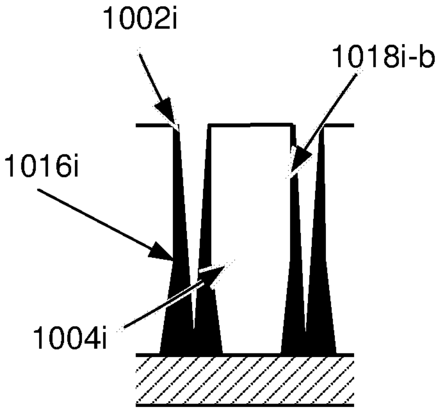

FIGS. 10G-1 through 10I-5 show examples of substrates with features that may be deposited with gapfill material using certain disclosed embodiments. FIG. 10G-1 shows features 1002*g* defined by etching holes in material 1004*g* whereby features 1002*g* include divots 1016*g* in the sidewalls of the features 1002*g*. This is an example of features that may have critical dimension bowing. Using certain disclosed thermal CVD operations and optional densification, the feature may be filled and result in a structure such as shown in the example in FIG. 10G-2, having dielectric material 1008*g-a* deposited in the features and resulting in small gaps. The formation of gaps can be reduced by stopping thermal CVD, performing a passivation operation, and then subsequently depositing more dielectric material by thermal CVD, and optionally repeating passivation and deposition in cycles. Partial fill from stopping thermal CVD may result in a partially filled substrate such as shown in FIG. 10G-3*a*, whereby features 1002*g* are partially filled with dielectric material 1018*g-a*. Cycles of deposition and passivation may be performed, such as shown in the example of the partially filled substrate depicted in FIG. 10G-4 having dielectric material 1028*g-a* deposited thereon. After several cycles of deposition and passivation, or deposition only without passivation when a particular amount of material has been sufficiently deposited in the feature, the features are filled with gap-free and in some embodiments, seam-free fill, such as shown in FIG. 10G-5 having dielectric material 1038*g-a* deposited therein. Note that in some embodiments, performing cycles of passivation and deposition on the substrate from the beginning of filling in the features, instead of partially depositing with thermal CVD first before cycling between passivation and deposition, can result in a partially filled substrate such as shown in FIG. 10G-3*b* whereby dielectric material 1018*g-b* is deposited in the features.

FIG. 10H-1 shows features 1002*h* defined by etching holes in material 1004*h* whereby features 1002*h* include divots 1016*h* in the sidewalls of the features 1002*h*. This is an example of features having top reentrancy. Using certain disclosed thermal CVD operations and optional densification, the feature may be filled and result in a structure such as shown in the example in FIG. 10H-2, having dielectric material 1008*h* deposited in the features and resulting in elongated gaps. The formation of gaps can be reduced by stopping thermal CVD, performing a passivation operation, and then subsequently depositing more dielectric material by thermal CVD, and optionally repeating passivation and deposition in cycles. Partial fill from stopping thermal CVD may result in a partially filled substrate such as shown in FIG. 10H-3*a*, whereby features 1002*h* are partially filled with dielectric material 1018*h-a*. Cycles of deposition and passivation may be performed, resulting in the example of the partially filled substrate depicted in FIG. 10H-4 having dielectric material 1028*h* deposited thereon. After several cycles of deposition and passivation, or deposition only without passivation when a particular amount of material has been sufficiently deposited in the feature, the features are filled with gap-free and in some embodiments, seam-free fill, such as shown in FIG. 10H-5 having dielectric material 1038*h* deposited therein. Note that in some embodiments, performing cycles of passivation and deposition on the substrate from the beginning of filling in the features, instead of partially depositing with thermal CVD first before cycling between passivation and deposition, can result in a partially filled substrate such as shown in FIG. 10H-3*b* whereby dielectric material 1018*h-b* is deposited in the features.

FIG. 10I-1 shows features 1002*i* defined by etching holes in material 1004*i* whereby features 1002*i* include widened bottoms 1016*i* in the features 1002*i*. This is an example of features having deep reentrancy. Using certain disclosed thermal CVD operations and optional densification, the feature may be filled and result in a structure such as shown in the example in FIG. 10I-2, having dielectric material 1008*i* deposited in the features and resulting in elongated gaps. The formation of gaps can be reduced by stopping thermal CVD, performing a passivation operation, and then subsequently depositing more dielectric material by thermal CVD, and optionally repeating passivation and deposition in cycles. Partial fill from stopping thermal CVD may result in a partially filled substrate such as shown in FIG. 10I-3*a*, whereby features 1002*i* are partially filled with dielectric material 1018*i-a*. Cycles of deposition and passivation may be performed, resulting in the example of the partially filled substrate depicted in FIG. 10I-4 having dielectric material 1028*i* deposited thereon. After several cycles of deposition and passivation, or deposition only without passivation when a particular amount of material has been sufficiently deposited in the feature, the features are filled with gap-free and in some embodiments, seam-free fill, such as shown in FIG. 10I-5 having dielectric material 1038*i* deposited therein. Note that in some embodiments, performing cycles of passivation and deposition on the substrate from the beginning of filling in the features, instead of partially depositing with thermal CVD first before cycling between passivation and deposition, can result in a partially filled substrate such as shown in FIG. 10I-3*b* whereby dielectric material 1018*i-b* is deposited in the features.

Figure 11:
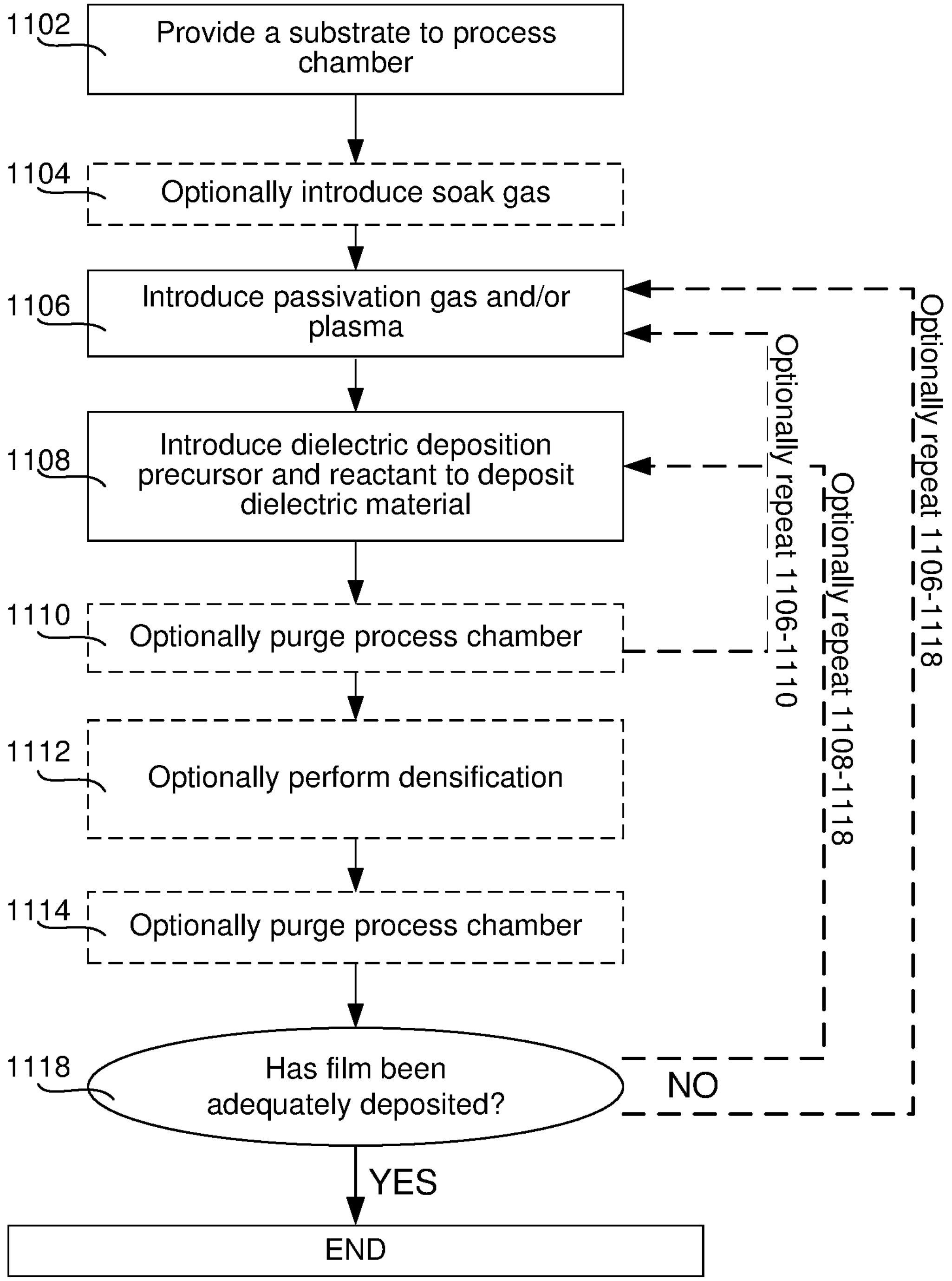
FIG. 11 is a process flow diagram depicting operations for a method performed in accordance with certain disclosed embodiments.

FIG. 11 provides a process flow diagram depicting operations that may be performed in accordance with certain disclosed embodiments. Operations in FIG. 11 may be performed in any order and some operations may be omitted. In some embodiments, operations may be performed in cycles. Non-limiting examples of cycles include the following: (1) operation 1106, then operation 1108, then operation 1112; (2) operation 1108, then operation 1106, then operation 1112; and (3) operation 1108, then operation 1112, then operation 1106. Additionally, operation 1108 may be performed for longer durations after passivation and/or densification, without periodic passivation or densification.

Process conditions can affect the deposition rate of the dielectric material. For example, chamber pressure may be modulated to affect the deposition rate of the dielectric material deposited into the large gap. For example, as chamber pressure increase, deposition rate of the dielectric material increases. Fast deposition may involve increasing the chamber pressure such that the chamber pressure may be at least about 10 Torr, or at least about 15 Torr, or at least about 20 Torr. Chamber pressure for operations 1102-1118 may be at least about 10 Torr, or at least about 15 Torr, or at least about 20 Torr. In some embodiments, chamber pressure is about 0.1 Torr to about 30 Torr. Chamber pressure may be modified between operations and may be different or the same in any operation in FIG. 11, such as in operation 1110. In some embodiments, chamber pressure is maintained constant throughout operations 1102-1118. In some embodiments, the chamber pressure is the same during operation 1105 and 1106.

In operation 1102, a substrate is provided to a process chamber. The substrate may have a feature. The feature may be a large gap which may have an aspect ratio of at least about 5:1 and may have a depth of at least about 10 microns. The feature may have a feature opening of up to about 5000 nm, up to about 2500 nm, between about 70 nm and about 5 microns, or between about 70 nm and about 500 nm, or between about 5 nm to 500 nm, or between about 25 nm and about 300 nm, or about 2 microns, or at least about 2 microns.

In some embodiments, the feature may have an aspect ratio of at least about 2:1, at least about 3:1, at least about 4:1, at least about 6:1, at least about 10:1, or higher. A via, trench, or other recessed feature may be referred to as an unfilled feature or a feature.

In some embodiments, the substrate includes a partially fabricated structure, such as a partially fabricated 3D-NAND structure having a staircase topography. In some embodiments, the substrate includes a deep multi-layer stack with one or more features etched therein. In some embodiments, the substrate includes a top deck stack with a feature etched therein. In some embodiments, the substrate includes a dual deck stack with a feature etched therein. In some embodiments, the substrate includes a bottom deck stack with a feature etched therein. In some embodiments, the substrate may have a structure such as that shown in FIGS. 4A, 4B, 10A, 10B, 10C, 10D, 10E, 10F, 10G-1, 10H-1, and 10I-1.

The substrate may be provided to a process chamber equipped to generate a plasma. The substrate may be provided to a process chamber without a plasma generator. The process chamber may include a heated pedestal for holding the semiconductor substrate and may include a showerhead for delivering one or more gases to a processing environment within the process chamber such that the processing environment is between the showerhead and the substrate on the pedestal during processing in the chamber. Further examples of features of the process chamber are described below with respect to FIGS. 13 and 14.

In an optional operation 1104, an inert gas may be introduced to stabilize the temperature of the substrate prior to deposition. In various embodiments, the inert gas may be any of helium, argon, nitrogen, oxygen, nitrous oxide, hydrogen, and combinations thereof. The inert gas may be continuously flowed during all, any, most, or at least one of operations 1106, 1108, 1110, 1112, and 1114. In some embodiments, the inert gas is continuously flowed throughout all of operations 1106, 1108, 1110, 1112, and 1114. In some embodiments involving dep-etch-dep, the inert gas is also flowed during an etching operation. In some embodiments, the inert gas may also be used as a carrier gas to deliver gases to the process chamber. In some embodiments, the inert gas may also be used as a purge gas to remove excess byproducts or gases between particular operations. In some embodiments, the inert gas may include one or more gases that are used during operation 1106, 1108, 1110, 1112, and/or 1114. In some embodiments, one or more gases used in the inert gas may be used in operation 1106, 1112, 1114, and/or 1116. In some embodiments, the inert gas is the same as one or more gases used in operation 1106, 1108, 1110, 1112, and/or 1114. In some embodiments, the inert gas is different from one or more gases used in operation 1106, 1108, 1110, 1112, and/or 1114.

In various embodiments, during operation 1104, a inert gas is delivered and the pedestal temperature is set to a desired temperature to heat the substrate. The inert gas may be selected to facilitate heating of the substrate. For example, the pedestal may be set to a temperature to heat the substrate to a temperature or at least about 550° C., or at least about 650° C. Substrate temperature affects the deposition rate of the dielectric material. Deposition rates can vary depending on the relative gas flows. In one non-limiting example, at a temperature of about 550° C., little to no deposition may occur, while at a deposition temperature of about 650° C., a deposition rate of at least about 2 Å/s, or at least about 10 Å/s can be achieved, or at least about 20 Å/s can be achieved.

Deposition temperature may also be selected depending on the particular application, the particular gases selected, as well as the presence of other materials on the substrate so as not to degrade or damage materials on the substrate. For some logic applications, the substrate may withstand a temperature of up to about 650° C. For some memory applications, the substrate may withstand a temperature of up to about 650° C.

In operation 1106, a passivation gas and/or plasma is introduced to the process chamber. In some embodiments, a liner may be deposited in situ prior to igniting the passivation gas. In various embodiments, a passivation gas is used. In various embodiments, a passivation gas is ignited with a plasma and introduced to the chamber from a remote plasma chamber or generated in the chamber. The passivation gas composition depends on the material to be deposited. In some embodiments, for deposition of dielectric material, the passivation gas is a halogen-containing gas. In some embodiments, the passivation gas is a fluorine-containing gas. Non-limiting examples of gases that may be used for inhibiting deposition include nitrogen trifluoride ($NF_3$) and nitrogen ($N_2$). Plasma etching and/or passivation plasma operations may involve flowing $NF_3$ and igniting a plasma. "Directional" or "preferential" as used herein may be defined as etching more material at or near the top of the feature than in the rest of the feature, such as inside or interior of the feature. Operation 1106 may be used to preferentially passivate the feature openings. Operation 1106 may be used to preferentially etch material at or near the feature openings. In some embodiments, preferential etching may be performed by etching material deposited at or near the feature openings, followed by depositing additional material, which results in a higher nucleation rate in the interior of the feature than at the feature openings. In some embodiments, preferential passivation may be performed by passivating surfaces using an passivation gas and/or plasma to reduce deposition and/or nucleation rate of material to be deposited at or near the feature openings, followed by depositing additional material, which results in a higher nucleation rate in the interior of the feature than at the feature openings.

Both gas flow and passivation exposure duration in operation 1106 may be modulated to increase tunability of the deposited film. The greater the gas flow, the more likely the passivation gas may exhibit etching characteristics which can, in some embodiments, help open a feature opening or reduce gaps of a partially filled feature to allow bottom up deposition. The flow rate may be modulated to deposit material to achieve fill in various features. For example, deposition of material at the bottom, top, or all of a feature of a multi-layer stack, or a dual deck substrate, may be modulated by varying the flow rate of the passivation gas during passivation. In some embodiments, for a 4-station chamber, the passivation gas may be flowed at a flow rate about 6000 sccm or less, or about 5 sccm to about 6 slm, or about 200 sccm to about 5000 sccm, or about 400 sccm to about 1000 sccm. In some embodiments, the passivation gas is diluted. For example, about 10 sccm to about 30 sccm of passivation gas may be diluted in a total flow of gases of about 120 slm to about 160 slm. The percentage of flow of the passivation gas in the total flow of all gases may be about 0.001% to about 0.003%.

During operation 1106, one or more other added gases may also be flowed. Example added gases include inert gases such as hydrogen, nitrogen, argon, helium, oxygen, and combinations thereof. In some embodiments, nitrogen may be flowed at a flow rate for a 4-station chamber of about 1000 sccm to about 40 slm, or about 25 slm to about 45 slm. In some embodiments, hydrogen may be flowed at a flow rate for a 4-station chamber of about 0 slm to about 5 slm. In some embodiments, argon may be flowed at a flow rate for a 4-station chamber of about 25 slm to about 45 slm. In some embodiments, oxygen may be flowed at a flow rate for a 4-station chamber of about 0 slm to about 5 slm. In some embodiments, helium may be flowed at a flow rate for a 4-station chamber of about 0 slm to about 20 slm.

Pedestal temperature during operation 1106 may be about 400° C. to about 800° C. Pressure may be between about 0 Torr to about 100 Torr.

In various embodiments, a plasma is ignited during operation 1106. The plasma is generated by igniting the passivation gas. The plasma may be generated remotely or in situ. In some embodiments, a combination of low frequency (LF) and high frequency (HF) plasma is used to generate a plasma for which one can modulate characteristics of the deposited film by affecting the level of passivation of a substrate surface during operation 1106. The plasma may be generated with a radio frequency plasma power of about OW to about 6000 W for high frequency plasma, and about OW to about 5000 W for low frequency plasma. Plasma power may be about 250 W to about 10000 W, or about 5500 W. Operation 1106 may be performed for a duration between about 0.1 seconds to about 500 seconds or more. The duration depends on the film being deposited, the deposition conditions and passivation process conditions, and the feature characteristics (e.g., feature width, feature depth, etc.) In general, longer exposures to plasma can be used in conjunction with longer deposition (e.g., longer durations of operation 1108).

If HF and LF plasmas are used, then the HF power may be about OW to about 10000 W, or about OW to about 6000 W, at a frequency of 13.6 MHz and LF power may be about OW to about 5000 W, or about OW to about 3000 W, at a frequency of about 430 MHz. If a single-frequency plasma is used, HF is used at a frequency of 13.6 MHz with HF power up to about 6000 W.

Other tunable characteristics of operation 1106 include but are not limited to chamber pressure, pedestal temperature, gas flow dilution amount, plasma power, and plasma frequency. Passivation in operation 1106 may be referred to as an "etch" operation in a dep-etch-dep process where dep refers to operation 1108. Variations of dep-etch-dep may be used, such as performing alternating cycles of deposition and passivation; performing cycles including deposition, then passivation, then deposition, then passivation, then deposition followed by only deposition without passivation; and performing deposition, followed by multiple cycles of alternating cycles of passivation and deposition. Variations of dep-etch-dep may be used to reduce overhang caused by deposition or by the underlying structure. Dep-etch-dep may be used for depositing material into reentrant features. Dep-etch-dep may be used to deposit materials into features to slope the sidewalls to reduce reentrancy. In some embodiments, operation 1106 is omitted.

In some embodiments, after operation 1106, a purge operation (not shown) is performed. In some embodiments, before operation 1108, a purge operation (not shown) is performed.

In operation 1108, the substrate is exposed to a deposition precursor and reactant to deposit a dielectric material on the substrate surface. In operation 1108, a deposition precursor and reactant may be flowed simultaneously and continuously to the process chamber housing the substrate. The surface on the substrate that is exposed to the deposition precursor and reactant depends on the particular application of certain disclosed embodiments. In some embodiments, the surface includes silicon, poly-silicon, amorphous silicon, silicon dioxide, silicon nitride, silicon carboxide, silicon carbonitride, other materials, and combinations thereof.

The deposition precursor may be any Group IV-containing precursor, such as a silicon-containing precursor. In some embodiments, the deposition precursor may be a germanium-containing precursor. In some embodiments, hydrogen gas is co-flowed to the chamber in addition to the deposition precursor and reactant. In various embodiments, the deposition precursor is an aminosilane.

The deposition precursor is selected based on the material to be deposited. For example, for deposition of silicon oxide, a silicon-containing precursor may be selected. Example silicon-containing precursors include silicon-containing precursors having the structure:

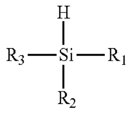

where $R_1$, $R_2$, and $R_3$ may be the same or different substituents, and may include silanes, amines, halides, hydrogen, or organic groups, such as alkylamines, alkoxy, alkyl, alkenyl, alkynyl, and aromatic groups.

Example silicon-containing precursors include polysilanes ($H_3Si$—$(SiH_2)_n$—$SiH_3$), where n≥1, such as silane, disilane, trisilane, tetrasilane; and trisilylamine:

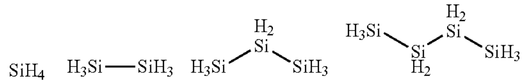

silane disilane trisilane tretrasilane

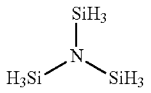

trisilylamine

In some embodiments, the silicon-containing precursor is an alkoxysilane. Alkoxysilanes that may be used include, but are not limited to, the following:

$H_x$—Si—$(OR)_y$, where x=1-3, x+y=4 and R is a substituted or unsubstituted alkyl group; and $H_x(RO)_y$—Si—Si—$(OR)_yH_x$ where x=1-2, x+y=3 and R is a substituted or unsubstituted alkyl group.

Examples of silicon-containing precursors include: tetraethyl orthosilicate (TEOS), TMOS (tetramethoxysilane), octamethylcyclotetrasiloxane (OMCTS); methylsilane; trimethylsilane (3MS); ethylsilane; butasilanes; pentasilanes; octasilanes; heptasilane; hexasilane; cyclobutasilane; cycloheptasilane; cyclohexasilane; cyclooctasilane; cyclopentasilane; 1,4-dioxa-2,3,5,6-tetrasilacyclohexane; diethoxymethylsilane (DEMS); diethoxysilane (DES); dimethoxymethylsilane; dimethoxysilane (DMOS); methyl-diethoxysilane (MDES); methyl-dimethoxysilane (MDMS); octamethoxydodecasiloxane (OMODDS); tert-butoxydisilane; tetramethylcyclotetrasiloxane (TMCTS); tetraoxymethylcyclotetrasiloxane (TOMCTS); triethoxysilane (TES); triethoxysiloxane (TRIES); and trimethoxysilane (TMS or TriMOS).

As noted above, in some embodiments, the silicon-containing precursor may be an aminosilane, with hydrogen atoms, such as bisdiethylaminosilane, diisopropylaminosilane, tert-butylamino silane (BTBAS), or tris(dimethylamino)silane (3DMAS). Aminosilane precursors include, but are not limited to, the following: $H_x$—Si—$(NR)_y$ where x=1-3, x+y=4 and R is an organic or hydride group.

In some embodiments, a halogen-containing silane may be used such that the silane includes at least one hydrogen atom. Such a silane may have a chemical formula of $SiXaH_y$ where y≥1. For example, dichlorosilane ($H_2SiCl_2$) may be used in some embodiments.

The reactant used to react with the deposition precursor is selected based on material to be deposited in the large gaps and depending on the deposition precursor selected. For example, for deposition of silicon oxide, one option is to use a silicon-containing precursor as the deposition precursor and to use an oxidant or an oxidizing agent as the reactant. Example oxidizing agents include but are not limited to oxygen, ozone, peroxides, nitric oxide, nitrous oxide, water, and combinations thereof. The reactant gas flow for a 4-station chamber may be about 200 sccm to about 5000 sccm.

Both the deposition precursor and reactant may be simultaneously delivered to the process chamber to generate a processing environment in the chamber that includes both the deposition precursor and the reactant. In some embodiments, the deposition precursor and reactant flow are turned on at different times, but there is at least some duration for which both flow of the deposition precursor and flow of the reactant are on at the same time, thereby creating a processing environment in the process chamber that includes both the deposition precursor and the reactant. In some embodiments, delivering the precursor and reactant involves turning on the flow of the deposition precursor and turning on the flow of the reactant at the same time, or about at the same time, or at a time such that both flows are on during at least a duration of time. These gases may be delivered to a showerhead which then delivers the gases to the processing environment in the process chamber, where the gases can react to deposit a film on the semiconductor substrate. In some embodiments, delivery of each process gas may be delivered using different lines to the showerhead so as to avoid reacting before reaching the processing environment.

Operation 1108 may be performed for any suitable duration. The duration of operation 1108 as described herein means the duration in which the substrate is exposed to the processing environment that includes both the deposition precursor and the reactant. That is, in some embodiments, the duration of keeping the flow of the deposition precursor on and the duration of keeping the flow of the reactant on may be different. In some embodiments, the flow of the deposition precursor and the flow of the reactant are on for the same amount of time.

In some embodiments, the duration of operation 1108 may be about 1 second, or at least about 1 second. The deposition rate of operation 1108 depends on the flow of the reactant gases as well as the particular precursor and reactant gases chosen and process conditions under which the gases are delivered to the substrate. In some embodiments, the deposition rate may be about 3 Å/s to about 60 Å/s, or at least about 50 Å/s. The pressure of the process chamber may be about 9 Torr to about 40 Torr, or at least about 30 Torr. The gas flow rates depend on the gases being used. In some embodiments, the deposition precursor is flowed at a range between about 1000 sccm and about 3000 sccm, and the oxidant is flowed at a range between about 2000 sccm and about 5000 sccm. In some embodiments, $H_2$ is co-flowed with the oxidant at a flow rate of between 0 sccm and about 5000 sccm. Where $H_2$ is not co-flowed, flow rate of $H_2$ is 0 sccm. The inert gas may be continuously flowed during operation 1108. In some embodiments, the inert gas is flowed at a flow rate between about 2000 sccm and about 12000 sccm.

In features that include constrictions or are otherwise susceptible to pinch-off, operation 1108 can be performed at least until the feature is pinched off in some embodiments. Features having different sizes may pinch off at different times. In conformal deposition, deposition starts from each surface and progresses with growth generally orthogonal to the surface. Dielectric growth in features starts from each sidewall and progresses until the growth pinches off the feature.

In various embodiments, operation 1108 may be performed until the opening of the feature is closed. In some embodiments, a seam may be formed at or near the opening of the feature. For the purposes of this description, "near the opening" is defined as an approximate position or an area within the feature (i.e., along the side wall of the feature) corresponding to about 0% to about 20% of the feature depth measured from the field region. In certain embodiments, the area near the opening corresponds to the area at the opening.

Further, "inside the feature" or the "interior of the feature" is defined as an approximate position or an area within the feature corresponding to about 20% to about 60% of the feature depth measured from the field region on the top of the feature. Typically, when values for certain parameters (e.g., thicknesses) are specified "near the opening" or "inside the feature", these values represent a measurement or an average of multiple measurements taken within these positions/areas.

In operation 1110, the process chamber is optionally purged. Purging may be performed when the flows of the deposition precursor and reactant(s) in operation 1110 are reduced and/or turned off. Purging may be performed depending on plasma process conditions used for subsequent operations. In some embodiments, purge time is longer than the duration between operation 1112 described below and a repeated operation of 1108. Typically, the precursor flow is turned off or diverted during the purge, and only purge gas flows. Purging the chamber may involve flowing a purge gas or a sweep gas, which may be a carrier gas used in other operations or may be a different gas. In some embodiments, purging may involve evacuating the chamber. Example purge gases include argon, nitrogen, hydrogen, helium, and combinations thereof. In some embodiments, operation 1110 may include one or more evacuation subphases for evacuating the process chamber. Alternatively, it will be appreciated that operation 1110 may be omitted in some embodiments. Operation 1110 may have any suitable duration, such as between about 0 seconds and about 60 seconds, for example about 0.01 seconds. In some embodiments, increasing a flow rate of one or more purge gases may decrease the duration of operation 1110. For example, a purge gas flow rate may be adjusted according to various reactant thermodynamic characteristics and/or geometric characteristics of the process chamber and/or process chamber plumbing for modifying the duration of operation 1110. In one non-limiting example, the duration of a purge phase may be adjusted by modulating purge gas flow rate. This may reduce deposition cycle time, which may improve substrate throughput. In some embodiments, operations 1106-1110 are optionally repeated in several cycles.

In an optional operation 1112, densification is performed. In some embodiments, densification is performed by introducing a plasma generated from an inert gas. In some embodiments, densification is performed by introducing a plasma generated from gas that is not an inert gas. A plasma may be generated using a noble gas, oxidizing gas, or other gas. Non-limiting examples of gases include argon, nitrogen, hydrogen, oxygen, nitrous oxide, helium, and combinations thereof. The plasma may be generated in situ, or within the chamber, in a processing environment above the substrate. In some embodiments, the plasma is generated in a processing environment between the substrate and the showerhead of a process chamber. The plasma is generated under process conditions selected to modulate features of the film deposited in operation 1112. In some embodiments, a capacitively coupled plasma is used to generate the plasma. In some embodiments, an inductively coupled plasma is used to generate the plasma.

For example, in some embodiments, a high-pressure radio frequency plasma is generated so as to form a film that has uniform within wafer wet etch rate. A high pressure may be a pressure of at least about 10 Torr, or about 10 Torr to about 50 Torr, or about 10 Torr to about 35 Torr, or about 10 Torr to about 25 Torr.

In some embodiments, a low-pressure radio frequency plasma is generated to modulate the deposited material to make it dome-shaped with a particular within wafer wet etch rate. A dome-shaped layer may include a convex region in at or near the center of the wafer. A low pressure may be a pressure of less than about 10 Torr, or about 2 Torr to about 10 Torr.

The within-wafer thickness non-uniformity of a film and etch rate can be tuned by modulating the pressure. In one non-limiting example, a dome-shaped film can be changed to a dish-shaped film by modulating pressure, such as using a pressure of about 6 Torr, a flat film at about 18 Torr, and a dish shaped film at a pressure of about 20 Torr.

In some embodiments, a combination of low frequency (LF) and high frequency (HF) plasma is used to generate a plasma for which one can modulate whether the resulting film has a dome or dish shape. The plasma may be generated with a radio frequency plasma power of about 1000 W to about 10000 W, or about 5500 W. Duration of operation 1112 depends on the application for which certain disclosed embodiments are used. In some embodiments, operation 1112 may be performed for a duration about 0.1 seconds to about 500 seconds or about 1 second to about 3 seconds.

If HF and LF plasmas are used, then the HF power may be about OW to about 10000 W, at a frequency of 13.6 MHz and LF power may be about OW to about 3000 W, at a frequency of about 430 MHz. If a single-frequency plasma is used, HF is used at a frequency of 13.6 MHz with HF power up to about 6000 W.

Temperature during this operation may be the same as during operation 1106 and/or operation 1108 or both. In some embodiments, temperature during operation 1112 is about 550° C. to about 650° C., or about 650° C.

In operation 1114, the chamber is optionally purged. Purge gases and purge conditions may be any of those described above with respect to operation 1110.

In operation 1118, it is determined whether the film has been deposited as desired, whether to the desired thickness or a desired film property, such as wet etch rate, concavity, uniformity, or conformality. If not, many variations of operations 1106-1114 may be performed. Although certain optionally repeated operations are depicted in FIG. 11, it will be understood that any variation of repeating one or more of operations 1106-1114 may be used. In some embodiments, operations 1108-1118 are repeated in cycles. In some embodiments, operations 1106-1114 are repeated in cycles. Operations may be repeated for at least about 2 cycles or more, or about 2 cycles to about 2000 cycles, or about 100 cycles and about 1500 cycles.

In one example of repeated cycles, operation 1108 may be performed for about x seconds and operation 1112 may be performed for about y seconds, where x and y depend on the particular properties desired for the resulting film. In some embodiments, x is about 0.1 seconds to about 10 seconds. In some embodiments, y is about 0.1 seconds to about 3 seconds. In some embodiments, x is about 0.1 seconds to about 10 seconds, and y is about 0.1 seconds to about 3 seconds. In some embodiments, x and y may each be at least about 1 second. In some embodiments, x may be about 1 second and y may be about 3 seconds. In some cases, continuous deposition may be used whereby y=0. In continuous deposition, operations 1110 and 1114 are not performed. In some embodiments, operations 1110 and 1114 are not performed in one or more repeated cycles. Film properties can be tuned by adjusting ratio of duration of operation 1106 to duration of operation 1108 to duration of operation 1112. That is, film properties can be tuned by adjusting ratio of passivation time to deposition time to densification time. In some embodiments, if a deposition cycle includes an increased duration of operation 1108, the duration of operation 1112 may likewise be increased. In some embodiments, operations 1104-1118 are performed without breaking vacuum. In some embodiments, operations 1104-1118 are performed in the same chamber.

In various embodiments, shifting between operation 1106, operation 1108, and operation 1112 may be performed by fast switching. Fast switching may be performed by utilizing particular valving and/or plasma turn on techniques and components. In some embodiments, fast switching valves are operable to quickly open and close to without pressure surges or flow instabilities of gases. Fast switching valves can open and close within 100 milliseconds, or within 80 milliseconds, or within 60 milliseconds, or within 40 milliseconds, or within 30 milliseconds, or within 20 milliseconds or faster. Fast switching vales may be operably connected to receive signals from a controller to open or close. In various embodiments, switching is performed quickly with minimal pressure changes between operations. In some embodiments, two or more of operations 1104-1114 are performed in the same chamber, or in the same station. Switching may be performed by using multi-plenum showerheads, whereby one or more source gases are separately distributed to the showerhead before being delivered to the process chamber or station housing the substrate. In some embodiments, a volume of a gas composition in a confined region within a vacuum chamber, such as a plasma confinement zone, can be replaced (i.e., flushed out) by another gas composition introduced into the vacuum chamber within a short period of time. Such gas replacement can be achieved in less than about 1 s, more preferably within less than about 200 ms, by providing valves having a fast switching capability in the gas distribution system. In various embodiments, the gas switching section (not shown) includes a fast switching valve arrangement configured to receive signals to (iii) open a first group of fast switching valves and close a second group of fast switching valves to supply a first process gas to the inner and outer zones while a second process gas is diverted to the bypass line via a first group of the first gas passages, and (iv) to close the first group of fast switching valves and open the second group of fast switching valves to switch the first and second process gas flows to supply the second process gas to the inner and outer zones while the first process gas is diverted to the bypass line via a second group of the first gas passages. In some embodiments, two or more operations 1104-1114 are performed such that a first process gas is introduced into the process chamber while diverting a second (and optionally third, fourth, or more) process gas to one or more bypass-lines. The first process gas is then ignited to generate a first plasma. In some cases, this first plasma may be a passivation plasma, such as an $NF_3$ plasma. In some embodiments, the first process gas is introduced and a plasma is not generated in this operation (such as if the first process gas is a precursor or reactant used for thermal deposition). The flows of the first and second process gases are switched so that the second process gas is supplied into the process chamber while diverting the first process gas to the by-pass line. For example, this second process gas may be a thermal deposition precursor gas. In some embodiments, the second process gas may be a densification gas. The first process gas may be replaced in a confinement zone of the process chamber by the second process gas within a period of less than about 1 s, or less than about 200 ms. In some embodiments, the second process gas is ignited to produce a second plasma, such as for densification or passivation or inhibition. In some embodiments, the second process gas is not ignited and is flowed thermally, such as for thermal deposition. The flows of the first and second process gases may be switched so that the first process gas is supplied into the plasma processing chamber while diverting the second process gas to the by-pass line, with the second process gas being substantially replaced in a confinement zone of the process chamber by the first process gas within a period of less than about 1 s, or less than about 200 ms. In some embodiments, flows of second and third process gases may be switched. Any number of process gas flows may be switched in a similar manner as described in the above example. Gas delivery systems designed for fast gas switching are disclosed in commonly-owned U.S. Pat. Nos. 7,459,100; 7,708,859; and 8,088,248; and U.S. Patent Publication No. 2007/0066038, the disclosures of which are hereby incorporated by reference.

Temperature of components of the chamber can be modulated so as to selectively deposit material on the substrate without substantially depositing material on components of the chamber. For example, temperature of components in the process chamber other than the pedestal may be set at a temperature of less than about 300° C., and deposition using CVD and densification as described herein achieves deposition on the substrate on the pedestal substantially faster than deposition of material on surfaces of the process chamber. Where the temperature of the components is less than about 550° C., film accumulation does not occur on the components. This selectivity results in no flaking at higher accumulation when material accumulates on surfaces of the process chamber from processing numerous wafers in the same chamber, which allows the process chamber to be used until the accumulation on non-pedestal components of the chamber has a tolerable thickness. In general, process chambers can withstand more than 3 times the accumulation caused by atomic layer deposition processes. Overall, this is highly advantageous so as to reduce the cost of ownership and reduce the frequency of chamber cleaning.

In some embodiments, the pedestal is made of aluminum nitride. In some embodiments, the pedestal is ceramic. In some cases, a tool may be retrofitted by replacing the pedestal with a ceramic pedestal and heaters and cooling components may be modified to be able to cool other components while maintaining a pedestal temperature of greater than about 550° C. or between about 550° C. and about 650° C. In some embodiments, the showerhead is made of aluminum.

Figure 12:
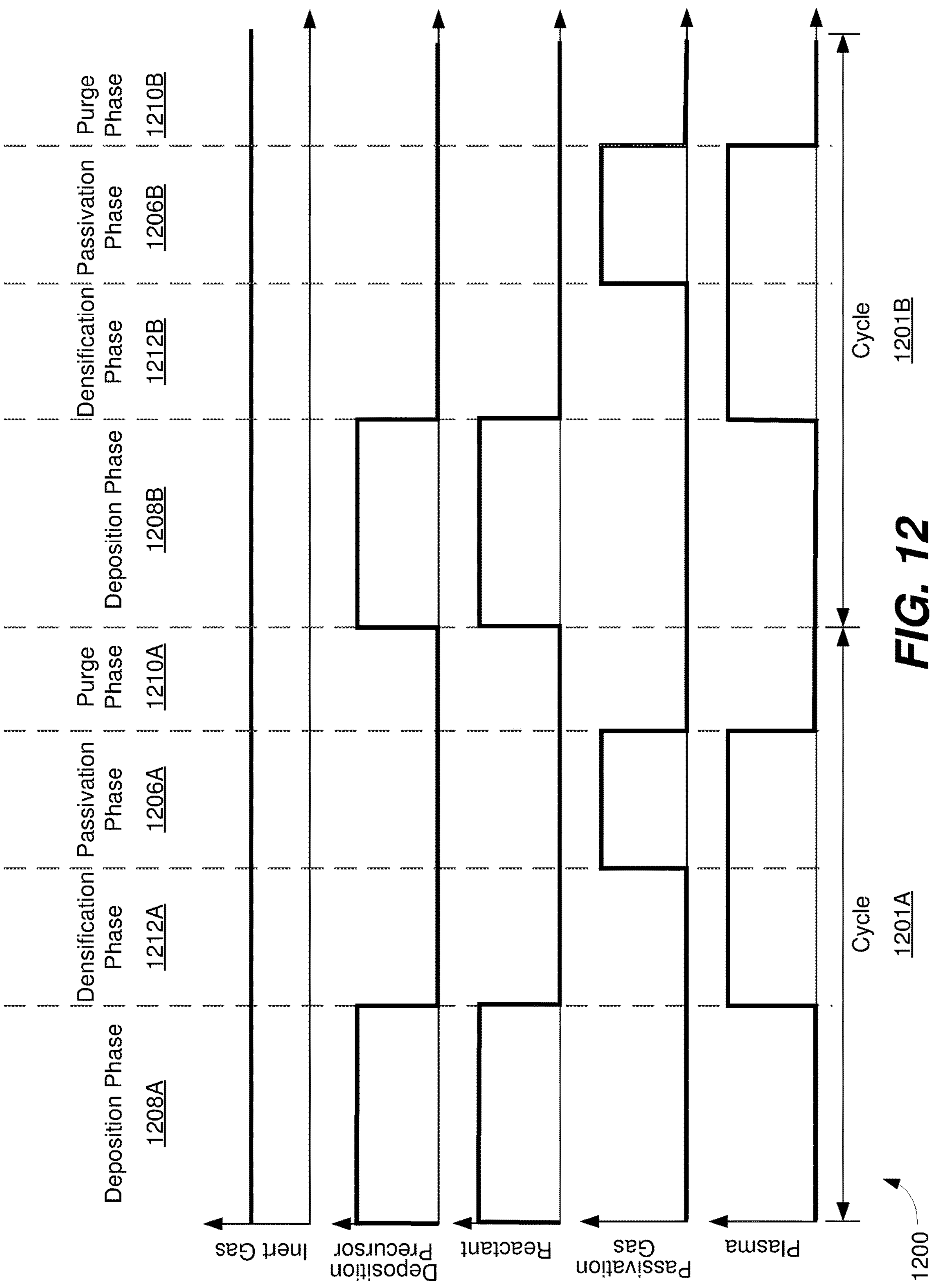
FIG. 12 is a timing sequence diagram showing an example of cycles in a method in accordance with certain disclosed embodiments.

FIG. 12 shows a timing scheme diagram showing one example of a method performed in accordance with certain disclosed embodiments. Although a specific order of operations is shown, it will be understood that operations may be performed in any order. Process 1200 includes a first cycle 1201A and a second cycle 1201*b*1201B. Inert gas shown in FIG. 12 can, depending on the gas composition, refer to one or more of an inert gas as carrier gas, inert gas, dilution gas, or other gas used during various operations. The inert gas may be Ar or He. In lieu of the inert gas, other gases that may be used include $H_2$, $N_2$, $O_2$, or combinations thereof. Although the "on" phase shows constant amounts, it will be understood that an "on" phase may have different levels or amounts used in each phase. Although not shown, in various embodiments, a purging operation may be performed between densification phase 1212A and passivation phase 1206A and densification phase 1212B and passivation phase 1206B.

First cycle 1201A includes four phases—deposition phase 1208A, densification phase 1212A, passivation phase 1206A, and purge phase 1210A. Deposition phase 1208A may correspond to operation 1108 of FIG. 11. During deposition phase 1208A, the inert gas flow continues to be on, the deposition precursor flow is turned on, and the reactant flow is turned on, while passivation gas flow is off and plasma is off. In this example, the deposition precursor flow is turned on at the start of the reactant flow, but it will be understood that in some embodiments, the deposition precursor flow may be turned on shortly before the reactant flow, or the reactant flow may be turned on shortly before the deposition precursor flow.

Densification phase 1212A may correspond to operation 1112 of FIG. 11. During densification phase 1212A, the deposition precursor flow is off and the plasma is turned on while reactant flow is off. In some cases, an inert gas such as Ar may also be flowed during densification phase 1212A as shown as an example inert gas. Note inert gas herein may refer to either carrier gases and/or gases flowed during plasma exposure phase.

Passivation phase 1206A may correspond to operation 1106 of FIG. 11. During passivation phase 1206A, the deposition precursor flow is off, the reactant flow is off, the passivation gas flow is on, and plasma is turned on. The inert gas may continue to flow.

Purge phase 1210A may correspond to operation 1110 of FIG. 11, whereby inert gas flow may continue to be on while deposition precursor gas flow is turned off, reactant gas flow is off, passivation gas flow is off, and the plasma is turned off.

In this example, it is determined in operation 1118 of FIG. 11 that the film has not been sufficiently deposited and the cycle of operations is repeated.

Second cycle 1201B includes four phases—deposition phase 1208B, densification phase 1212B, passivation phase 1206B, and purge phase 1210B. Deposition phase 1208B may correspond to a repeated operation 1108 of FIG. 11. During deposition phase 1208B, the inert gas flow continues to be on, the deposition precursor flow is turned on, and the reactant flow is turned on, while passivation gas flow is off and plasma is off. In this example, the deposition precursor flow is turned on at the start of the reactant flow, but it will be understood that in some embodiments, the deposition precursor flow may be turned on shortly before the reactant flow, or the reactant flow may be turned on shortly before the deposition precursor flow.

Densification phase 1212B may correspond to a repeated operation 1112 of FIG. 11. During densification phase 1212B, the deposition precursor flow is off and the plasma is turned on while reactant flow is off. In some cases, an inert gas such as Ar may also be flowed during densification phase 1212B as shown as an example inert gas. Note inert gas herein may refer to either carrier gases and/or gases flowed during plasma exposure phase.

Passivation phase 1206B may correspond to operation 1106 of FIG. 11. Curing During passivation phase 1206B, the deposition precursor flow is off, the reactant flow is off, the passivation gas flow is on, and plasma is turned on. The inert gas may continue to flow.

Purge phase 1210B may correspond to operation 1110 of FIG. 11, whereby inert gas flow may continue to be on while deposition precursor gas flow is turned off, reactant gas flow is off, passivation gas flow is off, and the plasma is turned off.

Apparatus

Figure 13:
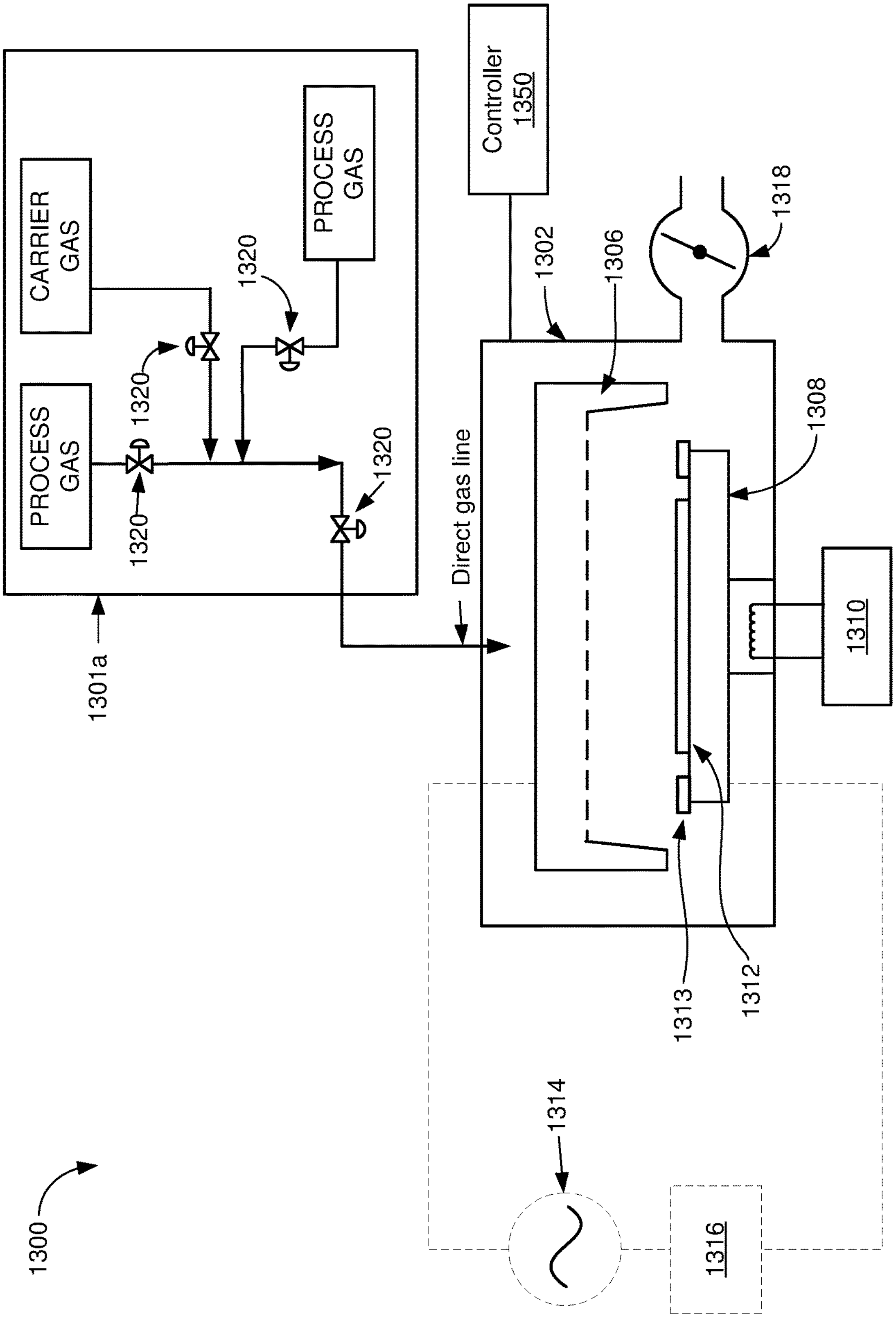
FIG. 13 is a schematic diagram of an example process chamber for performing disclosed embodiments.
Figure 14:
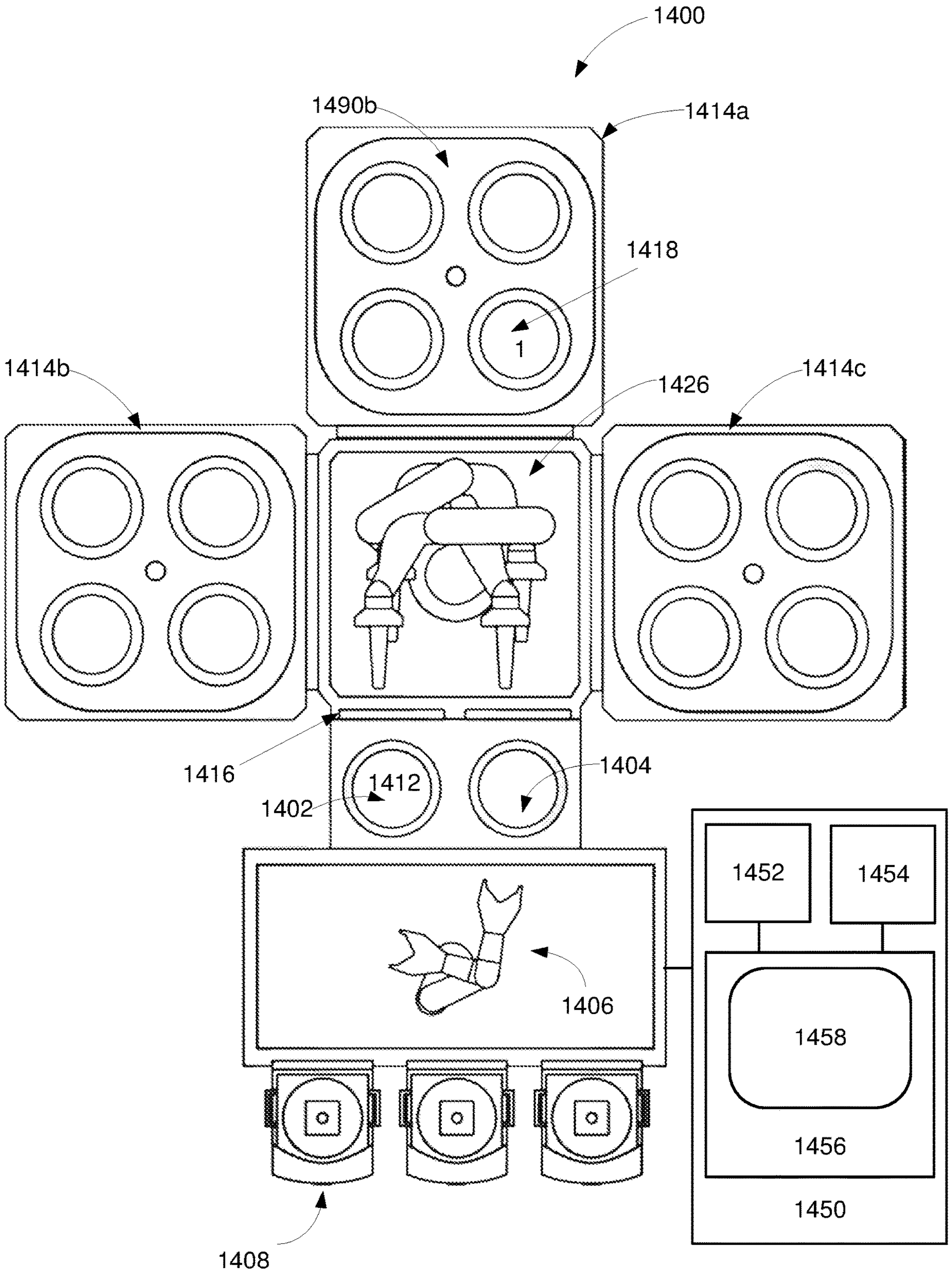
FIG. 14 is a schematic diagram of an example process tool for performing disclosed embodiments.

FIG. 13 depicts a schematic illustration of an embodiment of a deposition process station 1300 having a process chamber body 1302 for maintaining a processing environment. A plurality of deposition process stations 1300 may be included. For example, FIG. 14 depicts an embodiment of a multi-station processing tool 1400. In some embodiments, process stations 1300 may be suitable for variable pressure processing environments. In some embodiments, a multi-station processing tool 1400 includes stations set at variable parameters. In some embodiments, one or more hardware parameters of deposition process station 1300 including those discussed in detail below may be adjusted programmatically by one or more computer controllers 1350.

Deposition process station 1300 fluidly communicates with reactant delivery system 1301*a* for delivering process gases to a distribution showerhead 1306. Reactant delivery system 1301*a* includes gas sources, including process gas and carrier gas sources. Gas sources may include sources for a deposition precursor gas, or oxidizing agent gas (e.g., ozone), or $N_2$, $O_2$, Ar, or $H_2$ gas for delivery to distribution showerhead 1306. One or more inlet valves 1320 may control introduction of process gases to one or more direct gas lines to the distribution showerhead 1306. Plasma may also be delivered to the distribution showerhead 1306 or may be generated in the deposition process station 1300. Deposition process station 1300 may have a confined volume to thereby isolate energetics within the deposition process station 1300. Deposition process station 1300 may be equipped with one or more fast switching valves which may be operably connected to receive signals from a controller to open or close. In some embodiments, the deposition process station 1300 may be equipped with a switching section (not shown) used for fast switching of gas flows. In some embodiments, deposition process station 1300 is equipped with fast RF turn on components to turn on and turn off plasma quickly. In some embodiments, plasma is generated remotely and plasma species are distributed and inletting of plasma species is controlled using fast switching valves. Reactant delivery system 1301*a* is operable to control the flow rate, and optionally also to adjust the composition, of different gases that can be supplied to the switching section (not shown). Reactant delivery system 1301*a* can provide different flow rates and/or chemistries of the process and carrier gases to the switching section (not shown) via gas passages as shown. In addition, the flow rate and/or chemistry of the process and/or carrier gas that is supplied to the showerhead 1306 (while the other gas may be diverted to a by-pass line (not shown), which can be in fluid communication with a vacuum pumping system, such as between a turbo pump and a roughing pump). In some embodiments, the processing environment within the deposition process station 1300 may include one or more zones. The reactant delivery system 1301*a* can provide desired gas flows and/or gas chemistries across the substrate 1312, thereby enhancing substrate processing uniformity.

Showerhead 1306 distributes process gases toward substrate 1312. In the embodiment shown in FIG. 13, the substrate 1312 is located beneath showerhead 1306 and is shown resting on a pedestal 1308. Showerhead 1306 may have any suitable shape, and may have any suitable number and arrangement of ports for distributing process gases to substrate 1312. In some embodiments, showerhead 1306 may be a temperature controlled aluminum showerhead. For example, in some embodiments, showerhead 1306 is set at a setpoint temperature of about 300° C. In some embodiments, the showerhead 1306 may be equipped with multiple plenums to flow different gases separately to the showerhead and/or to the deposition process station 1300 to allow fast switching between gas flows.

The pedestal 1308 may be a ceramic material or may be another suitable material. In some embodiments, pedestal

1308 may be a ceramic pedestal capable of running high temperatures, such as about or at least about 650° C.

In some embodiments, pedestal 1308 may be a ceramic pedestal. In some embodiments where a ceramic pedestal is used, a focus ring 1313 may be on pedestal 1308 such that the focus ring can be used to focus plasma to modulate plasma non-uniformity at the wafer edge.

In some embodiments, pedestal 1308 may be an aluminum nitride pedestal. In some embodiments where an aluminum nitride pedestal is used, the focus ring 1313 may be optional.

Pedestal 1308 may have a thin stem to act as a thermal break to chamber vacuum seals. In some embodiments, the pedestal 1308 may include dual-zone heaters (that is, inner and outer heaters) to drive thermal uniformity.

In some embodiments, pedestal 1308 may be raised or lowered to expose substrate 1312 to a volume between the substrate 1312 and the distribution showerhead 1306. It will be appreciated that, in some embodiments, pedestal height may be adjusted programmatically by a suitable computer controller 1350.

In another scenario, adjusting a height of pedestal 1308 may allow a plasma density to be varied during plasma activation cycles in the process in embodiments where a plasma is ignited. At the conclusion of the process phase, pedestal 1308 may be lowered during another substrate transfer phase to allow removal of substrate 1312 from pedestal 1308.

In some embodiments, pedestal 1308 may be temperature controlled via heater 1310. In some embodiments, the pedestal 1308 may be heated to a temperature of at least about 650° C., during deposition of silicon oxide films as described in disclosed embodiments. In some embodiments, the pedestal is set at a temperature of about 500° C. to about 900° C., or about 400° C. to about 650° C., or about 400° C. to about 800° C., or about 600° C. to about 700° C.

Further, in some embodiments, pressure control for process station 1300 may be provided by butterfly valve 1318. As shown in the embodiment of FIG. 13, butterfly valve 1318 throttles a vacuum provided by a downstream vacuum pump (not shown). However, in some embodiments, pressure control of process station 1300 may also be adjusted by varying a flow rate of one or more gases introduced to the process station 1300.

In some embodiments, a position of distribution showerhead 1306 may be adjusted relative to pedestal 1308 to vary a volume between the substrate 1312 and the distribution showerhead 1306. Further, it will be appreciated that a vertical position of pedestal 1308 and/or showerhead 1306 may be varied by any suitable mechanism within the scope of the present disclosure. In some embodiments, pedestal 1308 may include a rotational axis for rotating an orientation of substrate 1312. It will be appreciated that, in some embodiments, one or more of these example adjustments may be performed programmatically by one or more suitable computer controllers 1350.

In some embodiments where plasma may be used as discussed above, distribution showerhead 1306 and pedestal 1308 electrically communicate with a radio frequency (RF) power supply 1314 and matching network 1316 for powering a plasma. In some embodiments, the plasma energy may be controlled by controlling one or more of a process station pressure, a gas concentration, an RF source power, an RF source frequency, and a plasma power pulse timing. For example, RF power supply 1314 and matching network 1316 may be operated at any suitable power to form a plasma having a desired composition of radical species. Examples of suitable powers are about OW to about 6000 W. Plasma may be used during densification after performing chemical vapor deposition of dielectric material onto the substrate surface. RF power supply 1314 may provide RF power of any suitable frequency. In some embodiments, RF power supply 1314 may be configured to control high- and low-frequency RF power sources independently of one another. Example low-frequency RF frequencies may include, but are not limited to, frequencies of about 10 kHz to about 2 MHz or about 10 kHz to about 500 kHz. Example high-frequency RF frequencies may include, but are not limited to, frequencies about 1.8 MHz to about 100 MHz, or about 1.8 MHz to about 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 1350 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert gas, instructions for setting a flow rate of a carrier gas (such as Ar), instructions for igniting a plasma, and time delay instructions for the first recipe phase. A second recipe phase may include instructions for setting a flow rate of an inert and/or precursor gas, instructions for setting a flow rate of a carrier gas (such as Ar), and time delay instructions for a second recipe phase. A third, recipe phase may include instructions for modulating a flow rate of an oxidizing agent gas such as ozone, instructions for modulating the flow rate of a carrier or purge gas, and time delay instructions for the fourth third recipe phase. A fourth, subsequent recipe phase may include instructions for modulating or stopping a flow rate of an inert and/or a reactant gas, and instructions for modulating a flow rate of a carrier or purge gas and time delay instructions for the fifth recipe phase. A fifth, subsequent recipe phase may include instructions for modulating or stopping a flow rate of one gas and instructions for generation of a plasma, and time delay instructions for the fifth recipe phase. It will be appreciated that these recipe phases may be further subdivided and/or iterated in any suitable way within the scope of the disclosed embodiments. In some embodiments, the controller 1350 may include any of the features described below with respect to system controller 1450 of FIG. 14.

As described above, one or more process stations may be included in a multi-station processing tool. FIG. 14 shows a schematic view of an embodiment of a multi-station processing tool 1400 with an inbound load lock 1402 and an outbound load lock 1404, either or both of which may comprise a remote plasma source. A robot 1406, at atmospheric pressure, is configured to move substrates or wafers from a cassette loaded through a pod 1408 into inbound load lock 1402 via an atmospheric port 1410. A substrate is placed by the robot 1406 on a pedestal 1412 in the inbound load lock 1402, the atmospheric port 1410 is closed, and the load lock is pumped down. Where the inbound load lock 1402 comprises a remote plasma source, the substrate may be exposed to a remote plasma treatment in the load lock prior to being introduced into a processing chamber 1414. Further, the substrate also may be heated in the inbound load lock 1402 as well, for example, to remove moisture and adsorbed gases. Next, a chamber transport port 1416 to processing chamber 1414 is opened, and another robot (not shown) places the substrate into the reactor on a pedestal of a first station shown in the reactor for processing. While the embodiment depicted in FIG. 14 includes load locks, it will be appreciated that, in some embodiments, direct entry of a substrate into a process station may be provided. In various embodiments, the soak gas is introduced to the station when the substrate is placed by the robot 1406 on the pedestal 1412.

The depicted processing chamber 1414 comprises four process stations, numbered from 1 to 4 in the embodiment shown in FIG. 14. Each station has a heated pedestal (shown at 1418 for station 1), and gas line inlets. It will be appreciated that in some embodiments, each process station may have different or multiple purposes. For example, in some embodiments, a process station may be switchable between an ALD and PEALD process mode. Additionally, or alternatively, in some embodiments, processing chamber 1414 may include one or more matched pairs of ALD and plasma-enhanced ALD process stations. While the depicted processing chamber 1414 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 14 depicts an embodiment of a wafer handling system 1490 for transferring substrates within processing chamber 1414. In some embodiments, wafer handling system 1490 may transfer substrates between various process stations and/or between a process station and a load lock. It will be appreciated that any suitable wafer handling system may be employed. Non-limiting examples include wafer carousels and wafer handling robots. FIG. 14 also depicts an embodiment of a system controller 1450 employed to control process conditions and hardware states of process tool 1400. System controller 1450 may include one or more memory devices 1456, one or more mass storage devices 1454, and one or more processors 1452. Processor 1452 may include a CPU or computer, analog and/or digital input/output connections, stepper motor controller boards, etc. In some embodiments, system controller 1450 includes machine-readable instructions for performing operations such as those described above with respect to FIGS. 2, 3, and 4.

In some embodiments, system controller 1450 controls the activities of process tool 1400. System controller 1450 executes system control software 1458 stored in mass storage device 1454, loaded into memory device 1456, and executed on processor 1452. Alternatively, the control logic may be hard coded in the controller 1450. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 1458 may include instructions for controlling the timing, mixture of gases, amount of gas flow, chamber and/or station pressure, chamber and/or station temperature, substrate temperature, target power levels, RF power levels, substrate pedestal, chuck and/or susceptor position, and other parameters of a particular process performed by process tool 1400. System control software 1458 may be configured in any suitable way. For example, various process tool component subroutines or control objects may be written to control operation of the process tool components used to carry out various process tool processes. System control software 1458 may be coded in any suitable computer readable programming language.

In some embodiments, system control software 1458 may include input/output control (IOC) sequencing instructions for controlling the various parameters described above. Other computer software and/or programs stored on mass storage device 1454 and/or memory device 1456 associated with system controller 1450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1418 and to control the spacing between the substrate and other parts of process tool 1400.

A process gas control program may include code for controlling gas composition (e.g., first precursor gas, soak gas, second reactant gas, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as the soak gas) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 1450. The user interface may include a display screen, graphical software displays of the apparatus and/or process conditions, and user input devices such as pointing devices, keyboards, touch screens, microphones, etc.

In some embodiments, parameters adjusted by system controller 1450 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 1450 from various process tool sensors. The signals for controlling the process may be output on the analog and digital output connections of process tool 1400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1450 may provide program instructions for implementing the above-described deposition processes such as processes that employ a soak prior to initiating ALD for a substrate inserted into the reaction chamber, with the soak performed under any of the soak conditions described herein. The program instructions may control a variety of process parameters, such as direct current (DC) power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller.

In some implementations, the system controller 1450 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 1450, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 1450 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 1450 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 1450, in some implementations, may be a part of or coupled to a computer that is integrated with, coupled to the system, otherwise networked to the system, or a combination thereof. For example, the system controller 1450 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 1450 receives instructions in the form of data, which specify parameters for each of the processing steps to be performed during one or more operations. It should be understood that the parameters may be specific to the type of process to be performed and the type of tool that the system controller 1450 is configured to interface with or control. Thus as described above, the system controller 1450 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 1450 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399, filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or ultraviolet (UV) curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

Figure 15:
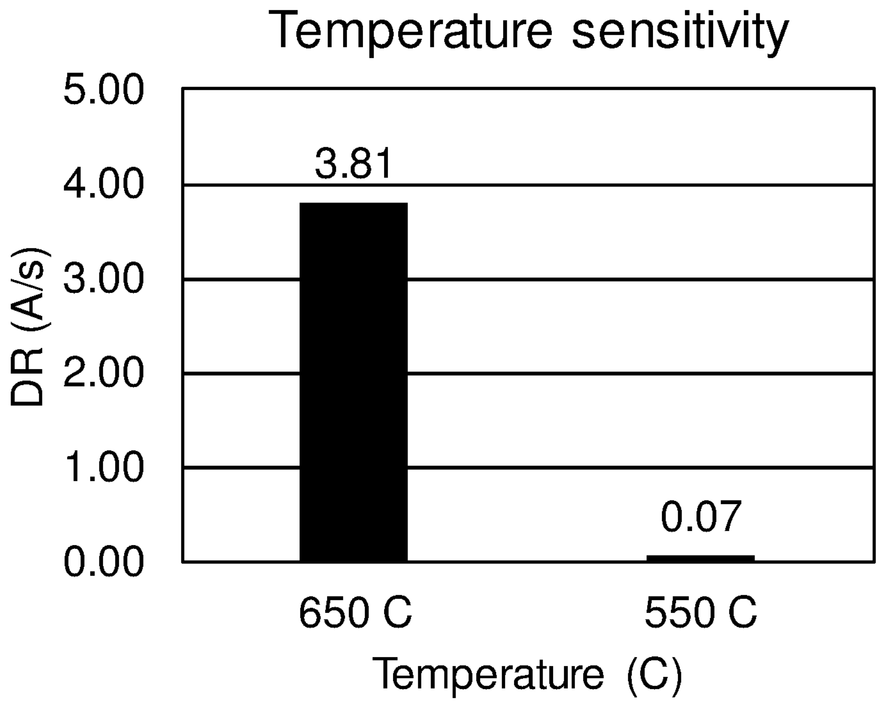
FIGS. 15-17 are charts from experiments conducted using processes in accordance with certain disclosed embodiments.

An experiment was conducted for two different substrates. A first substrate involved blanket deposition of a silicon oxide film using chemical vapor deposition (CVD) with tris(dimethylamino) silane (3DMAS) as the silicon precursor and oxygen at 5000 sccm as the reactant at a temperature of 550° C. for 30 seconds in a chamber having a pressure of 12 Torr. Argon was flowed as a carrier/purge gas at 9200 sccm, and hydrogen was co-flowed with the process gases at 5000 sccm. The resulting substrate had a deposition rate of 0.07 Å/s. A second substrate involved blanket deposition of silicon oxide using 3DMAS as the silicon precursor and oxygen at 5000 sccm as the reactant at a temperature of 650° C. for 30 seconds in a chamber having a pressure of 12 Torr. Argon was flowed as a carrier/purge gas at 9200 sccm, and hydrogen was co-flowed with the process gases at 5000 sccm. The resulting substrate had a deposition rate of 3.81 Å/s. The compared deposition rates (DR) as provided in a graph in FIG. 15. These results suggested a strong dependence of the deposited film on temperature.

Experiment 2

Figure 16:
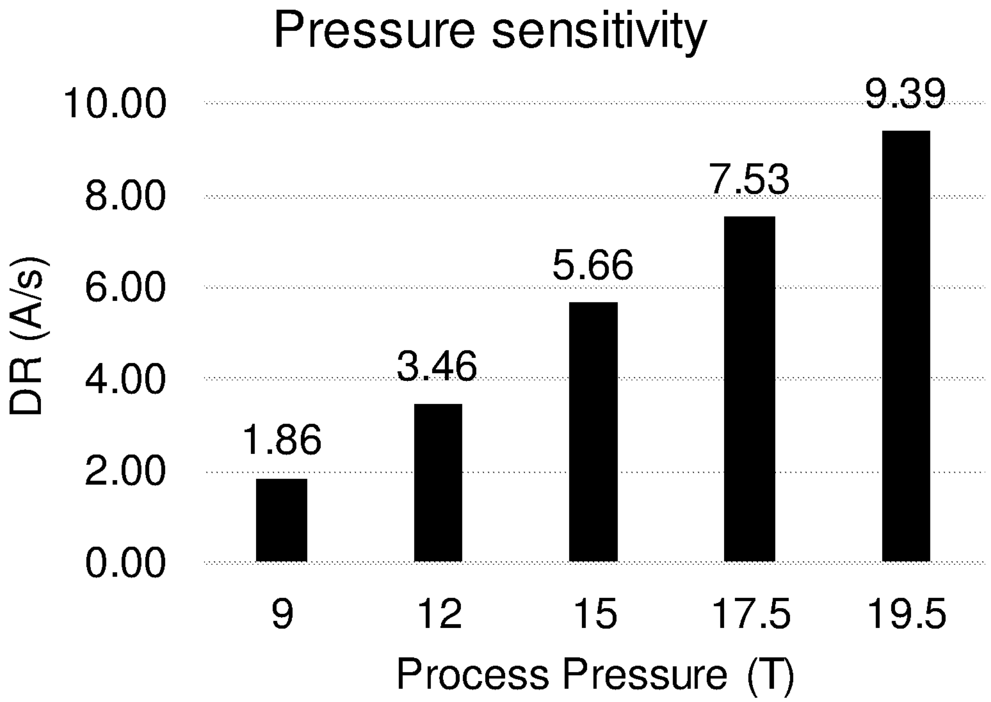

An experiment was conducted for different substrates. Multiples substrates involved blanket deposition of a silicon oxide film using 3DMAS as the silicon precursor and oxygen at 5000 sccm as the reactant at a temperature of 650° C. for 30 seconds in a chamber. Argon was flowed as a carrier/purge gas at 9200 sccm, and hydrogen was co-flowed with the process gases at 5000 sccm. Films were deposited at chamber pressures of 9 Torr, 12 Torr, 15 Torr, 17.5 Torr, and 19.5 Torr. The resulting substrate deposition rates are graphed in FIG. 16. The results suggested a strong dependence of deposition rate on chamber pressure such that at higher chamber pressures, increased deposition rate was observed.

Experiment 3

An experiment was conducted for four different substrates. A first substrate involved blanket deposition of a silicon oxide film using 3DMAS as the silicon precursor and oxygen as the reactant at a temperature of 650° C. for 30 seconds in a chamber without subsequent densification.

The second, third, and fourth substrates involved blanket deposition of a silicon oxide film using multiple deposition cycles. Each deposition cycle involved (1) simultaneous exposure to 3DMAS as the silicon precursor and oxygen as the reactant at a temperature of 650° C.; (2) purge; (3) radio frequency densification; and (4) purge. For the second substrate, a chamber pressure of 6 Torr was used, while during densification, high frequency plasma was generated using 3500 W and low frequency plasma was generated using 2000 W. For the third substrate, a chamber pressure of 6 Torr was used, and during densification, single frequency high frequency plasma was generated using 5500 W plasma power. For the fourth substrate, a chamber pressure of 19.5 Torr was used, and during densification, single frequency high frequency plasma was generated using 5500 W plasma power.

Figure 17:
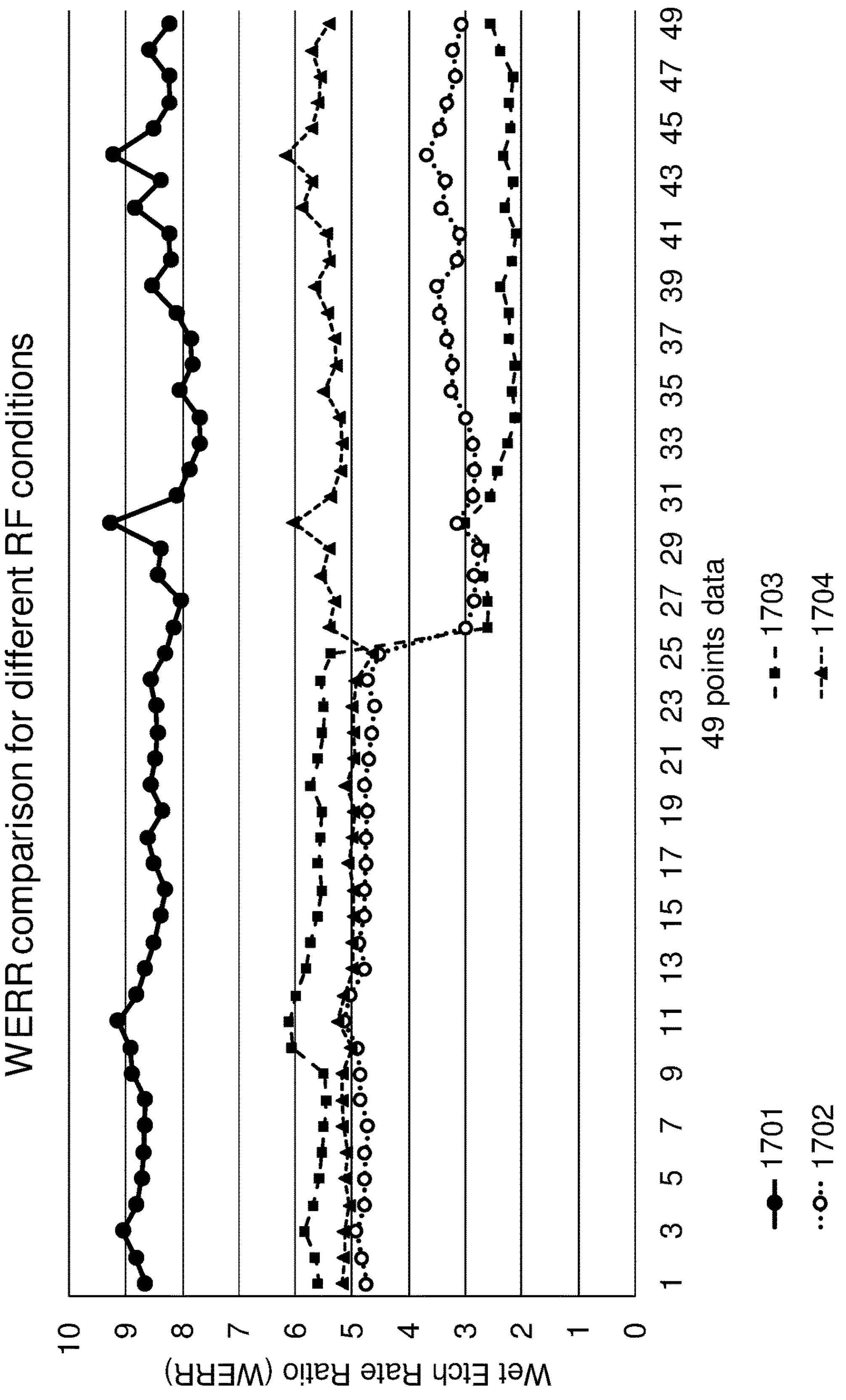

The resulting substrate's normalized wet etch rate amounts are graphed in FIG. 17. Normalized wet etch rate amounts are normalized to standard high temperature furnace oxide. Series 1701 shows normalized wet etch rate amounts of the first substrate, series 1702 shows the normalized wet etch rate amounts when a film is deposited using the dual frequency plasma, series 1703 shows the normalized wet etch rate amounts when a film is deposited using 6 Torr pressure and single frequency plasma, and 1704 shows the normalized wet etch rate amounts when a film is deposited using 19.5 Torr pressure and single frequency plasma. Without densification, WERR is about 8.5 (1701) but can be decreased to about 5 (1702, 1703, 1704) and can be used to adjust the film profile (1702, 1703). With densification, wet etch rate ratios may range from about 1.5 to about 6. In some embodiments, with densification, wet etch ratios may be 0.2 up as compared to a non-densified film.

Experiment 4

An experiment was conducted to obtain a Fourier-transform infrared spectroscopy (FTIR) spectrum for a film deposited using chemical vapor deposition at 650° C. without densification and a film deposited using chemical vapor deposition at 650° C. with radio frequency (RF) densification in cycles such that each deposition cycle involved 1 second of CVD followed by 1 second of densification.

In the FTIR spectrum obtained for the film deposited in cycles with densification, all peaks related to —OH bonds were eliminated, suggesting high quality films were deposited.

Experiment 5

An experiment was conducted measuring wet etch rate of various films deposited in a large feature. Wet etch rate was evaluated in a 10-minute 100:1 diluted hydrofluoric acid dip. A first substrate included a feature having an aspect ratio of about 1:10, the feature filled with dielectric material deposited using CVD at a chamber pressure of 19.5 Torr without densification or cycles of deposition. The wet etch rate ratio was evaluated at the top of the feature (6.51), middle of the feature (6.43), and bottom of the feature (6.57).

A second substrate included a feature having an aspect ratio of about 1:10, the feature filled with dielectric material deposited using deposition cycles, the cycles including 1 second of CVD at a chamber pressure of 19.6 Torr and 6 seconds of radio frequency (RF) densification at 6 Torr. The wet etch rate ratio was evaluated at the top of the feature (3.77), middle of the feature (4.12), and bottom of the feature (4.17).

These results suggest the cycles of CVD and densification substantially reduced the wet etch rate.

Experiment 6

An experiment was conducted involving a substrate having high aspect ratio features and a polysilicon liner. The polysilicon liner exhibited reduced damage when exposed to cycles of thermal CVD and plasma densification with inhibition plasma using $NF_3$ plasma which may be due to increase deposition rate and reduced re-activated residual fluorine during deposition.

The deposition involved thermal CVD with a plasma densification and an inhibition step time dependent on depth used to inhibit down to a desired location within the high aspect ratio features. The use of thermal CVD during deposition resulted in increased deposition rate and less observed damage.

Conclusion

The implementations disclosed above describe deposition of a material on a substrate such as a wafer, substrate, or other work piece. The work piece may be of various shapes, sizes, and materials. In this application, the terms "semiconductor wafer," "wafer," "substrate," "wafer substrate," and "partially fabricated integrated circuit" are used interchangeably.

One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Unless otherwise stated, the processing details recited herein (e.g., flow rates, power levels, etc.) are relevant for processing 300 mm diameter substrates, or for treating chambers that are configured to process 300 mm diameter substrates, and can be scaled as appropriate for substrates or chambers of other sizes. In addition to semiconductor wafers, other work pieces that may be used implementations disclosed herein include various articles such as printed circuit boards and the like. The processes and apparatuses can be used in the fabrication of semiconductor devices, displays, LEDs, photovoltaic panels and the like.

Ranges described herein include their endpoints.

"Silicon oxide" is referred to herein as including chemical compounds including silicon and oxygen atoms, including any and all stoichiometric possibilities for $SixO_y$, including integer values of x and y and non-integer values of x and y. For example, "silicon oxide" includes compounds having the formula SiOn, where 1≤n≤2, where n can be an integer or non-integer values. "Silicon oxide" can include sub-stoichiometric compounds such as $SiO_{1.8}$. "Silicon oxide" also includes silicon dioxide (Sift) and silicon monoxide (SiO). "Silicon oxide" also includes both natural and synthetic variations and also includes any and all crystalline and molecular structures, including tetrahedral coordination of oxygen atoms surrounding a central silicon atom. "Silicon oxide" also includes amorphous silicon oxide and silicates. In some embodiments, silicon oxide refers to silicon-rich films. Additional impurities such as carbon, nitrogen, boron, phosphorous, and germanium may be added to silicon oxide.

"Silicon nitride" is referred to herein as including any and all stoichiometric possibilities for SixNy, including integer values of x and y and non-integer values of x and y, such as x=3 and y=−4. For example, "silicon nitride" includes compounds having the formula SiNn, where 1<n<2, where n can be an integer or non-integer values and Si3N4. "Silicon nitride" can include sub-stoichiometric compounds where n is between about 0.8 and about 1.7, such as SiN1.7. Silicon nitride can include about 0% to about 25% hydrogen or about 10% to about 25% hydrogen. "Silicon nitride" also silicon nitride with some hydrogen bonded to silicon or nitrogen, some oxygen bonded to silicon or nitrogen, or combinations thereof. "Silicon nitride" also includes both natural and synthetic variations and also includes any and all lattice, crystalline, and molecular structures, including trigonal alpha-silicon nitride, hexagonal beta-silicon nitride, and cubic gamma-silicon nitride. "Silicon nitride" also includes amorphous silicon nitride and can include silicon nitride having trace amounts of impurities.

It will be understood that temperatures as described herein may refer to the temperature at which a pedestal holding the substrate may be set at. The terms "substrate temperature," "pedestal temperature," and "deposition temperature" may all refer to temperatures at which a pedestal is set at.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for processing substrates in a chamber, the method comprising:

providing a semiconductor substrate having a feature to a chamber; and depositing dielectric material in the feature on the semiconductor substrate by:

introducing a deposition precursor and a reactant to the chamber housing the semiconductor substrate to expose the semiconductor substrate to a plasma-free environment comprising the deposition precursor and the reactant, and introducing a passivation gas to the chamber and igniting a passivation plasma in a passivation gas ambient, wherein the passivation plasma preferentially etches dielectric material at or near a feature opening.

2. The method of claim 1, further comprising, exposing the dielectric material to a densification plasma in the chamber generated in an inert gas ambient.

3. The method of claim 1, wherein depositing the dielectric material further comprises repeating temporally alternating between introducing the deposition precursor and the reactant in a plasma-free environment and introducing the passivation gas.

4. The method of claim 2, wherein depositing the dielectric material further comprises repeating temporally alternating between introducing the deposition precursor and the reactant in a plasma-free environment, introducing the passivation gas, and exposing the dielectric material to the densification plasma in the chamber generated in the inert gas ambient.

5. A method for processing substrates in a chamber, the method comprising:

providing a semiconductor substrate having a feature to a chamber; and depositing dielectric material comprising silicon oxide in the feature on the semiconductor substrate by:

introducing a deposition precursor and a reactant to the chamber housing the semiconductor substrate to expose the semiconductor substrate to a plasma-free environment comprising the deposition precursor and the reactant, and exposing the dielectric material to a densification plasma in the chamber generated in an inert gas ambient.

6. The method of claim 5, further comprising, introducing a passivation gas to the chamber and igniting a passivation plasma.

7. The method of claim 5, wherein depositing the dielectric material further comprises repeating temporally alternating between introducing the deposition precursor and the reactant in a plasma-free environment and exposing the dielectric material to the densification plasma generated in the inert gas ambient.

8. The method of claim 1, further comprising changing chamber pressure to modulate within-wafer profile of the dielectric material.

9. The method of claim 5, further comprising changing chamber pressure to modulate within-wafer profile of the dielectric material.

10. The method of claim 2, wherein the densification plasma is generated using high frequency and low frequency plasma selected to form a dome-shaped or dish-shaped dielectric material.

11. The method of claim 5, wherein the densification plasma is generated using high frequency and low frequency plasma selected to form a dome-shaped or dish-shaped dielectric material.

12. The method of claim 2, wherein the densification plasma is generated in situ.

13. The method of claim 5, wherein the densification plasma is generated in situ.

14. The method of claim 1, wherein the passivation plasma is generated in situ.

15. The method of claim 1, wherein introducing the deposition precursor and the reactant and introducing the passivation gas are performed without breaking vacuum.

16. The method of claim 2, wherein introducing the deposition precursor and the reactant and exposing the dielectric material to the densification plasma are performed without breaking vacuum.

* * * * *